US012757340B2

(12) United States Patent
Zhang et al.

(10) Patent No.: US 12,757,340 B2
(45) Date of Patent: Oct. 6, 2026

(54) ROTATING SHAFT MECHANISM, SUPPORT APPARATUS, AND FOLDABLE SCREEN DEVICE

(71) Applicant: Honor Device Co., Ltd., Shenzhen (CN)

(72) Inventors: Yaolei Zhang, Shenzhen (CN); Guotong Zhou, Shenzhen (CN); Bin Yan, Shenzhen (CN); Yihe Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 241 days.

(21) Appl. No.: 18/548,839

(22) PCT Filed: Jan. 4, 2023

(86) PCT No.: PCT/CN2023/070520
§ 371 (c)(1),
(2) Date: Sep. 1, 2023

(87) PCT Pub. No.: WO2023/138380
PCT Pub. Date: Jul. 27, 2023

(65) Prior Publication Data

US 2024/0147645 A1 May 2, 2024

(30) Foreign Application Priority Data

Jan. 18, 2022 (CN) ......................... 202210057046.1
Apr. 8, 2022 (CN) ......................... 202210366979.9

(51) Int. Cl.
*H05K 5/00* (2025.01)
*F16C 11/04* (2006.01)
*H05K 5/02* (2006.01)

(52) U.S. Cl.
CPC ............ *H05K 5/0226* (2013.01); *F16C 11/04* (2013.01)

(58) Field of Classification Search
CPC .............................. H05K 5/0226; F16C 11/04
See application file for complete search history.

(56) References Cited

U.S. PATENT DOCUMENTS 6,831,229 B1 12/2004 Maeaettae et al.
7,797,795 B2 9/2010 Maatta et al.
(Continued)

FOREIGN PATENT DOCUMENTS

CN 110428730 A 11/2019
CN 111357261 A 6/2020
(Continued)

*Primary Examiner* — Imani N Hayman
*Assistant Examiner* — Rashen E Morrison
(74) *Attorney, Agent, or Firm* — Conley Rose, P.C.

(57) ABSTRACT

A rotating shaft mechanism, a support apparatus, and a foldable screen device, and relates to the field of foldable screen device technologies. The rotating shaft mechanism includes a rotating shaft base, a shaft cover, a first swing arm, and a first drive mechanism. The shaft cover is located on a back side of the rotating shaft base, the first swing arm is rotatably connected to the rotating shaft base, and the first swing arm can rotate between an unfolded position and a folded position relative to the rotating shaft base. The first drive mechanism is connected between the first swing arm and the shaft cover, and when rotating from the unfolded position to the folded position, the first swing arm drives, by using the first drive mechanism, the shaft cover to move toward the rotating shaft base.

20 Claims, 30 Drawing Sheets

(56) References Cited

U.S. PATENT DOCUMENTS

| | | | | |
|---|---|---|---|---|
| 8,660,621 | B2 | 2/2014 | Masser et al. | |
| 8,842,424 | B2 | 9/2014 | Kemppinen | |
| 10,551,880 | B1 | 2/2020 | Ai et al. | |
| 11,516,932 | B2 | 11/2022 | Sim et al. | |
| 11,625,073 | B2 * | 4/2023 | Shim | G06F 1/1681 361/679.28 |
| 11,630,491 | B2 | 4/2023 | Huang et al. | |
| 11,846,997 | B2 | 12/2023 | Liao et al. | |
| 11,940,851 | B2 * | 3/2024 | Alva | H04M 1/022 |
| 12,081,686 | B2 | 9/2024 | Nagai et al. | |
| 2004/0264118 | A1 | 12/2004 | Karidis et al. | |
| 2020/0281085 | A1 | 9/2020 | Jia | |
| 2021/0011522 | A1 | 1/2021 | Watamura et al. | |
| 2021/0208641 | A1 | 7/2021 | Huang et al. | |
| 2021/0247815 | A1 * | 8/2021 | Shim | G06F 1/1641 |
| 2021/0271294 | A1 | 9/2021 | Liao et al. | |
| 2024/0007554 | A1 | 1/2024 | Cheng et al. | |
| 2024/0111340 | A1 | 4/2024 | Niu et al. | |
| 2024/0302871 | A1 * | 9/2024 | Zhang | G09F 9/301 |

FOREIGN PATENT DOCUMENTS

| | | | | |
|---|---|---|---|---|
| CN | 210836896 | U | 6/2020 | |
| CN | 111692196 | A | 9/2020 | |
| CN | 111986568 | A | 11/2020 | |
| CN | 113067924 | A | 7/2021 | |
| CN | 113266635 | A | 8/2021 | |
| CN | 113315860 | A | 8/2021 | |
| CN | 214331173 | U | 10/2021 | |
| CN | 214756425 | U | 11/2021 | |
| CN | 113905113 | A * | 1/2022 | H04M 1/022 |
| EP | 2421229 | A2 | 2/2012 | |
| EP | 3809678 | A1 | 4/2021 | |
| JP | 2005275964 | A | 10/2005 | |
| KR | 100385668 | B1 | 5/2003 | |
| KR | 20210146763 | A | 12/2021 | |
| WO | 2006120300 | A1 | 11/2006 | |
| WO | 2020210987 | A1 | 10/2020 | |
| WO | 2020259646 | A1 | 12/2020 | |

* cited by examiner

D-D

ROTATING SHAFT MECHANISM, SUPPORT APPARATUS, AND FOLDABLE SCREEN DEVICE

CROSS-REFERENCE TO RELATED APPLICATIONS

This is a U.S. National Stage of International Application No. PCT/CN2023/070520 filed on Jan. 4, 2023, which claims priority to Chinese Patent Application No. 202210057046.1, filed with the China National Intellectual Property Administration on Jan. 18, 2022 and Chinese Patent Application No. 202210366979.9, filed with the China National Intellectual Property Administration on Apr. 8, 2022, all of which are incorporated herein by reference in their entireties.

TECHNICAL FIELD

This application relates to the field of foldable screen device technologies, and in particular, to a rotating shaft mechanism, a support apparatus, and a foldable screen device.

BACKGROUND

Currently, to resolve problems such as a large size and non-portability of a conventional flat panel terminal, a foldable screen device emerges. The foldable screen device includes housings on both sides and a rotating shaft mechanism connected between the housings on both sides. Inside the rotating shaft mechanism, a shaft cover covers back sides of a rotating shaft base and a moving part inside the rotating shaft mechanism. In a process of folding or unfolding the foldable screen device, the housings on both sides and the shaft cover overlap each other, to maintain an appearance of the foldable screen device. However, as the foldable screen device develops toward thinning, an overlap amount between the housings on both sides and the shaft cover is insufficient. Consequently, when the foldable screen device is in a folded state, the housings on both sides are separated from the shaft cover, and an internal moving part is exposed. This affects quality and the appearance of the foldable screen device.

SUMMARY

Embodiments of this application provide a rotating shaft mechanism, a support apparatus, and a foldable screen device, to resolve a problem of how to avoid exposing an internal moving part without affecting thinning of the foldable screen device.

To achieve the foregoing objective, the following technical solutions are used in the embodiments of this application:

According to a first aspect, a rotating shaft mechanism is provided, where the rotating shaft mechanism includes a rotating shaft base, a shaft cover, a first swing arm, and a first drive mechanism, where the shaft cover is located on a back side of the rotating shaft base, the first swing arm is rotatably connected to the rotating shaft base, and the first swing arm can rotate between an unfolded location and a folded location relative to the rotating shaft base; and the first drive mechanism is connected between the first swing arm and the shaft cover, and when rotating from the unfolded location to the folded location, the first swing arm drives, by using the first drive mechanism, the shaft cover to move toward the rotating shaft base.

In addition to the shaft cover and the rotating shaft base, the rotating shaft mechanism provided in this embodiment of this application further includes the first swing arm and the first drive mechanism. The first swing arm is configured to be fastened to a middle frame. When a user folds the middle frame of a foldable screen device, the first swing arm is a primary moving part. The first drive mechanism is connected between the first swing arm and the shaft cover. When rotating from the unfolded location to the folded location, the first swing arm may drive, by using the first drive mechanism, the shaft cover to move upward. When a thickness of the rotating shaft mechanism m this embodiment of this application in an unfolded state is equal to a thickness of the rotating shaft mechanism in the conventional technology, and the foldable screen terminal is in a folded state, the shaft cover moves upward by a specific height relative to the rotating shaft base, and the shaft cover that moves upward may compensate for a gap between the shaft cover and an overlap part of the middle frame to a specific extent, to reduce a risk that the internal rotating shaft base and an internal moving part connected to the rotating shaft base are exposed. Therefore, this avoids exposing the internal moving part without affecting thinning of the foldable screen device.

In a possible implementation of the first aspect, the first drive mechanism includes a second swing arm; the second swing arm is rotatably connected to the rotating shaft base, the first swing arm is drivably connected to the second swing arm, and the second swing arm is drivably connected to the shaft cover; and when rotating from the unfolded location to the folded location, the first swing arm drives the second swing arm to rotate relative to the rotating shaft base, and further drives, by using the second swing arm, the shaft cover to move toward the rotating shaft base. In this way, revolution movement of the first swing arm is transmitted to the shaft cover by using the second swing arm, so that the shaft cover moves upward. In addition, because the second swing arm is constrained by a location of a rotating pair on the rotating shaft base, drive stability is good.

In a possible implementation of the first aspect, the first drive mechanism includes a first sliding groove and a first sliding member; one of the first sliding groove and the first sliding member is disposed on the first swing arm, the other of the first sliding groove and the first sliding member is disposed on the second swing arm, and the first sliding member is slidably connected in the first sliding groove; and the first swing arm is drivably connected to the second swing arm by using a sliding pair formed by the first sliding groove and the first sliding member. The structure is simple, and occupies small space and a small height, to facilitate miniaturization and thinning of the rotating shaft mechanism.

In a possible implementation of the first aspect, when the first swing arm rotates from the unfolded location to the folded location, an angle by which the first swing arm drives the second swing arm to rotate relative to the rotating shaft base is less than a rotation angle of the first swing arm relative to the rotating shaft base. In this way, a drive angle is reduced by using the second swing arm. Compared with a solution in which the first swing arm is used to directly drive the shaft cover to move upward, a height by which the second swing arm with a small rotation angle is used to drive the shaft cover to move upward is small. This helps reduce an overall height of the rotating shaft mechanism in the unfolded state, thereby facilitating thinning of the foldable screen device in the unfolded state.

In a possible implementation of the first aspect, rotation axes of the second swing arm and the rotating shaft base are a first axis; the first sliding groove has a first end and a second end, and a distance from the first end to the first axis is less than a distance from the second end to the first axis; and when the primary swing arm is at the unfolded location, a vertical distance from the first end to a foldable screen is greater than a vertical distance from the second end to the foldable screen, and when the primary swing arm rotates from the unfolded location to the folded location, the first sliding member slides from the first end to the second end along the first sliding groove. In this way, when the first swing arm rotates from the unfolded location to the folded location, an angle by which the first swing arm drives the second swing arm to rotate relative to the rotating shaft base is less than a rotation angle of the first swing arm relative to the rotating shaft base.

In a possible implementation of the first aspect, the first drive mechanism further includes an actuating member; and the actuating member is fastened relative to the second swing arm, and the second swing arm is drivably connected to the shaft cover by using the actuating member. In this way, when driving the second swing arm to rotate relative to the rotating shaft base, the first swing arm further drives the actuating member to rotate relative to the rotating shaft base, to further drive, by using the actuating member, the shaft cover to move upward. In this embodiment, in a whole formed by the second swing arm and the actuating member, an end part drivably connected to the first swing arm is laid out on the second swing arm, and an end part drivably connected to the shaft cover is laid out on the actuating member. This avoids a case in which the end part drivably connected to the first swing arm and the end part drivably connected to the shaft cover are laid out on the second swing arm together, and can reduce structure complexity of the second swing arm.

In a possible implementation of the first aspect, a distance from an end part, that is on the second swing arm and that is drivably connected to the first swing arm, to a rotation center of the second swing arm is a first distance; an end part that is on the actuating member and that is drivably connected to the shaft cover is eccentrically disposed relative to the rotation center of the second swing arm, and a distance from the end part, that is on the actuating member and that is drivably connected to the shaft cover, to the rotation center of the second swing arm is a second distance; and the first distance is less than the second distance. In this way, when a rotation angle of the actuating member is the same as a rotation angle of the second swing arm, a length of a swing arm is reduced by using the actuating member, so that a height by which the actuating member can be used to drive the shaft cover to move upward is reduced. This helps reduce an overall height of the rotating shaft mechanism when the shaft cover is in the unfolded state, thereby facilitating thinning of the foldable screen device in the unfolded state.

In a possible implementation of the first aspect, the first drive mechanism further includes a second sliding groove and a second sliding member; one of the second sliding groove and the second sliding member is disposed on the actuating member, the other of the second sliding groove and the second sliding member is disposed on the shaft cover, and the second sliding member is slidably connected in the second sliding groove; and the actuating member is drivably connected to the shaft cover by using a sliding pair formed by the second sliding groove and the second sliding member.

The structure is simple, and occupies small space and a small height, to facilitate miniaturization and thinning of the rotating shaft mechanism.

In a possible implementation of the first aspect, the rotating shaft mechanism further includes a door plate and a second drive mechanism, w % here the door plate is rotatably connected to the first swing arm, and the second drive mechanism is connected between the door plate and the rotating shaft base; and when rotating from the unfolded location to the folded location, the first swing arm drives, by using the second drive mechanism, an end that is of the door plate and that is close to the rotating shaft base to tilt toward a side away from the foldable screen relative to an end that is of the door plate and that is away from the rotating shaft base. In this way, when the first swing arm rotates to the folded location, an included angle between a surface that is of the door plate and that is used to dispose the foldable screen and a surface that is of the rotating shaft base and that is used to dispose the foldable screen is a first angle, and an included angle between a surface that is of the middle frame and that is used to dispose the foldable screen and the surface that is of the rotating shaft base and that is used to dispose the foldable screen is a second angle. The first angle is less than the second angle. In other words, when the first swing arm rotates from the unfolded location to the folded location, a rotation angle of the door plate relative to the rotating shaft base is greater than a rotation angle of the middle frame relative to the rotating shall base. Because the middle frame is fastened to the first swing arm, the rotation angle of the middle frame relative to the rotating shaft base is equal to a rotation angle of the first swing arm relative to the rotating shaft base. In other words, the rotation angle of the door plate relative to the rotating shaft base is greater than the rotation angle of the first swing arm relative to the rotating shaft base. In this way, a third display area of the foldable screen may be folded into a water drop shape, to reduce an inward folding angle, reduce a probability that a crease occurs on the foldable screen, ensure a display effect of the foldable screen, and prolong a life span of the foldable screen.

In a possible implementation of the first aspect, the second drive mechanism includes a door plate swing arm, and the door plate swing arm is rotatably connected to the rotating shaft base; and a third sliding groove is disposed on the door plate, the door plate swing arm slidably penetrates into the third sliding groove, and when the first swing arm rotates from the unfolded location to the folded location, an angle by which the first swing arm drives the door plate swing arm to rotate relative to the rotating shaft base is greater than a rotation angle of the first swing arm relative to the rotating shaft base.

In a possible implementation of the first aspect, there are two first swing arms, and the two first swing arms are symmetrically disposed on two opposite sides of the rotating shaft base; the rotating shaft mechanism further includes a synchronization mechanism; and when rotating from the unfolded location to the folded location, either of the two first swing arms drives, by using the synchronization mechanism, the other first swing arm to synchronously rotate from the unfolded location to the folded location. In this way, the two first swing arms may synchronously rotate by a same angle by using the synchronization mechanism, to reduce difficulty in folding and unfolding the foldable screen device.

In a possible implementation of the first aspect, the synchronization mechanism is connected between the two primary swing arms.

In a possible implementation of the first aspect, there are two first drive mechanisms, and the two first drive mechanisms are respectively connected between the two first swing arms and the shaft cover; and the synchronization mechanism is connected between second swing arms of the two first drive mechanisms. There is sufficient space between the two second swing arms to facilitate mounting of the synchronization mechanism.

In a possible implementation of the first aspect, the synchronization mechanism is connected between two door plate swing arms.

In a possible implementation of the first aspect, the synchronization mechanism includes an even quantity of successively meshed drive gears. Specifically, the quantity of drive gears may be two, four, six, or the like. The even quantity of drive gears includes a first drive gear and a second drive gear that are respectively located at a head location and a tail location, the first drive gear and the second drive gear are respectively configured to be fastened relative to the two second swing arms, and a center axis of the first drive gear and a center axis of the second drive gear are respectively collinear with rotation axes of the two second swing arms. Therefore, the even quantity of drive gears are meshed for driving, so that the two second swing arms can be driven to synchronously swing. The structure is simple and easy to implement. In addition, if a larger quantity of drive gears are designed, a smaller height of the drive gear may be designed, to further help implement thinning of the rotating shaft mechanism. However, a larger quantity of drive gears indicates higher structure complexity, a smaller volume of the drive gear, and larger processing difficulty. Therefore, based on different design requirements, thinning, structure complexity, and processing difficulty of the rotating shaft mechanism may be comprehensively considered to select different quantities of drive gears.

In a possible implementation of the first aspect, the synchronization mechanism includes a drive slider, and the drive slider is located between the second swing arms of the two first drive mechanisms; the drive slider is slidably connected to the rotating shaft base in a length direction of the rotating shaft base, and the drive slider is drivably connected to the second swing arms of the two first drive mechanisms; and when rotating from the unfolded location to the folded location, either of the second swing arms of the two first drive mechanisms drives the drive slider to slide in the length direction of the rotating shaft base, and drives the other second swing arm to synchronously rotate from the unfolded location to the folded location. The synchronization mechanism occupies a small height, so that a thickness of the rotating shaft mechanism can be reduced, to facilitate thinning of the foldable screen device.

In a possible implementation of the first aspect, one of a spiral sliding groove and a slider is disposed on the drive slider, and the other of the spiral sliding groove and the slider is disposed on the second swing arm; and a center line of a spiral extension path of the spiral sliding groove is parallel to a slidable direction of the drive slider, and the slider is slidably disposed in the spiral sliding groove. The drivable connection manner between the drive slider and the second swing arm is a drivable connection obtained by using a structure including the spiral sliding groove and the slider. The structure is simple, and occupies small space, to facilitate a compact structure design of the rotating shaft mechanism.

In a possible implementation of the first aspect, the drivable connection manner between the drive slider and the second swing arm includes but is not limited to a drivable connection obtained by using a structure including a lead screw and a nut or a drivable connection obtained by using a structure including a worm gear and a worm.

In a possible implementation of the first aspect, the rotating shaft mechanism further includes a damping mechanism, where the damping mechanism is configured to: when the first swing arm rotates relative to the rotating shaft base, apply damping force to the first swing arm to prevent the first swing arm from rotating. In this way, the foldable screen device may be kept at one unfolding angle location, a plurality of unfolding angle locations, or any unfolding angle location, to ensure structure stability of the foldable screen device at these unfolding angle locations.

In a possible implementation of the first aspect, the damping mechanism is disposed between the first swing arm and the rotating shaft base, or the damping mechanism is disposed between the first sliding groove and the first sliding member, or the damping mechanism is disposed between the second swing arm and the rotating shaft base, or the damping mechanism is disposed between the second sliding groove and the second sliding member, or the damping mechanism is disposed between the third sliding groove and the door plate swing arm, or the damping mechanism is disposed between the door plate and the first swing arm.

In a possible implementation of the first aspect, an end surface of the first sliding groove in a length direction of the rotating shaft base is a friction surface; the damping mechanism is connected to the first sliding member, and when sliding along the first sliding groove, the first sliding member drives the damping mechanism to move along the friction surface; and the damping mechanism includes a friction member and an elastic member, the friction member is located on a side faced by the friction surface, and the elastic member is configured to apply, to the friction member, elastic force pointing to the friction surface, so that the friction member abuts the friction surface. The structure is simple and easy to implement.

In a possible implementation of the first aspect, the friction surface is a cam surface, and the cam surface includes a first bottom area, a rising area, a top area, a falling area, and a second bottom area that are successively disposed in a length direction of the first sliding groove; when the first swing arm is at the unfolded location, the friction member is in contact with the first bottom area, when the first swing arm rotates from the unfolded location to the folded location, the friction member abuts the friction surface, and slides successively along the rising area, the top area, and the falling area; and when the first swing arm is at the folded location, the friction member is in contact with the second bottom area. In this way, when the rotating shaft mechanism rotates between the unfolded state and the folded state, damping force generated between the friction member and the friction surface needs to be overcome. When no external force is applied, the rotating shaft mechanism may be kept in the unfolded state and the folded state. This is consistent with a use habit of the user.

In a possible implementation of the first aspect, there are two first sliding grooves, the two first sliding grooves are disposed at intervals in the length direction of the rotating shaft base and are fastened relative to each other, and friction surfaces of the two first sliding grooves are opposite to each other; and the damping mechanism is disposed between the two first sliding grooves, there are two friction members, the elastic member is located between the two friction members, and the elastic member simultaneously applies, to the two friction members, elastic force pointing to corresponding friction surfaces, so that the two friction members respectively abut the corresponding friction surfaces. In this way, when the rotating shaft mechanism rotates between the unfolded state and the folded state, the damping force generated by the damping mechanism is large, and large driving force needs to be applied, so that the rotating shaft mechanism can be stably kept in the unfolded state or the folded state, thereby improving use stability of the rotating shaft mechanism.

In a possible implementation of the first aspect, when rotating from the folded location to the unfolded location, the first swing arm may drive, by using the first drive mechanism, the shaft cover to move away from the rotating shaft base. In this way, reset may be implemented, so that upward movement of the shaft cover during next folding is not affected.

In a possible implementation of the first aspect, a limiting structure is disposed between the shaft cover and the rotating shaft base, and the limiting structure allows the shaft cover to move toward or away from the rotating shaft base in a thickness direction of the rotating shaft base, to prevent the shaft cover from moving along a plane perpendicular to the thickness direction of the rotating shaft base. In this way, limiting is performed by using the limiting structure, so that stability of upward movement or downward movement of the shaft cover can be ensured, to avoid the following case; The shaft cover is misaligned relative to the rotating shaft base, and cannot cover the rotating shaft base and a moving mechanism connected to the rotating shaft base.

According to a second aspect, a support apparatus is provided, where the support apparatus includes a first housing, a second housing, and the rotating shaft mechanism described in any one of the foregoing technical solutions, where the rotating shaft mechanism has two first swing arms, the two first swing arms are symmetrically disposed on two opposite sides of the rotating shaft base, and the two first swing arms are respectively fastened to the first housing and the second housing.

Because the support apparatus provided in this embodiment of this application includes the rotating shaft mechanism described in any one of the foregoing technical solutions, the support apparatus and the rotating shaft mechanism can resolve a same technical problem and achieve a same effect. Details are not described herein again.

According to a third aspect, a foldable screen device is provided, where the foldable screen device includes a foldable screen and the support apparatus described in the foregoing technical solution, where the foldable screen includes a first display area, a second display area, and a third display area, the third display area is connected between the first display area and the second display area, the first display area is disposed on the first housing, the second display area is disposed on the second housing, and the third display area is disposed on the rotating shaft mechanism.

Because the foldable screen device provided in this embodiment of this application includes the rotating shaft mechanism described in the foregoing technical solution, the foldable screen device and the rotating shaft mechanism can resolve a same technical problem and achieve a same effect. Details are not described herein again.

DESCRIPTION OF EMBODIMENTS

In embodiments of this application, the terms "first" and "second" are merely used for the purpose of description, and cannot be construed as an indication or implication of relative importance or an implicit indication of a quantity of indicated technical features. Therefore, features defined with "first" and "second" may explicitly or implicitly include one or more of the features.

In the embodiments of this application, the term "include", "comprise", or any other variant thereof is intended to cover non-exclusive inclusion, so that a process, method, article, or apparatus that includes a series of elements includes not only those elements but also other elements that are not explicitly listed, or includes elements inherent to such a process, method, article, or apparatus. Without further limitation, the element defined by the sentence "including a . . . " does not exclude that other identical elements also exist in the process, method, article, or apparatus including the element.

In the embodiments of this application, the term "drivable connection" means that movement of one of two connected parts may be transmitted to the other part. A connection manner between the two parts includes but is not limited to at least one of connection manners such as a rotatable connection, a slidable connection, a drivable connection through gear meshing, a drivable connection by using a sprocket, and a drivable connection by using a cam mechanism.

This application provides a foldable screen device. The foldable screen device may be user equipment (user equipment, UE), a terminal device (terminal), or the like. For example, the foldable screen device may be a mobile terminal or a fixed terminal, for example, a tablet computer (portable android device, PAD), a personal digital assistant (personal digital assistant, PDA), a handheld device with a wireless communication function, a computing device, an in-vehicle device, a wearable device, a virtual reality (virtual reality, VR) terminal device, an augmented reality (augmented reality, AR) terminal device, a wireless terminal in industrial control (industrial control), a wireless terminal in self driving (self driving), a wireless terminal in remote medical (remote medical), a wireless terminal in a smart grid (smart grid), a wireless terminal m transportation safety (transportation safety), a wireless terminal in a smart city (smart city), or a wireless terminal in a smart home (smart home). A form of the foldable screen device is not specifically limited in the embodiments of this application.

Figure 1:
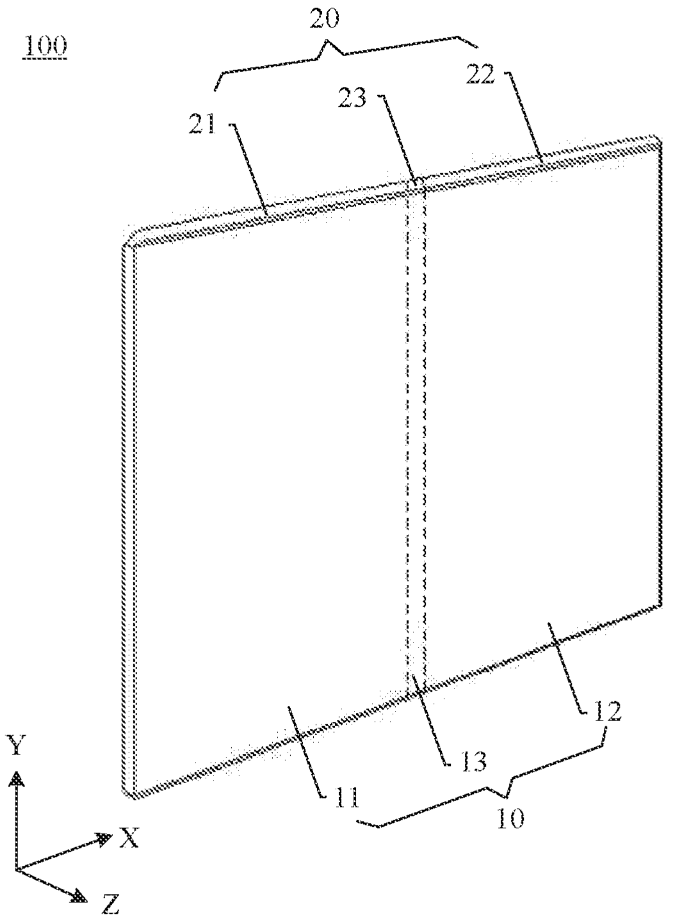
FIG. 1 is a three-dimensional view of a foldable screen device in an unfolded state according to some embodiments of this application.
Figure 2:
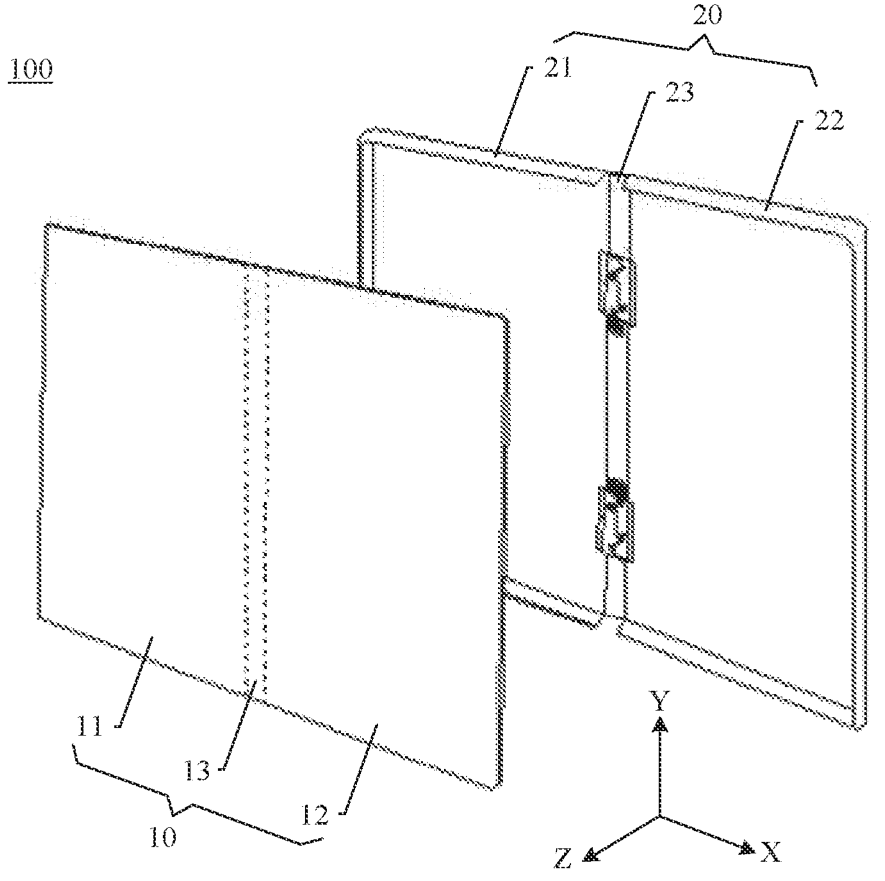
FIG. 2 is a schematic diagram of a partial exploded structure of the foldable screen device shown in FIG. 1.

FIG. 1 is a three-dimensional view of a foldable screen device 100 in an unfolded state according to some embodiments of this application. FIG. 2 is a schematic diagram of a partial exploded structure of the foldable screen device 100 shown in FIG. 1. This embodiment and the following embodiments are described by using an example in which the foldable screen device 100 is a handheld device with a wireless communication function. The handheld device with a wireless communication function may be, for example, a mobile phone. The foldable screen device 100 is approximately in a shape of a rectangular flat panel in the unfolded state. For ease of description in the following embodiments, an XYZ coordinate system is established for the foldable screen device 100 in the unfolded state, a length direction of the foldable screen device 100 is defined as an X-axis direction, a width direction of the foldable screen device 100 is defined as a Y-axis direction, and a thickness direction of the foldable screen device 100 is defined as a Z-axis direction. It can be understood that the coordinate system of the foldable screen device 100 may be flexibly set based on an actual requirement. This is not specifically limited herein. In some other embodiments, the foldable screen device 100 may be alternatively in a shape of a square flat panel, a shape of a round flat panel, a shape of an elliptical flat panel, or the like.

The foldable screen device 100 includes a foldable screen 10 and a support apparatus 20.

The foldable screen 10 is configured to display information such as an image and a video. The foldable screen 10 may be an organic light-emitting diode (organic light-emitting diode, OLED) screen, a micro organic light-emitting diode (micro organic light-emitting diode) screen, a quantum dot light emitting diodes (quantum dot light emitting diodes, QLED) screen, a liquid crystal display (liquid crystal display, LCD), or the like.

The foldable screen 10 has a display area used to display image information, and the display area of the foldable screen 10 is exposed, to present information such as an image and a video to a user. The foldable screen 10 includes a first display area 11, a second display area 12, and a third display area 13, and the third display area 13 is connected between the first display area 11 and the second display area 12. In the foldable screen device 100 shown in FIG. 1, when the foldable screen 10 is in the unfolded state, the first display area 11, the third display area 13, and the second display area 12 are successively arranged in the X-axis direction. In this way, the foldable screen device 100 is horizontally folded. In some other embodiments, when the foldable screen 10 is in the unfolded state, the first display area 11, the third display area 13, and the second display area 12 may be successively arranged in the Y-axis direction. In this way, the foldable screen device 100 is vertically folded. When the foldable screen 10 is in the unfolded state, large-screen display can be implemented, to provide richer information for the user, and bring better user experience to the user.

At least the third display area 13 of the foldable screen 10 is a flexible screen structure. In this way, the third display area 13 may be bent and deformed under external force, so that the foldable screen 10 is folded from the unfolded state shown in FIG. 1 to a folded state. The first display area 11 and the second display area 12 of the foldable screen 10 each may be a flexible screen structure, or may be a rigid screen structure, or may be a partial flexible screen structure and a partial rigid screen structure. This is not specifically limited herein.

Figure 3:
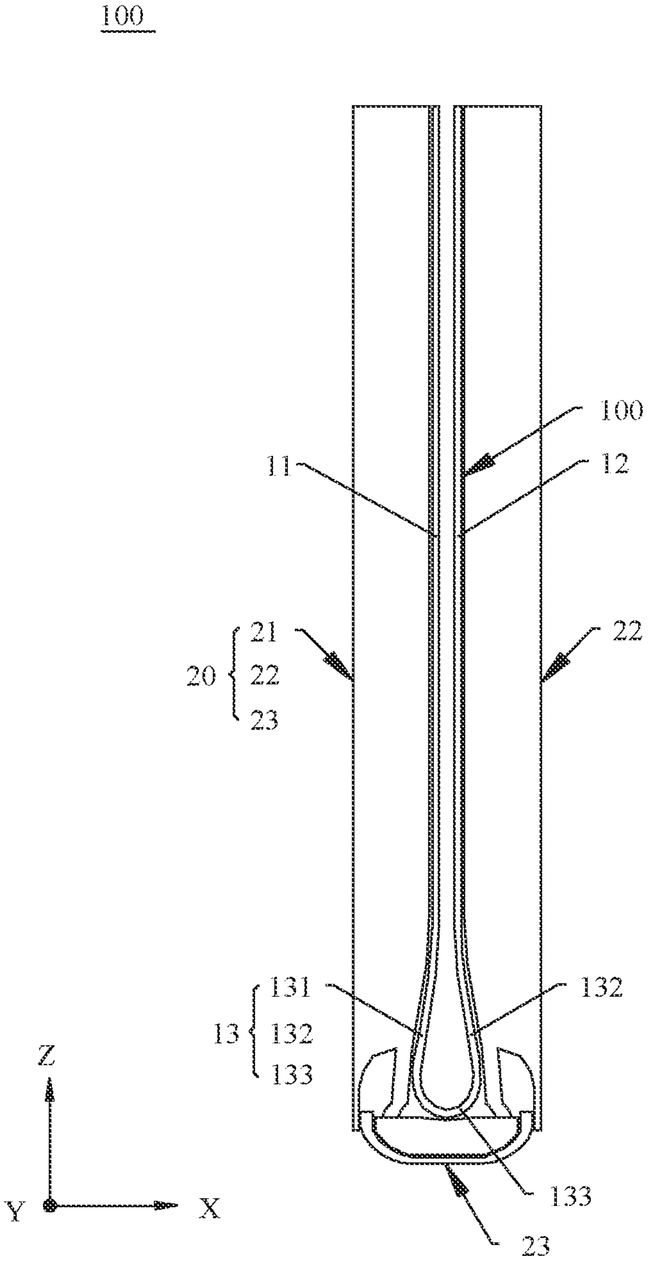
FIG. 3 is a schematic diagram of a structure of the foldable screen device shown in FIG. 1 in a folded state.

FIG. 3 is a schematic diagram of a structure of the foldable screen device 100 shown in FIG. 1 in a folded state. The foldable screen 10 in the foldable screen device 100 is also in the folded state. Specifically, when the foldable screen 10 is in the folded state, the first display area 11 and the second display area 12 of the foldable screen 10 are approximately parallel and opposite to each other. It should be noted that, if an included angle between the first display area 11 and the second display area 12 is within 30°, it can be considered that the first display area 11 and the second display area 12 are approximately parallel. That the first display area 11 and the second display area 12 are opposite to each other means that a display surface of the first display area 11 and a display surface of the second display area 12 face each other.

When the foldable screen 10 is in the folded state, still referring to FIG. 3, the third display area 13 is folded into a water drop form. In this form, the third display area 13 includes an arc segment 133, a first transition segment 131, and a second transition segment 132. The first transition segment 131 is connected between the arc segment 133 and the first display area 11. The second transition segment 132 is connected between the arc segment 133 and the second display area 12. A distance between an end that is of the first transition segment 131 and that is connected to the first display area 11 and an end that is of the second transition segment 132 and that is connected to the second display area 12 is a third distance, a distance between an end that is of the first transition segment 131 and that is connected to the arc segment 133 and an end that is of the second transition segment 132 and that is connected to the arc segment 133 is a fourth distance, and the fourth distance is greater than the third distance. It can be understood that, when the foldable screen device is in the folded state, the third display area 13 of the foldable screen 10 may be folded into another shape based on an actual requirement. This is not limited in this application.

When the foldable screen device 100 is in the folded state, still referring to FIG. 3, the support apparatus 20 protects the foldable screen 10 from the outside, and the foldable screen 10 is invisible to the user, so that the foldable screen 10 can be prevented from being scratched by a hard object. The foldable screen device is an inward foldable screen device, and a size of the foldable screen device 100 is reduced, so that the foldable screen device 100 is convenient to carry.

The support apparatus 20 is configured to bear the foldable screen 10. The support apparatus 20 includes a first housing (which may also be referred to as a primary housing) 21, a second housing (which may also be referred to as a secondary housing) 22, and a rotating shaft mechanism 23. The first housing 21 bears the first display area 11, and the second housing 22 bears the second display area 12. The rotating shaft mechanism 23 is connected between the first housing 21 and the second housing 22, and bears the third display area 13. The rotating shaft mechanism 23 is configured to implement revolution between the second housing 22 and the first housing 21, to support folding of the foldable screen 10 between the unfolded state and the folded state.

In the foregoing embodiment, optionally, the first housing 21 may include a middle frame and a back cover that are connected together. The first display area 11 of the foldable screen 10 is bome on the middle frame of the first housing 21, the back cover is located on a side that is of the middle frame and that is away from the first display area 11, and the back cover may be replaced with a display screen (for example, an LCD display screen). An accommodating cavity is formed between the middle frame and the back cover, and the accommodating cavity is configured to accommodate electronic components such as a mainboard, a camera module, and a battery. On this basis, the first housing 21 may be connected to the rotating shaft mechanism 23 by using the middle frame, or may be connected to the rotating shaft mechanism 23 by using the back cover. The following embodiments are described by using an example in which the first housing 21 is connected to the rotating shaft mechanism 23 by using the middle frame.

Similarly, the second housing 22 may also include a middle frame and a back cover that are connected together. The second display area 12 of the foldable screen 10 is borne on the middle frame of the second housing 22, the back cover is located on a side that is of the middle frame and that is away from the second display area 12, and the back cover may also be replaced with a display screen (for example, an LCD display screen). An accommodating cavity is formed between the middle frame and the back cover, and the accommodating cavity is configured to accommodate electronic components such as a sub-board, a loudspeaker module, an element, and a battery. On this basis, the second housing 22 may be connected to the rotating shaft mechanism 23 by using the middle frame, or may be connected to the rotating shaft mechanism 23 by using the back cover. The following embodiments are described by using an example in which the second housing 22 is connected to the rotating shaft mechanism 23 by using the middle frame.

It should be noted that, to distinguish between the middle frame of the first housing 21 and the middle frame of the second housing 22, in descriptions of the following embodiments, the middle frame of the first housing 21 is referred to as a primary middle frame, and has a reference numeral A in the accompanying drawings, and the middle frame of the second housing 22 is referred to as a secondary middle frame, and has a reference numeral B in the accompanying drawings.

Figure 4:
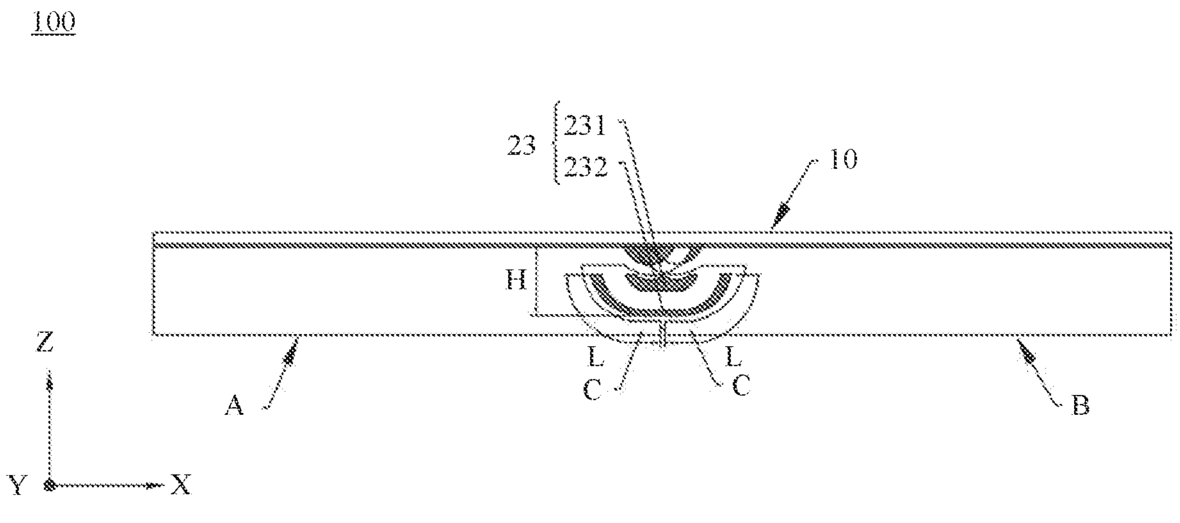
FIG. 4 is an assembly diagram of a primary middle frame, a secondary middle frame, a rotating shaft mechanism, and a foldable screen inside a foldable screen device in an unfolded state according to some embodiments of this application.

FIG. 4 is an assembly diagram of a primary middle frame A, a secondary middle frame B, a rotating shaft mechanism 23, and a foldable screen 10 inside a foldable screen device 100 in an unfolded state according to some embodiments of this application. The rotating shaft mechanism 23 includes a rotating shaft base 231 and a shaft cover 232.

The rotating shaft base 231 provides a location reference in the rotating shaft mechanism 23. The primary middle frame A and the secondary middle frame B are rotatably connected to the rotating shaft base 231, and the primary middle frame A and the secondary middle frame B can rotate relative to the rotating shaft base 231, so that the foldable screen device 100 moves between the unfolded state and the folded state. In addition, the rotating shaft base 231 is further configured to support a part of the foldable screen. Specifically, the rotating shaft base 231 is configured to support the third display area 13 of the foldable screen 10 in the foldable screen device shown in FIG. 3.

The shaft cover 232 is located on a back side of the rotating shaft base 231. It should be noted that the back side of the rotating shaft base 231 is a side that is of the rotating shaft base 231 and that faces away from the foldable screen 10. "Back side" used by another part in the rotating shaft mechanism 23 described in the following embodiments is a side that is of the described part and that faces away from the foldable screen 10. Details are not described again in the following embodiments.

The shaft cover 232 is used as an exterior part (namely, an externally visible part) of the rotating shaft mechanism 23, and is configured to cover the rotating shaft base 231 and a moving part (not shown in the figure) connected to the rotating shaft base 231 in the rotating shaft mechanism 23, to ensure an appearance of the foldable screen device, and prevent relative movement between the moving part and the rotating shaft base 231 in the rotating shaft mechanism 23 from being interfered with by an external environment.

Generally, the shaft cover 232 is fixedly connected to the rotating shaft base 231. The connection manner is stable and easy to implement. In addition, relative locations of the shaft cover 232 and the rotating shaft base 231 are fixed. In a process of folding the foldable screen device, the shaft cover 232 always covers back sides of the rotating shaft base 231 and the moving part connected to the rotating shaft base 231. Therefore, relative movement between the moving part and the rotating shaft base 231 in the rotating shaft mechanism 23 can be effectively prevented from being interfered with by the external environment.

Figure 5:
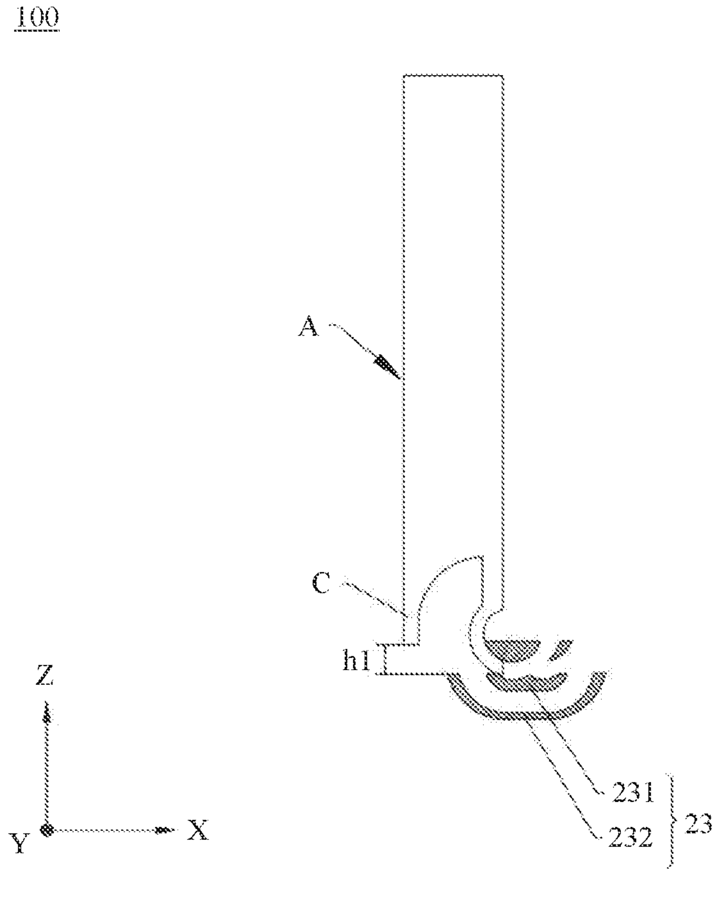
FIG. 5 is a schematic diagram of relative locations of a rotating shaft mechanism and a primary middle frame of a foldable screen device in a folded state according to some embodiments of this application.

Based on the foregoing descriptions, the shaft cover 232 is used as an exterior part of the rotating shaft mechanism 23. To ensure an appearance of the foldable screen device in a process of moving between the unfolded state and the folded state, in some embodiments, still referring to FIG. 4, the primary middle frame A and the secondary middle frame B each have an overlap part C. The overlap part C may also be disposed on the back cover of each of the first housing 21 and the second housing 22. There is a specific overlap amount L between the overlap part C and the shaft cover 232. When the foldable screen device moves from the unfolded state to the folded state, the overlap amount L gradually decreases. When the foldable screen device moves from the folded state to the unfolded state, the overlap amount L gradually increases. In the process in which the foldable screen device moves between the unfolded state and the folded state, a minimum overlap amount is an overlap amount existing when the foldable screen device is in the folded state, and the minimum overlap amount needs to be greater than or equal to 0 millimeters (mm), to avoid generating a step difference between the overlap part C and the shaft cover 232, and avoid exposing the moving part inside the rotating shaft mechanism 23. However, as the foldable screen device gradually develops toward lightening and thinning, a thickness H of the rotating shaft mechanism 23 gradually decreases, and the overlap amount L between the overlap part C and the shaft cover 232 is insufficient. Consequently, when the foldable screen device is in the folded state, FIG. 5 is a schematic diagram of relative locations of a rotating shaft mechanism 23 and a primary middle frame A of a foldable screen device 100 in a folded state according to some embodiments of this application, and it can be seen from FIG. 5 that the overlap part C is separated from the shaft cover 232, a gap with a height h1 exists in the Z-axis direction, and the internal rotating shaft base 231 and the internal moving part connected to the rotating shaft base 231 are exposed. This affects the appearance and quality of the foldable screen device 100.

Figure 6:
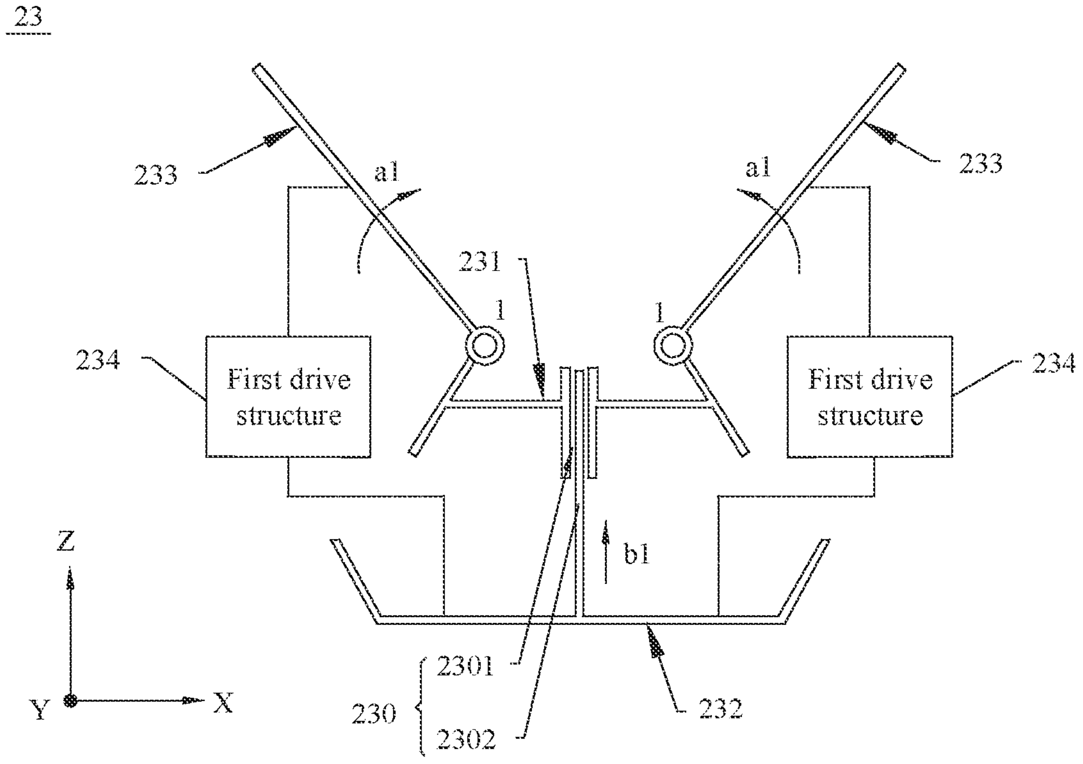
FIG. 6 is a simplified diagram of a structure of a rotating shaft mechanism according to some other embodiments of this application.

To resolve the foregoing problem, FIG. 6 is a simplified diagram of a structure of a rotating shaft mechanism 23 according to some other embodiments of this application. In this embodiment, the rotating shaft mechanism 23 includes a rotating shaft base 231, a shaft cover 232, a first swing arm 233, and a first drive mechanism 234.

Functions of the rotating shaft base 231 and the shaft cover 232 are the same as functions of the rotating shaft base 231 and the shaft cover 232 in the foregoing embodiment. The rotating shaft base 231 may have a plurality of shapes, and the rotating shaft base 231 may be an integral structure, or may be formed by assembling a plurality of parts. The shaft cover 232 may be semicircular, arc-shaped, or U-shaped, or may be in another shape. Materials of the rotating shaft base 231 and the shaft cover 232 include but are not limited to metal and plastic. The shaft cover 232 is located on a back side of the rotating shaft base 231.

The first swing arm 233 may also be referred to as a primary swing arm. The first swing arm 233 is rotatably connected (which may also be referred to as a hinged or revolution connection) to the rotating shaft base 231 by using a rotating pair 1, and the first swing arm 233 is configured to be fastened to the middle frame (including the primary middle frame A and the secondary middle frame B). When the user folds the foldable screen device 100, the first swing arm 233 moves with the middle frame, and the first swing arm 233 may be understood as a primary moving part of the rotating shaft mechanism 23. In some embodiments, referring to FIG. 6, there are two first swing arms 233, the two first swing arms 233 are symmetrically disposed on two opposite sides of the rotating shaft base 231, and the two first swing arms 233 are respectively configured to be fastened to the primary middle frame A and the secondary middle frame B. The two first swing arms 233 are both rotatably connected to the rotating shaft base 231, and the two first swing arms 233 can rotate between an unfolded location and a folded location relative to the rotating shaft base 231. When the two first swing arms 233 are at the unfolded location, the rotating shaft mechanism 23 is in the unfolded state, and the foldable screen device on which the rotating shaft mechanism 23 is mounted is in the unfolded state. When the two first swing arms 233 are at the folded location, the rotating shaft mechanism 23 is in the folded state, and the foldable screen device on which the rotating shaft mechanism 23 is mounted is in the folded state.

The first drive mechanism 234 is connected between the first swing arm 233 and the shaft cover 232, and when rotating from the unfolded location to the folded location in a direction a1, the first swing arm 233 may drive, by using the first drive mechanism 234, the shaft cover 232 to move toward the rotating shaft base 231 in a direction b1. That the shaft cover 232 moves toward the rotating shaft base 231 means that a movement direction of the shaft cover 232 makes a distance between the shaft cover 232 and the rotating shaft base 231 smaller. The rotating shaft base 231 is used as a location reference. Based on an orientation relationship shown in FIG. 6, movement of the shaft cover 232 toward the rotating shaft base 231 is upward movement. Upward movement of the shaft cover 232 may be an upward movement in the Z-axis direction. In some other embodiments, an upward movement track of the shaft cover 232 may also tilt by a specific angle relative to the Z-axis direction, for example, tilt by 5°, 6°, 7°, 8°, 9°, or 10°. It should be noted that, when the tilt angle of the upward movement track of the shaft cover 232 relative to the Z-axis direction is less than 5°, it can be considered that the shaft cover 232 moves upward in the Z-axis direction. In this embodiment of this application, an example in which upward movement of the shaft cover 232 is upward movement in the Z-axis direction is used for description. This should not be construed as a special limitation on this application.

In some embodiments, referring to FIG. 6, there may be two first drive mechanisms 234. The two first drive mechanisms 234 are respectively connected between the two first swing arms 233 and the shaft cover 232. When rotating from the unfolded location to the folded location, the two first swing arms 233 drive, by using the two first drive mechanisms 234, the shaft cover 232 to move upward. In this way, upward movement of the shaft cover 232 is smooth, tilt is not prone to occur, and a problem such as jamming is avoided.

In some other embodiments, there may be one first drive mechanism 234, and the one first drive mechanism 234 is connected between one of the two first swing arms 233 and the shaft cover 232. In this way, when rotating from the unfolded location to the folded location, the two first swing arms 233 may still drive, by using the one first drive mechanism 234, the shaft cover 232 to move toward the rotating shaft base 231. The rotating shaft mechanism 23 has a simple composition structure, low costs, and high assembly efficiency.

Figure 7:
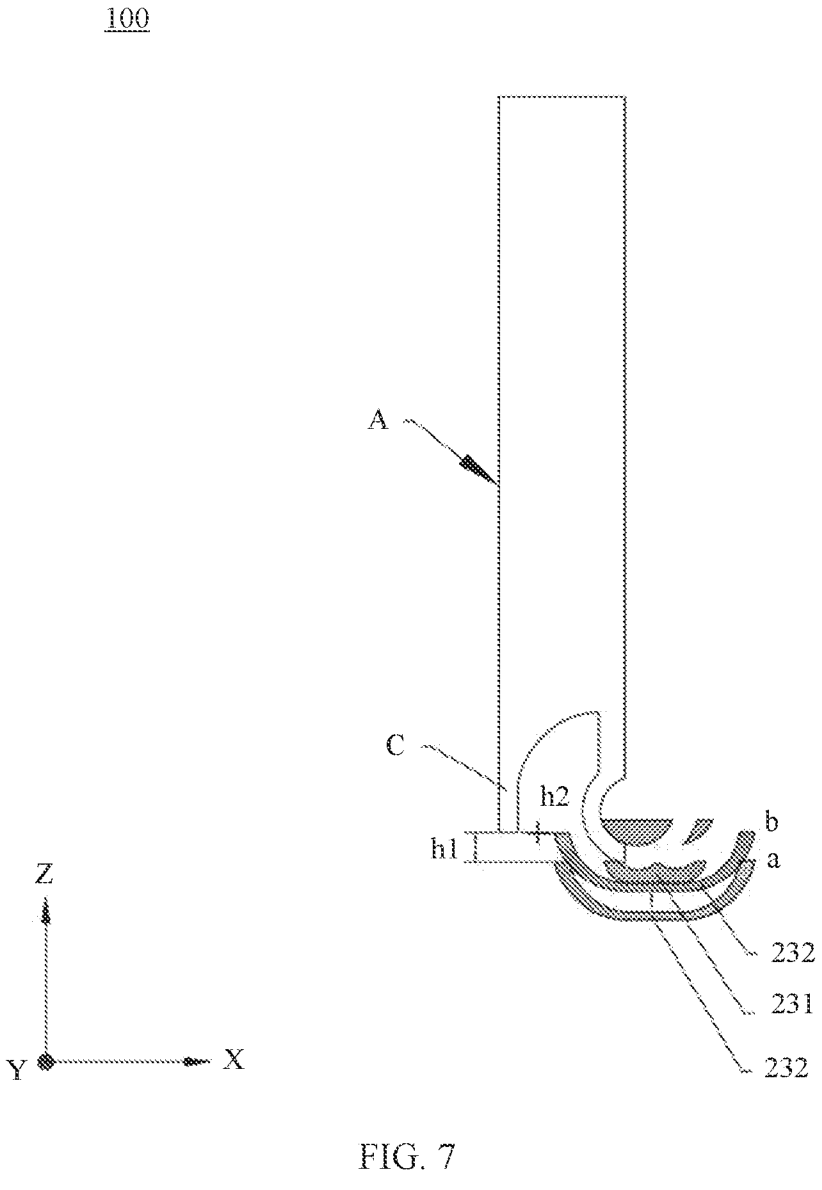
FIG. 7 is a diagram of comparison between a foldable screen device, including the rotating shaft mechanism shown in FIG. 6, in a folded state and the foldable screen device shown in FIG. 5 in a folded state.

Based on the descriptions in the foregoing embodiment, in addition to the shaft cover 232 and the rotating shaft base 231, the rotating shaft mechanism 23 provided in this embodiment of this application further includes the first swing arm 233 and the first drive mechanism 234. The first swing arm 233 is configured to be fastened to the middle frame (including the primary middle frame A and the secondary middle frame B). When the user folds the middle frame of the foldable screen device 100, the first swing arm 233 is a primary moving part. The first drive mechanism 234 is connected between the first swing arm 233 and the shaft cover 232. When rotating from the unfolded location to the folded location, the first swing arm 233 may drive, by using the first drive mechanism 234, the shaft cover 232 to move upward. When a thickness of the rotating shaft mechanism 23 in this embodiment of this application in the unfolded state is equal to a thickness of the rotating shaft mechanism 23 in the foldable screen terminal 100 shown in FIG. 4-FIG. 5, and the foldable screen terminal 100 is in the folded state, FIG. 7 is a diagram of comparison between a foldable screen device 100, including the rotating shaft mechanism 23 shown in FIG. 6, in a folded state and the foldable screen device 100 shown in FIG. 5 in a folded state, and sizes, shapes, and relative locations of the rotating shaft bases 231 and the middle frames (only the primary middle frame A is displayed in the figure) in the two foldable screen devices 100 are the same, and locations thereof in FIG. 7 overlap. The shaft cover 232 of the foldable screen device 100 shown in FIG. 5 is at a location a, and the shaft cover 232 of the foldable screen device 100 including the rotating shaft mechanism 23 shown in FIG. 6 is at a location b, where the location b is higher than the location a. A gap between the overlap part C and the shaft cover 232 of the foldable screen device 100 shown in FIG. 5 is h1, and a gap between the overlap part C and the shaft cover 232 of the foldable screen device 100 including the rotating shaft mechanism 23 shown in FIG. 6 is h2, where h2 is less than h1. It can be learned that the shaft cover 232 that moves upward may compensate for the gap between the shaft cover 232 and the overlap part C of the middle frame to a specific extent, to reduce a risk that the internal rotating shaft base 231 and the internal moving part connected to the rotating shaft base 231 are exposed.

In some embodiments, h2 is approximately 0 or less than 0. It should be noted that, that h2 is less than 0 indicates that there is an overlap amount between the shaft cover 232 and the overlap part C. In this way, the gap between the shaft cover 232 and the overlap part C of the middle frame is effectively compensated for, to reduce, as much as possible, the risk that the internal rotating shaft base 231 and the internal moving part connected to the rotating shaft base 231 are exposed.

In some embodiments, when rotating from the folded location to the unfolded location in a direction opposite to the direction a1, the first swing arm 233 may drive, by using the first drive mechanism 234, the shaft cover 232 to move away from the rotating shaft base 231 in a direction opposite to the direction b1. That the shaft cover 232 moves away from the rotating shaft base 231 means that a movement direction of the shaft cover 232 makes a distance between the shaft cover 232 and the rotating shaft base 231 larger. The rotating shaft base 231 is used as a location reference. Based on an orientation relationship shown in FIG. 6, movement of the shaft cover 232 away from the rotating shaft base 231 is downward movement. In this way, reset may be implemented, so that upward movement of the shaft cover 232 during next folding is not affected.

In the foregoing embodiment, downward movement of the shaft cover 232 may also be downward movement in a −Z-axis direction, where the −Z-axis direction is a direction opposite to the Z-axis direction. In some other embodiments, a downward movement track of the shaft cover 232 may also tilt by a specific angle relative to the −Z-axis direction, for example, tilt by 5°, 6°, 7°, 8°, 9°, or 10°. It should be noted that, when the tilt angle of the downward movement track of the shaft cover 232 relative to the −Z-axis direction is less than 5°, it can be considered that the shaft cover 232 moves downward in the −Z-axis direction. The following embodiments are described by using an example in which downward movement of the shaft cover 232 is downward movement in the −Z-axis direction.

To ensure reliability of upward movement and the downward movement of the shaft cover 232, in some embodiments, referring back to FIG. 6, there is a limiting structure 230 between the shaft cover 232 and the rotating shaft base 231, and the limiting structure 230 allows the shaft cover 232 to move toward or away from the rotating shaft base 231 in a thickness direction (namely, the Z-axis direction) of the rotating shaft base 231, to prevent the shaft cover 232 from moving along a plane (namely, an XY plane) perpendicular to the thickness direction of the rotating shaft base 231. In this way, limiting is performed by using the limiting structure 230, so that stability of upward movement or downward movement of the shaft cover 232 can be ensured, to avoid the following case: The shaft cover 232 is misaligned relative to the rotating shaft base 231, and cannot cover the rotating shaft base 231 and a moving mechanism connected to the rotating shaft base 231.

In some embodiments, still referring to FIG. 6, the limiting structure 230 may include a limiting sliding groove 2301 and a limiting sliding member 2302. The limiting sliding groove 2301 is disposed on the rotating shaft base 231, and the limiting sliding member 2302 is disposed on the shaft cover 232. In some other embodiments, the limiting sliding member 2302 is disposed on the rotating shaft base 231, the limiting sliding groove 2301 is disposed on the shaft cover 232, the limiting sliding groove 2301 extends in the Z-axis direction, and the limiting sliding member 2302 is disposed in the limiting sliding groove 2301, and can slide along the limiting sliding groove 2301. The limiting sliding groove 2301 and the limiting sliding member 2302 form a sliding constraint, so that the shaft cover 232 slides relative to the rotating shaft base 231 in the Z-axis direction. The structure is simple and easy to implement. In some other embodiments, the limiting structure 230 may include a guide rail and a slider that is slidably connected to the guide rail, or may include a limiting hole and a limiting bar that slidably penetrates into the limiting hole. This is not limited herein.

The first drive mechanism 234 has a plurality of structure forms. For example, the first drive mechanism 234 is a connecting rod between the first swing arm 233 and the shaft cover 232. For another example, the first drive mechanism 234 is a sliding pair connected between the first swing arm 233 and the shaft cover 232, provided that when rotating between the unfolded location and the folded location, the first swing arm 233 can drive, by using the first drive mechanism 234, the shaft cover 232 to move upward/downward.

Figure 8:
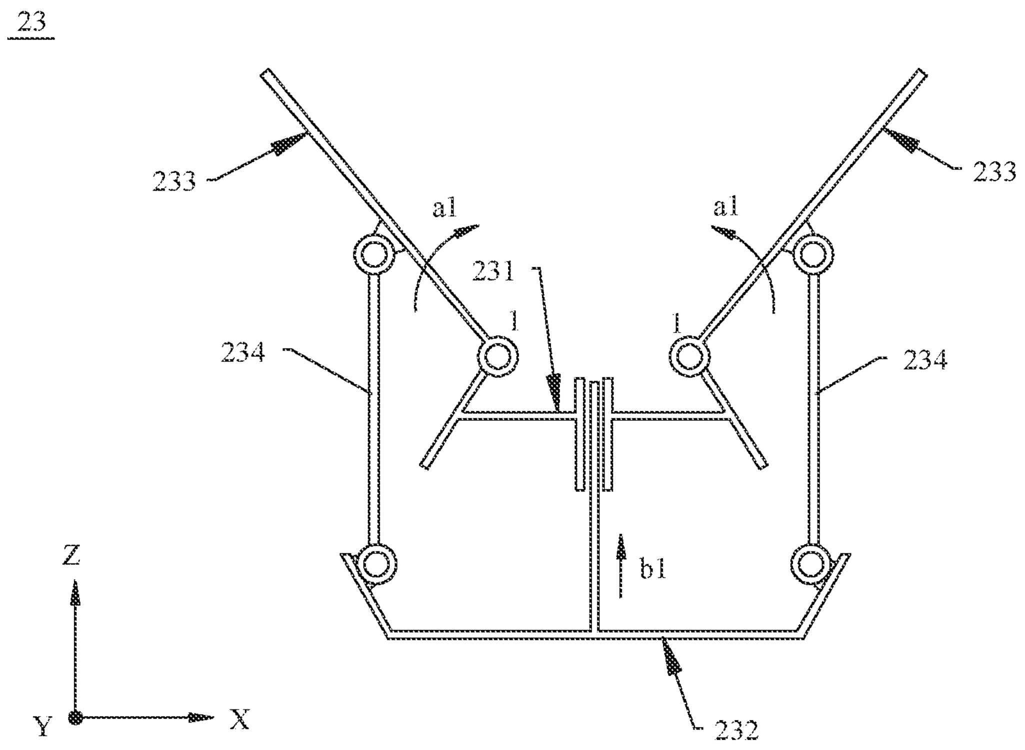
FIG. 8 is a simplified diagram of a structure of a rotating shaft mechanism according to some other embodiments of this application.

For example. FIG. 8 is a simplified diagram of a structure of a rotating shaft mechanism 23 according to some other embodiments of this application. In this embodiment, the first drive mechanism 234 is a connecting rod, one end of the connecting rod is rotatably connected to the first swing arm 233, and the other end of the connecting rod is rotatably connected to the shaft cover 232. When rotating from the unfolded location to the folded location in the direction a1, the first swing arm 233 may drive, by using the connecting rod, the shaft cover 232 to move toward the rotating shaft base 231 in the direction b1. The first drive mechanism 234 has a simple structure, low assembly difficulty, and high assembly efficiency.

Figure 9:
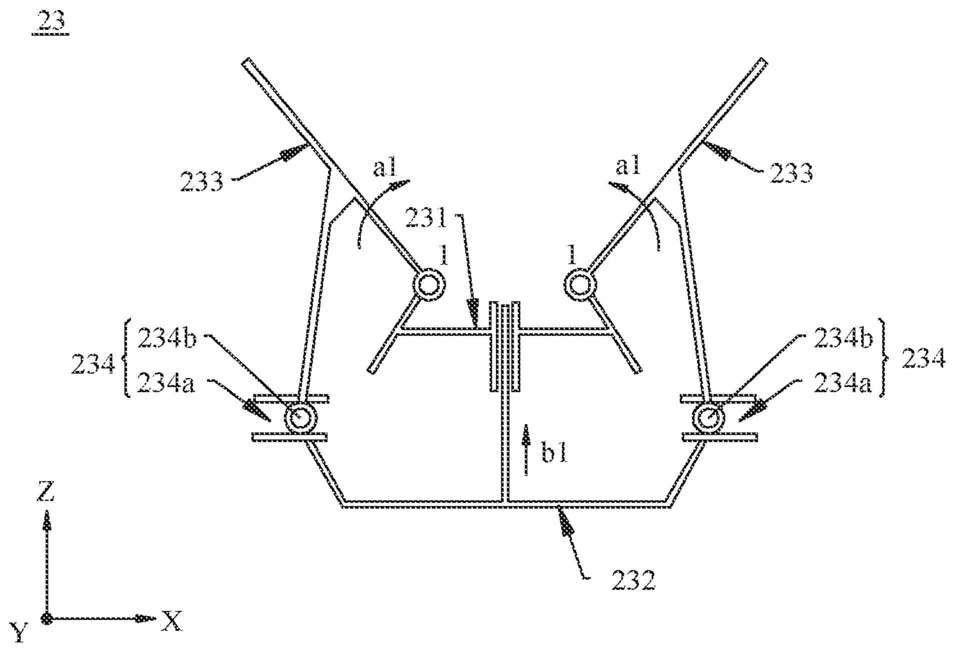
FIG. 9 is a simplified diagram of a structure of a rotating shaft mechanism according to some other embodiments of this application.

For another example, FIG. 9 is a simplified diagram of a structure of a rotating shaft mechanism 23 according to some other embodiments of this application. In this embodiment, the first drive mechanism 234 is a sliding pair. Optionally, referring to FIG. 9, the sliding pair includes a sliding groove 234*a* and a sliding member 234*b*. A structure form of the sliding member 234*b* includes but is not limited to a slider, a sliding rod, a roller, a rolling rod, a rolling shaft, or a rolling drum. The sliding member 234*b* is fastened to the first swing arm 233, and the sliding groove 234*a* is fastened to the shaft cover 232. In some other embodiments, the sliding member 234*b* may be fastened to the shaft cover 232, and the sliding groove 234*a* is fastened to the first swing arm 233. The sliding member 234*b* is slidably connected in the sliding groove 234*a*. In this way, the sliding groove 234*a* and the sliding member 234*b* form a sliding pair. When the first swing arm 233 rotates from the unfolded location to the folded location in the direction a1, the sliding member 234*b* drives the sliding groove 234*a* upward, and slides along the sliding groove 234*a*, thereby driving the shaft cover 232 to move toward the rotating shaft base 231 in the direction b1. The first drive mechanism 234 has a simple structure, low assembly difficulty, and high assembly efficiency. It should be noted that the sliding pair in this embodiment is not limited to a sliding groove and a sliding member, and may be a guide rail and a slider. This is not limited in this application.

Figure 10:
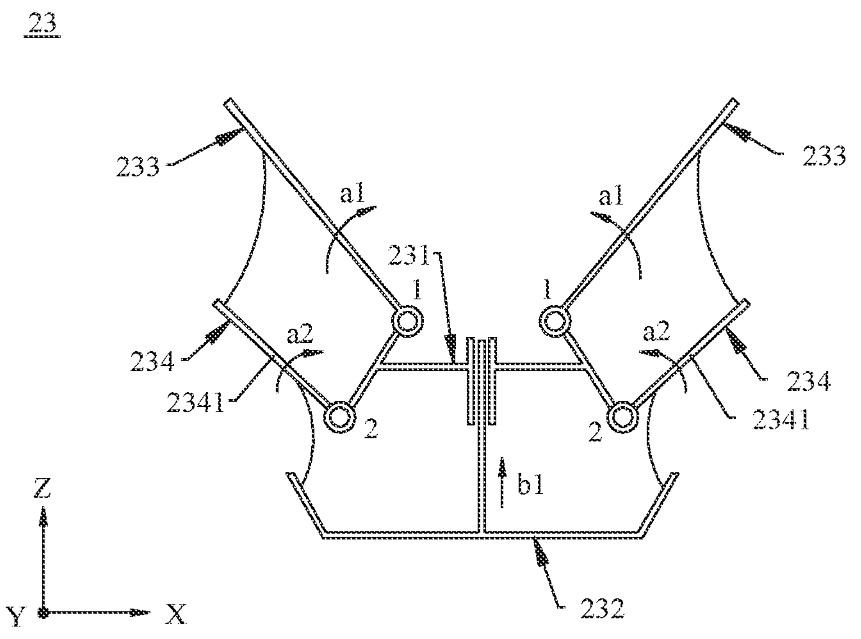
FIG. 10 is a simplified diagram of a structure of a rotating shaft mechanism according to some other embodiments of this application.

For another example, FIG. 10 is a simplified diagram of a structure of a rotating shaft mechanism 23 according to some other embodiments of this application. In this embodiment, the first drive mechanism 234 includes a second swing arm 2341. The second swing arm 2341 may also be referred to as a secondary swing arm. The second swing arm 2341 is rotatably connected to the rotating shaft base 231 by using a rotating pair 2, and the first swing arm 233 is drivably connected to the second swing arm 2341. When rotating from the unfolded location to the folded location in the direction a1, the first swing arm 233 can drive the second swing arm 2341 to rotate relative to the rotating shaft base 231. On this basis, the second swing arm 2341 is further drivably connected to the shaft cover 232. When rotating from the unfolded location to the folded location in the direction a1, the first swing arm 233 can further drive, by using the second swing arm 2341, the shaft cover 232 to move upward. In this way, revolution movement of the first swing arm 233 is transmitted to the shaft cover 232 by using the second swing arm 2341, so that the shaft cover 232 moves upward. In addition, because the second swing arm 2341 is constrained by a location of the rotating pair 2 on the rotating shaft base 231, drive stability is good.

When the foldable screen device is in the unfolded state, an overall height of the rotating shaft mechanism 23 is a key factor that affects the thickness of the foldable screen device. When the foldable screen device is in the unfolded state, the overall height of the rotating shaft mechanism 23 is affected by a thickness of the rotating shaft base 231, a thickness of the shaft cover 232, and an amount by which the shaft cover 232 moves upward in the process of moving from the unfolded state to the folded state. When the thickness of the rotating shaft base 231 and the thickness of the shaft cover 232 remain unchanged, if the amount by which the shaft cover 232 moves upward in the process of moving from the unfolded state to the folded state is smaller, a smaller overall thickness of the rotating shaft mechanism 23 may be designed, to further facilitate thinning of the foldable screen device in the unfolded state.

To meet a thinning design requirement of the foldable screen device, in some embodiments, the first swing arm 233 and the second swing arm 2341 are located on a same side of the rotating shaft base 231. In this way, a rotation direction of the second swing arm 2341 relative to the rotating shaft base 231 is the same as a rotation direction of the first swing arm 233 relative to the rotating shaft base 231. It should be noted that, if rotation directions of two parts in this embodiment of this application are the same, it indicates that the two parts that are drivably connected both rotate in a clockwise direction or in a counterclockwise direction from a same perspective. For the first swing arm 233 and the second swing arm 2341 that are drivably connected together, the rotation direction of the second swing arm 2341 is the same as the rotation direction of the first swing arm 233. Specifically, from the perspective shown in FIG. 10, a rotation direction a1 of a first swing arm 233 on the left is a clockwise direction, a second swing arm 2341 on the left is drivably connected to the first swing arm 233 on the left, a rotation direction of the second swing arm 2341 on the left is a direction a2, and the direction a2 is also a clockwise direction. A rotation direction a1 of a first swing arm 233 on the right is a counterclockwise direction, a second swing arm 2341 on the right is drivably connected to the first swing arm 233 on the right, and a rotation direction a2 of the second swing arm 2341 on the right is also a counterclockwise direction. Therefore, rotation directions in the direction a2 and the direction a1 are the same. On this basis, when the first swing arm 233 rotates from the unfolded location to the folded location, an angle by which the first swing arm 233 drives the second swing arm 2341 to rotate relative to the rotating shaft base 231 is less than a rotation angle of the first swing arm 233 relative to the rotating shaft base 231. In some embodiments, when the first swing arm 233 rotates from the unfolded location to the folded location, the rotation angle of the first swing arm 233 relative to the rotating shaft base 231 may be 90°. On this basis, the rotation angle of the second swing arm 2341 relative to the rotating shaft base 231 may be 75°, 80°, 85°, or the like. This is not limited in this application. It should be noted that, when the first swing arm 233 rotates from the unfolded location to the folded location, the rotation angle of the first swing arm 233 relative to the rotating shaft base 231 may be designed as another angle based on a form. This is not specifically limited herein. In this way, a drive angle is reduced by using the second swing arm 2341. Compared with a solution in which the first swing arm 233 is used to directly drive the shaft cover 232 to move upward, a height by which the second swing arm 2341 with a small rotation angle is used to drive the shaft cover 232 to move upward is small. This helps reduce an overall height of the rotating shaft mechanism 23 in the unfolded state, thereby facilitating thinning of the foldable screen device 100 in the unfolded state.

In some embodiments, the first swing arm 233 may be drivably connected to the second swing arm 2341 by using a connecting rod, or may be drivably connected to the second swing arm 2341 by using a sliding pair. This is not limited herein.

Figure 11:
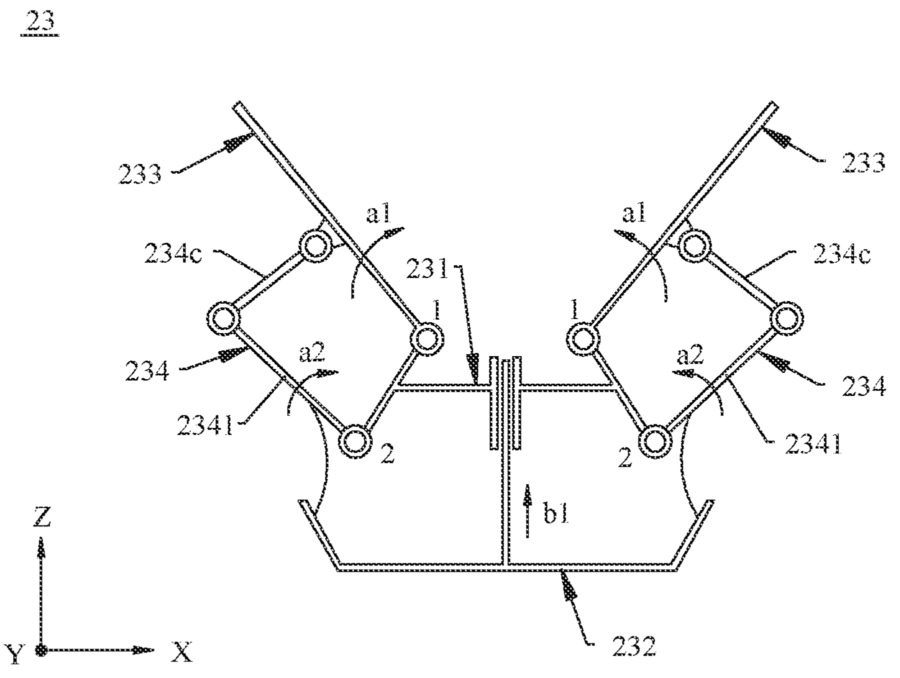
FIG. 11 is a simplified diagram of a structure of a rotating shaft mechanism according to some other embodiments of this application.

For example, FIG. 11 is a simplified diagram of a structure of a rotating shaft mechanism 23 according to some other embodiments of this application. In this embodiment, the first drive mechanism 234 includes a first connecting rod 234*c*, and the first swing arm 233 is drivably connected to the second swing arm 2341 by using the first connecting rod 234*c*. Specifically, one end of the first connecting rod 234*c* is rotatably connected to the first swing arm 233, and the other end of the first connecting rod 234*c* is rotatably connected to the second swing arm 2341. When rotating from the unfolded location to the folded location in the direction a1, the first swing arm 233 may drive, by using the first connecting rod 234*c*, the second swing arm 2341 to rotate relative to the rotating shaft base 231 in the direction a2. A revolution axis of the first swing arm 233 on the rotating shaft base 231 is not collinear with a revolution axis of the second swing arm 2341 on the rotating shaft base 231. The rotating shaft base 231, the first swing arm 233, the first connecting rod 234*c*, and the second swing arm 2341 form a hinged four-bar linkage mechanism. The hinged four-bar linkage mechanism has a degree of freedom of 1, a unique movement manner, and good stability. In addition, each bar length of the hinged four-bar linkage mechanism is properly designed. Therefore, when the rotating shaft mechanism 23 moves from the unfolded state to the folded state, the rotation angle of the second swing arm 2341 relative to the rotating shaft base 231 is less than the rotation angle of the first swing arm 233 relative to the rotating shaft base 231. The structure is simple and easy to implement.

Figure 12:
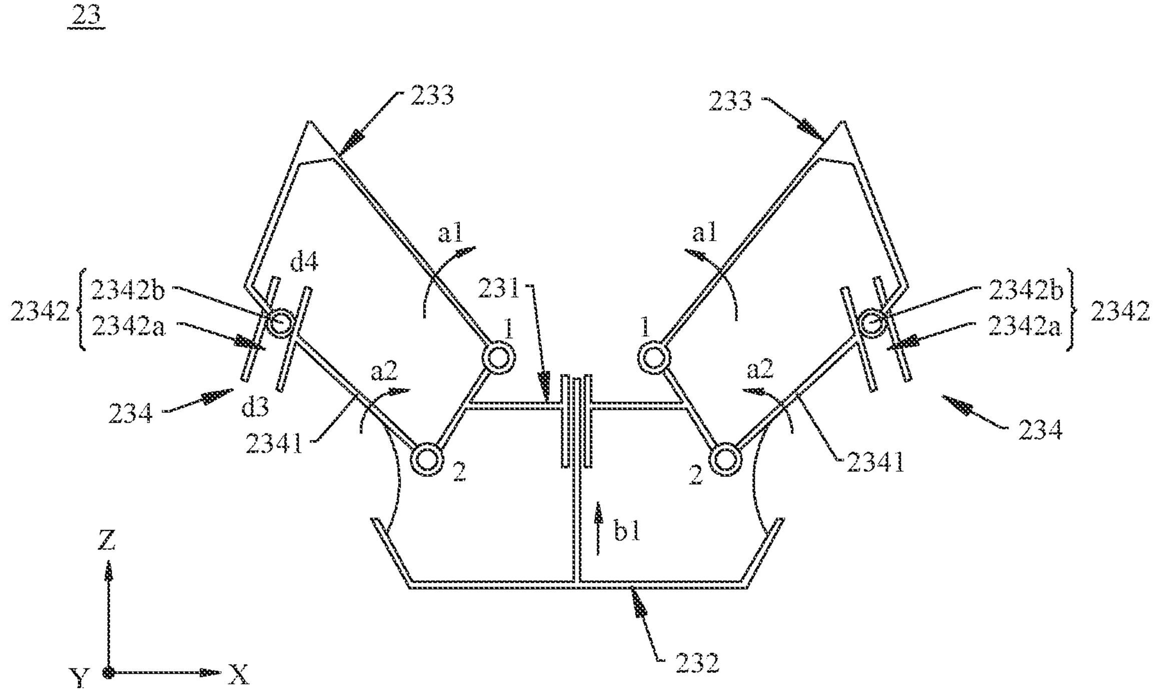
FIG. 12 is a simplified diagram of a structure of a rotating shaft mechanism according to some other embodiments of this application.

For another example, FIG. 12 is a simplified diagram of a structure of a rotating shaft mechanism 23 according to some other embodiments of this application. In this embodiment, the first drive mechanism 234 includes a sliding pair 2342, and the first swing arm 233 is drivably connected to the second swing arm 2341 by using the sliding pair 2342. In some embodiments, still referring to FIG. 12, the sliding pair 2342 includes a first sliding groove 2342*a* and a first sliding member 2342*b*. The first sliding groove 2342*a* is disposed on the second swing arm 2341. A structure form of the first sliding member 2342*b* includes but is not limited to a slider, a sliding rod, a roller, a rolling rod, a rolling shaft, or a rolling drum. The first sliding member 2342*b* is disposed on the first swing arm 233. In some other embodiments, the first sliding groove 2342*a* may be disposed on the first swing arm 233, and the first sliding member 2342*b* is disposed on the second swing arm 2341. The first sliding member 2342*b* is slidably connected in the first sliding groove 2342*a*. In this way, the first swing arm 233 is drivably connected to the second swing arm 2341 by using a sliding pair formed by the first sliding groove 2342*a* and the first sliding member 2342*b*. When rotating from the unfolded location to the folded location in the direction a1, the first swing arm 233 may drive the first sliding member 2342*b* upward by using the first sliding groove 2342*a*, so that the second swing arm 2341 rotates relative to the rotating shaft base 231 in the direction a2, and the first sliding member 2342*b* slides in the first sliding groove 2342*a*. A revolution axis of the first swing arm 233 on the rotating shaft base 231 is not collinear with a revolution axis of the second swing arm 2341 on the rotating shaft base 231. The rotating shaft base 231, the first swing arm 233, the sliding pair 2342, and the second swing arm 2341 form a slider-crank linkage mechanism. The slider-crank linkage mechanism has a degree of freedom of 1, a unique movement manner, and good stability. In addition, the structure is simple, and occupies small space and a small height, to facilitate miniaturization and thinning of the rotating shaft mechanism 23.

It can be understood that the sliding pair 2342 in the foregoing embodiment does not merely include a sliding groove and a sliding member, and may include a guide rail and a slider. This is not specifically limited in this application.

It should be noted that the following embodiments are described on the basis that the first swing arm 233 is drivably connected to the second swing arm 2341 by using the sliding pair 2342. This should not be construed as a special limitation on this application.

In some embodiments, referring to FIG. 12, rotation axes of the second swing arm 2341 and the rotating shaft base 231 are a first axis (namely, an axis of the rotating pair 2). The first sliding groove 2342*a* has a first end d3 and a second end d4, and a distance from the first end d3 to the first axis is less than a distance from the second end d4 to the first axis. When the first swing arm 233 is at the unfolded location, a vertical distance from the first end d3 to the foldable screen is greater than a vertical distance from the second end d4 to the foldable screen. In other words, the first sliding groove 2342*a* tilts toward the foldable screen from the first end d3 to the second end d4. In addition, when the first swing arm 233 rotates from the unfolded location to the folded location, the first sliding member 2342*b* slides from the first end d3 to the second end d4 along the first sliding groove 2342*a*. In this way, w % ben the rotating shaft mechanism 23 moves from the unfolded state to the folded state, the rotation angle of the second swing arm 2341 relative to the rotating shaft base 231 is less than the rotation angle of the first swing arm 233 relative to the rotating shaft base 231.

Figure 13:
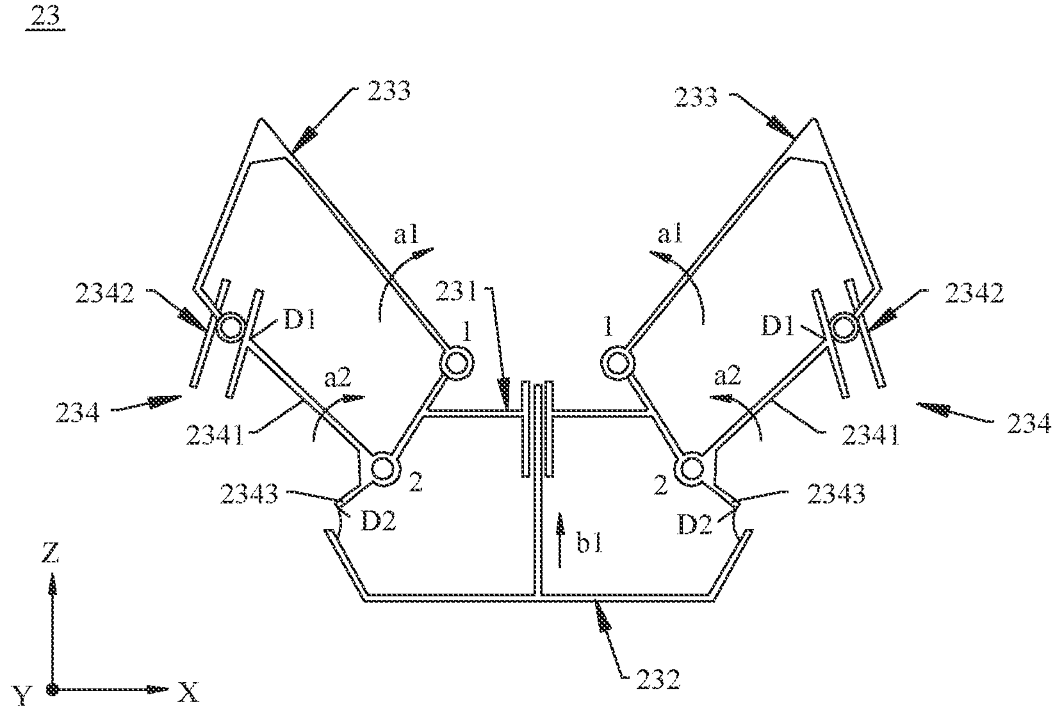
FIG. 13 is a simplified diagram of a structure of a rotating shaft mechanism according to some other embodiments of this application.

In some embodiments, FIG. 13 is a simplified diagram of a structure of a rotating shaft mechanism 23 according to some other embodiments of this application. In this embodiment, the first drive mechanism 234 further includes an actuating member (also referred to as a crank actuating member) 2343. The actuating member 2343 is fastened relative to the second swing arm 2341. Specifically, the actuating member 2343 and the second swing arm 2341 may be two independent structural members that are fastened together through welding, clamping, threaded connection, bonding, or the like. Alternatively, the actuating member 2343 and the second swing arm 2341 may be an integral structural member, that is, the actuating member 2343 and the second swing arm 2341 are integrally formed. This is not specifically limited in this application. The second swing arm 2341 is drivably connected to the shaft cover 232 by using the actuating member 2343. In this way, when driving the second swing arm 2341 to rotate relative to the rotating shaft base 231, the first swing arm 233 further drives the actuating member 2343 to rotate relative to the rotating shaft base 231, to further drive, by using the actuating member 2343, the shaft cover 232 to move upward. In this embodiment, in a whole formed by the second swing arm 2341 and the actuating member 2343, an end part drivably connected to the first swing arm 233 is laid out on the second swing arm 2341, and an end part drivably connected to the shaft cover 232 is laid out on the actuating member 2343. This avoids a case in which the end part drivably connected to the first swing arm 233 and the end part drivably connected to the shaft cover 232 are laid out on the second swing arm 2341 together, and can reduce structure complexity of the second swing arm 2341.

Based on the foregoing embodiment, to further meet the thinning design requirement of the foldable screen device, in some embodiments, still referring to FIG. 13, a distance from an end part D1, that is on the second swing arm 2341 and that is drivably connected to the first swing arm 233, to a rotation center (namely, a center of the rotating pair 2) of the second swing arm 2341 is a first distance, an end part D2 that is on the actuating member 2343 and that is drivably connected to the shaft cover 232 is eccentrically disposed relative to the rotation center of the second swing arm 2341, and a distance from the end part D2, that is on the actuating member 2343 and that is drivably connected to the shaft cover 232, to the rotation center of the second swing arm 2341 is a second distance. The first distance is less than the second distance. In this way, when a rotation angle of the actuating member 2343 is the same as a rotation angle of the second swing arm 2341, a length of a swing arm is reduced by using the actuating member 2343, so that a height by which the actuating member 2343 can be used to drive the shaft cover 232 to move upward is reduced. This helps reduce an overall height of the rotating shaft mechanism 23 when the shaft cover 232 is in the unfolded state, thereby facilitating thinning of the foldable screen device 100 in the unfolded state.

In some embodiments, the actuating member 2343 may be drivably connected to the shaft cover 232 by using a connecting rod, or may be drivably connected to the shaft cover 232 by using a sliding pair. This is not limited herein.

Figure 14:
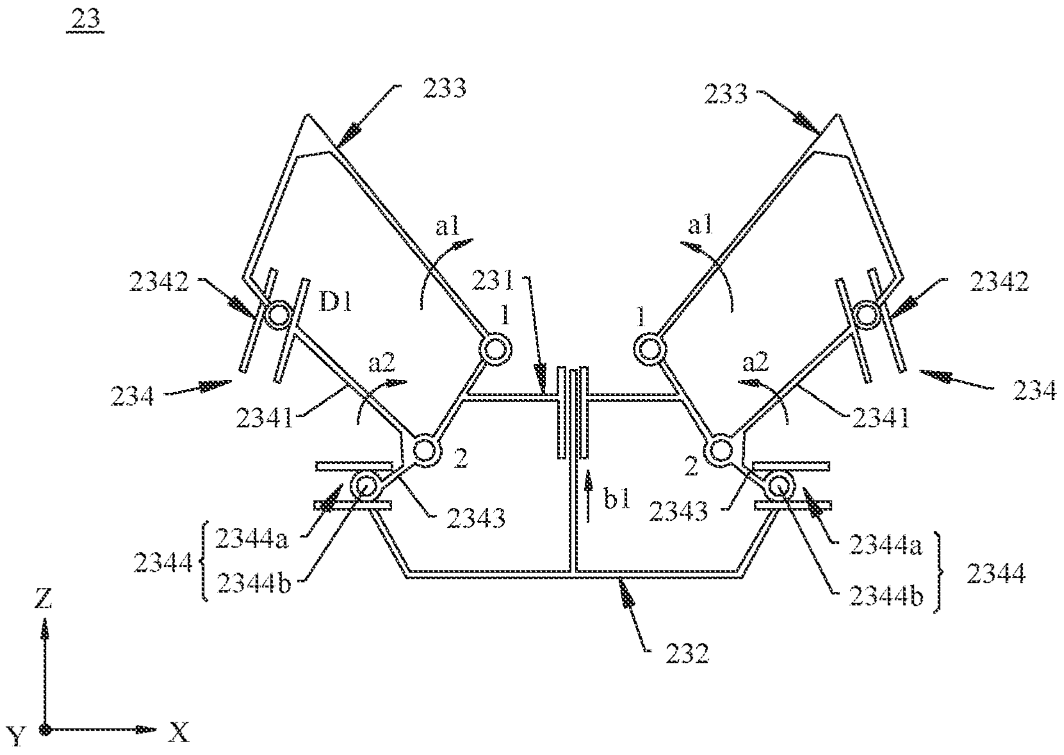
FIG. 14 is a simplified diagram of a structure of a rotating shaft mechanism according to some other embodiments of this application.

For example, FIG. 14 is a simplified diagram of a structure of a rotating shaft mechanism 23 according to some other embodiments of this application. In this embodiment, the first drive mechanism 234 further includes a sliding pair 2344, and the actuating member 2343 is drivably connected to the shaft cover 232 by using the sliding pair 2344. In some embodiments, still referring to FIG. 14, the sliding pair 2344 includes a second sliding groove 2344*a* and a second sliding member 2344*b*. The second sliding groove 2344*a* is disposed on the shaft cover 232. A structure form of the second sliding member 2344*b* includes but is not limited to a slider, a sliding rod, a roller, a rolling rod, a rolling shaft, or a rolling drum. In this way, the second sliding member 2344*b* is an eccentric block, an eccentric rod, an eccentric wheel, an eccentric shaft, or an eccentric circle relative to the rotation center of the second swing arm 2341. The second sliding member 2344*b* is disposed on the actuating member 2343. In some other embodiments, the second sliding groove 2344*a* may be disposed on the actuating member 2343, and the second sliding member 2344*b* is disposed on the shaft cover 232. The second sliding member 2344*b* is slidably connected in the second sliding groove 2344*a*. In this way, the actuating member 2343 is drivably connected to the shaft cover 232 by using a sliding pair formed by the second sliding groove 2344*a* and the second sliding member 2344*b*. When rotating with the second swing arm 2341, the actuating member 2343 may drive the second sliding groove 2344*a* upward by using the second sliding member 2344*b*, so that the shaft cover 232 moves upward in the direction b1. The structure is simple, and occupies small space and a small height, to facilitate miniaturization and thinning of the rotating shaft mechanism 23.

It can be understood that the sliding pair 2344 in the foregoing embodiment does not merely include a sliding groove and a sliding member, and may include a guide rail and a slider. This is not specifically limited in this application.

It can be learned from the foregoing descriptions that the first drive mechanism 234 has a plurality of structure forms. The following embodiments are further described based on the first drive mechanism 234 shown in FIG. 14. This should not be construed as a special limitation on this application.

Figure 15:
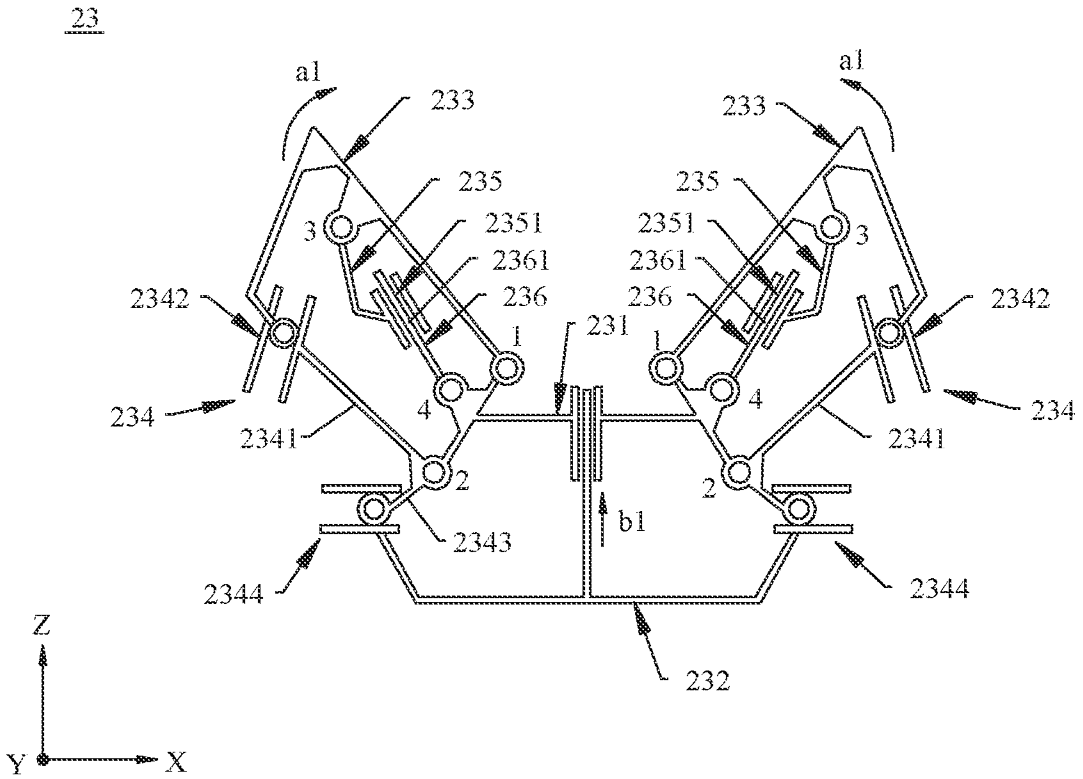
FIG. 15 is a simplified diagram of a structure of a rotating shaft mechanism according to some other embodiments of this application.

In some embodiments, FIG. 15 is a simplified diagram of a structure of a rotating shaft mechanism 23 according to some other embodiments of this application. A difference between the rotating shaft mechanism 23 in this embodiment and the rotating shaft mechanism 23 shown in FIG. 14 is as follows: In this embodiment, the rotating shaft mechanism 23 further includes a door plate 235 and a second drive mechanism 236.

In the foldable screen device, the door plate 235 is located between the middle frame (including the primary middle frame and the secondary middle frame) and the rotating shaft base 231. The door plate 235 is configured to support a part of the foldable screen 10. Specifically, the door plate 235 is configured to support the display areas 131 and 132 on both sides of the third display area 13 of the foldable screen 10 in the foldable screen device shown in FIG. 3. When the foldable screen terminal is in the unfolded state, a surface that is of the middle frame and that is used to dispose the foldable screen 10, a surface that is of the door plate 235 and that is used to dispose the foldable screen 10, and a surface that is of the rotating shaft base 231 and that is used to dispose the foldable screen 10 are approximately coplanar.

Figure 16:
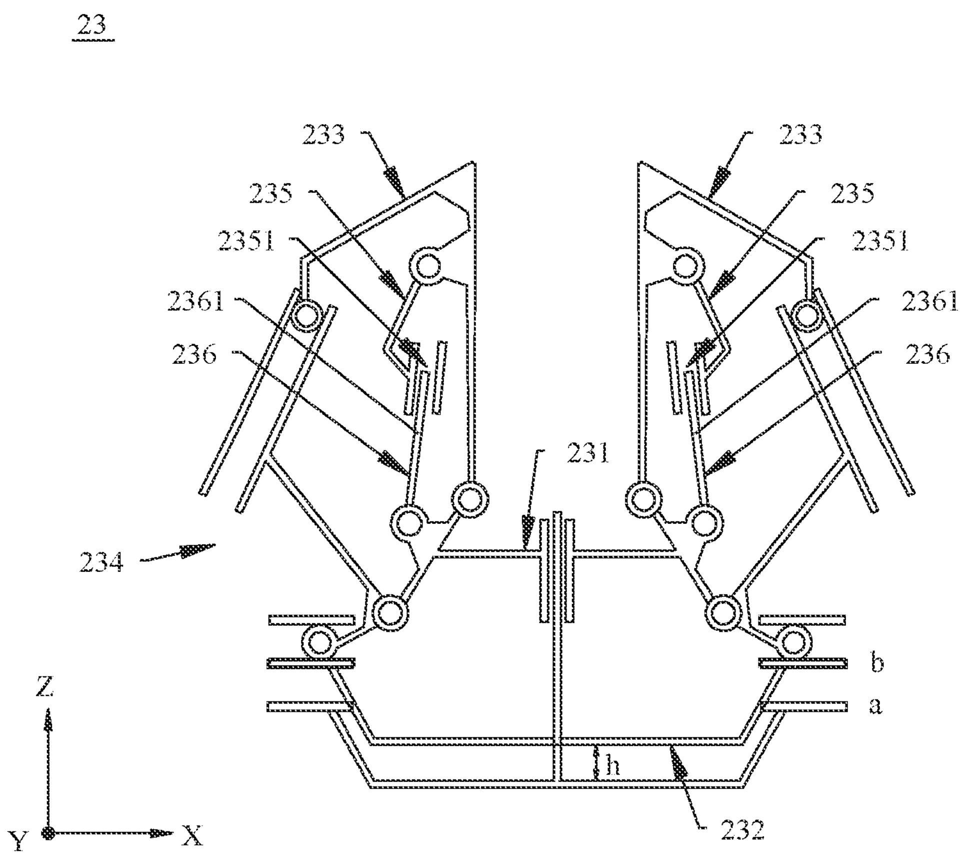
FIG. 16 is a simplified diagram of a structure of the rotating shaft mechanism shown in FIG. 15 in a folded state.

The door plate 235 is rotatably connected to the first swing arm 233 by using a rotating pair 3. The second drive mechanism 236 is connected between the door plate 235 and the rotating shaft base 231. When rotating from the unfolded location to the folded location in the direction a1, the first swing arm 233 drives, by using the second drive mechanism 236, an end that is of the door plate 235 and that is close to the rotating shaft base 231 to tilt toward a side away from the foldable screen relative to an end that is of the door plate 235 and that is away from the rotating shaft base 231. In this way, when the first swing arm 233 rotates to the folded location, FIG. 16 is a simplified diagram of a structure of the rotating shaft mechanism 23 shown in FIG. 15 in a folded state, the shaft cover 232 moves upward by a height h, an included angle between the surface that is of the door plate 233 and that is used to dispose the foldable screen 10 and the surface that is of the rotating shaft base 231 and that is used to dispose the foldable screen 10 is a first angle, and an included angle between the surface that is of the middle frame and that is used to dispose the foldable screen 10 and the surface that is of the rotating shaft base 231 and that is used to dispose the foldable screen 10 is a second angle. The first angle is less than the second angle. In other words, when the first swing arm 233 rotates from the unfolded location to the folded location, a rotation angle of the door plate 233 relative to the rotating shaft base 231 is greater than a rotation angle of the middle frame relative to the rotating shaft base 231. Because the middle frame is fastened to the first swing arm 233, the rotation angle of the middle frame relative to the rotating shaft base 231 is equal to the rotation angle of the first swing arm 233 relative to the rotating shaft base 231. In other words, the rotation angle of the door plate 233 relative to the rotating shaft base 231 is greater than the rotation angle of the first swing arm 233 relative to the rotating shaft base 231. When the rotation angle of the first swing arm 233 is 90°, the rotation angle of the door plate 233 may be 100°, 105°, 102°, 110°, or the like. This is not specifically limited herein. In this way, a third display area of the foldable screen may be folded into a water drop shape, to reduce an inward folding angle, reduce a probability that a crease occurs on the foldable screen, ensure a display effect of the foldable screen, and prolong a life span of the foldable screen.

The second drive mechanism 236 has a plurality of structure forms.

For example, the second drive mechanism 236 is a connecting rod connected between the door plate 235 and the rotating shaft base 231.

For another example, still referring to FIG. 15, the second drive mechanism 236 includes a door plate swing arm 2361. The door plate swing arm 2361 is rotatably connected to the rotating shaft base 231 by using a rotating pair 4, and a revolution axis of the rotating pair 4 is not collinear with a revolution axis of the rotating pair 1. A third sliding groove 2351 is disposed on the door plate 235, and the door plate swing arm 2361 slidably penetrates into the third sliding groove 2351. When rotating from the unfolded location to the folded location in the direction a1, the first swing arm 233 drives the door plate swing arm 2361 to rotate relative to the rotating shaft base 231, and enables the door plate swing arm 2361 to slide in the third sliding groove 2351. A rotation direction of the door plate swing arm 2361 is the same as a rotation direction of the first swing arm 233. On this basis, when the first swing arm 233 rotates from the unfolded location to the folded location, an angle by which the first swing arm 233 drives the door plate swing arm 2361 to rotate relative to the rotating shaft base 231 is greater than the rotation angle of the first swing arm 233 relative to the rotating shaft base 231. That is, when the first swing arm 233 rotates from the unfolded location to the folded location, the angle by which the first swing arm 233 drives the door plate 235 to rotate relative to the rotating shaft base 231 is greater than the rotation angle of the first swing arm 233 relative to the rotating shaft base 231. In this way, the third display area of the foldable screen may be folded into a water drop shape. The structure is simple, and occupies a small volume and a small height, so that a volume and a height of the rotating shaft mechanism can be reduced.

In the foregoing embodiments, a plurality of embodiments of this application are described by using a simplified diagram of a structure. The following describes a specific structure of the rotating shaft mechanism 23 in detail with reference to a three-dimensional view.

Figure 17:
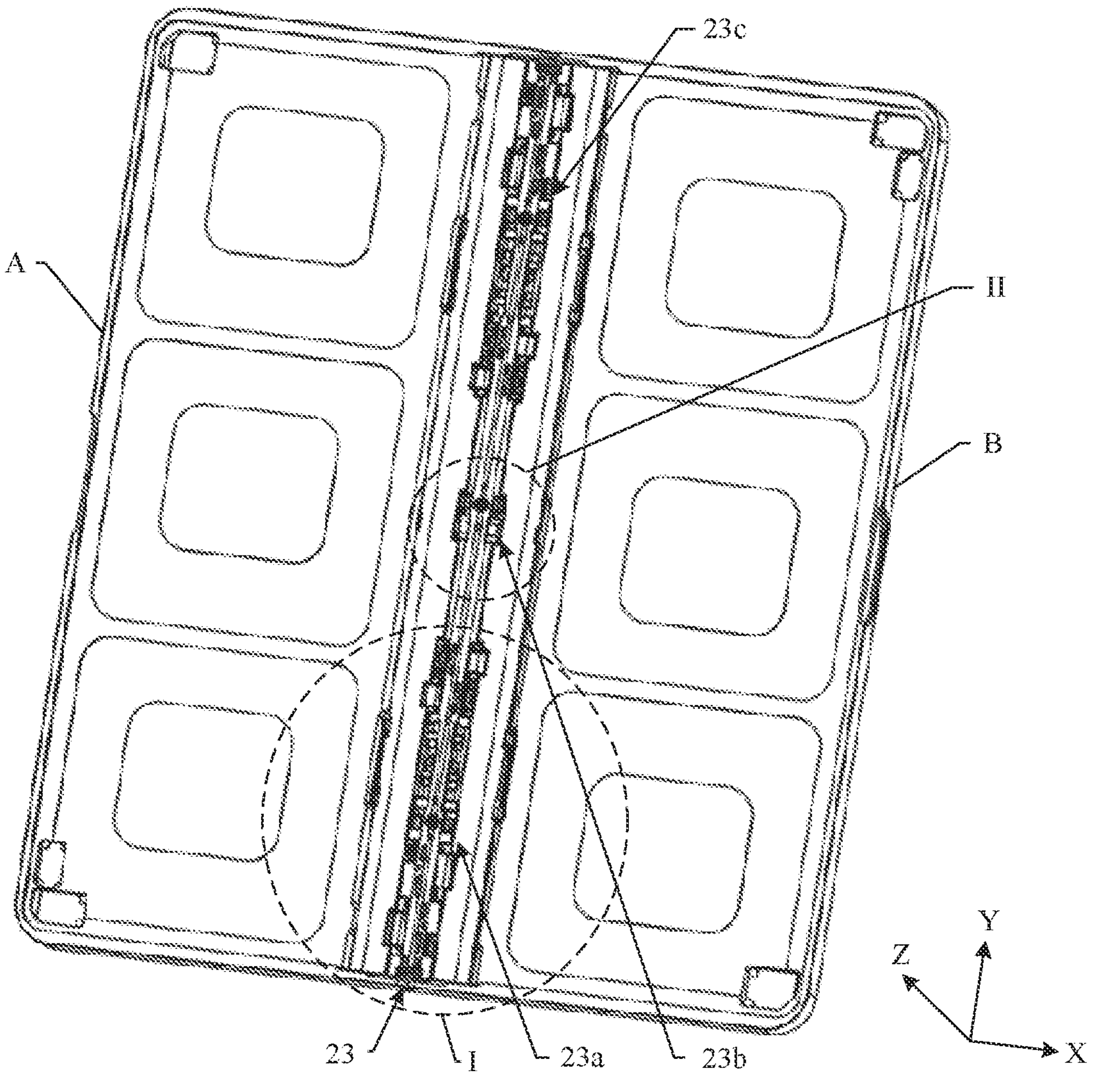
FIG. 17 is a three-dimensional view of a rotating shaft mechanism according to some embodiments of this application.

FIG. 17 is a three-dimensional view of a rotating shaft mechanism 23 according to some embodiments of this application. In this embodiment, the rotating shaft mechanism 23 is in an unfolded state. The rotating shaft mechanism 23 includes a first rotating shaft part **23*a*, a second rotating shaft part 23*b*, and a third rotating shaft part 23*c*. The first rotating shaft part 23*a*, the second rotating shaft part 23*b*, and the third rotating shaft part 23*c* are successively disposed in a length direction (namely, a Y-axis direction) of the rotating shaft mechanism 23. The following first describes a specific structure of the first rotating shaft part 23*a***.

Figure 18:
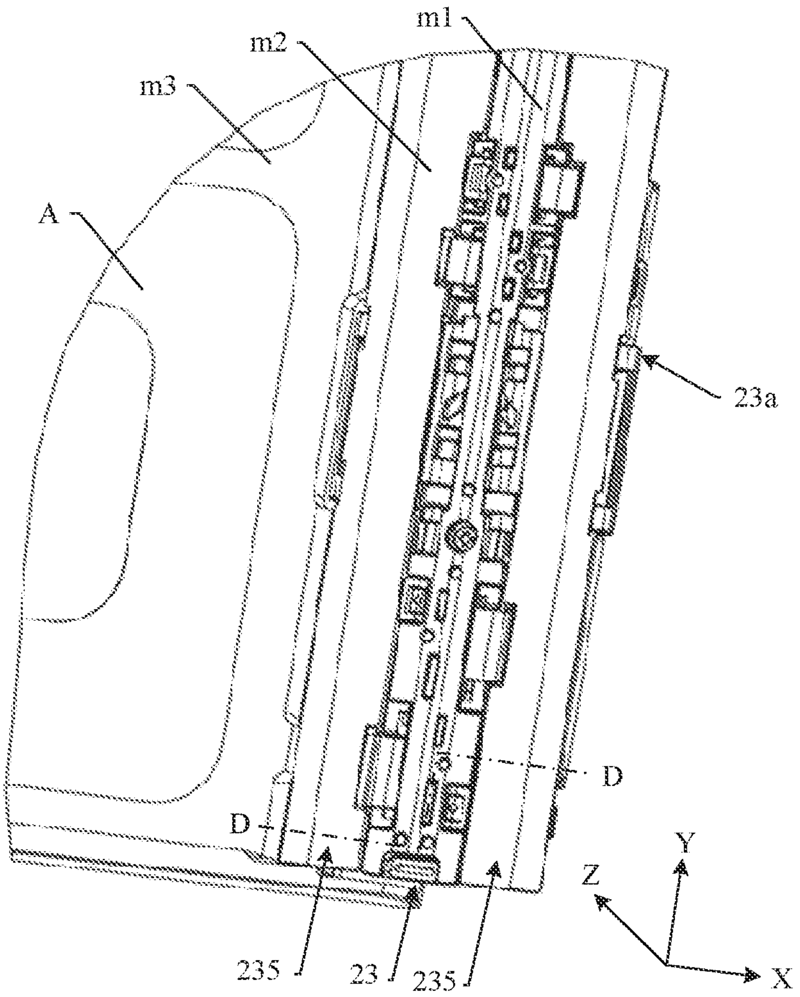
FIG. 18 is an enlarged view of an area I of the rotating shaft mechanism shown in FIG. 17.
Figure 19:
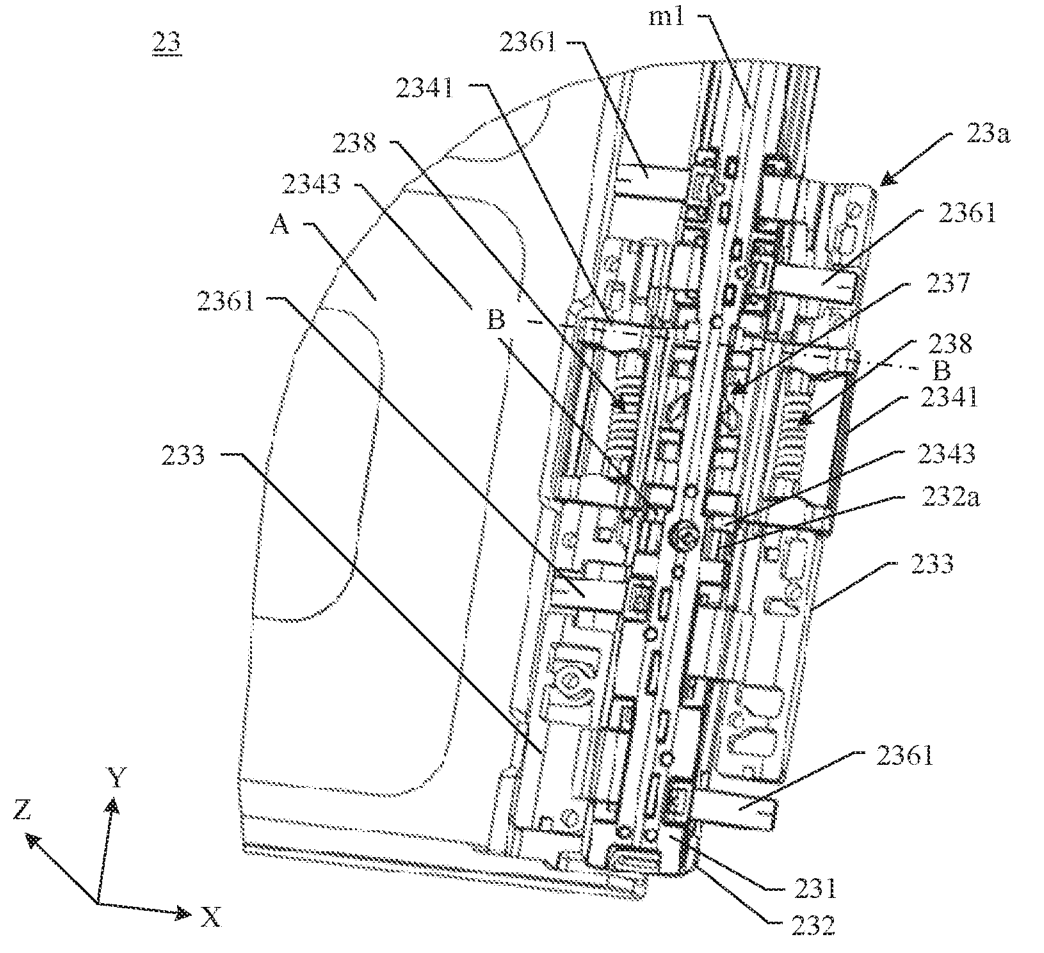
FIG. 19 is a schematic diagram of a structure of the rotating shaft mechanism shown in FIG. 18 after two door plates are hidden.

FIG. 18 is an enlarged view of an area I of the rotating shaft mechanism 23 shown in FIG. 17. A secondary middle frame B is hidden in FIG. 18. FIG. 19 is a schematic diagram of a structure of the rotating shaft mechanism 23 shown in FIG. 18 after two door plates 235 are hidden. The rotating shaft mechanism 23 includes a rotating shaft base 231, a shaft cover 232, a first swing arm 233, a second swing arm 2341, an actuating member 2343, a lift slider **232*a*, a door plate 235, a door plate swing arm 2361, a synchronization mechanism 237, and a damping mechanism 238. The rotating shaft base 231, the shaft cover 232, the first swing arm 233, the second swing arm 2341, the actuating member 2343, and the lift slider 232*a* form a shaft cover lift system. The door plate 235 and the door plate swing arm 2361** form a door plate moving system.

First, the shaft cover lift system is described.

Specifically, the rotating shaft base 231 provides a location reference. Referring to FIG. 18, the rotating shaft base 231 has a support surface m1. The support surface m1 is configured to support a part of a foldable screen. Specifically, the support surface m1 is configured to support the arc segment 133 of the third display area 13 in the foldable screen 10 in the foldable screen device shown in FIG. 3.

Figure 20:
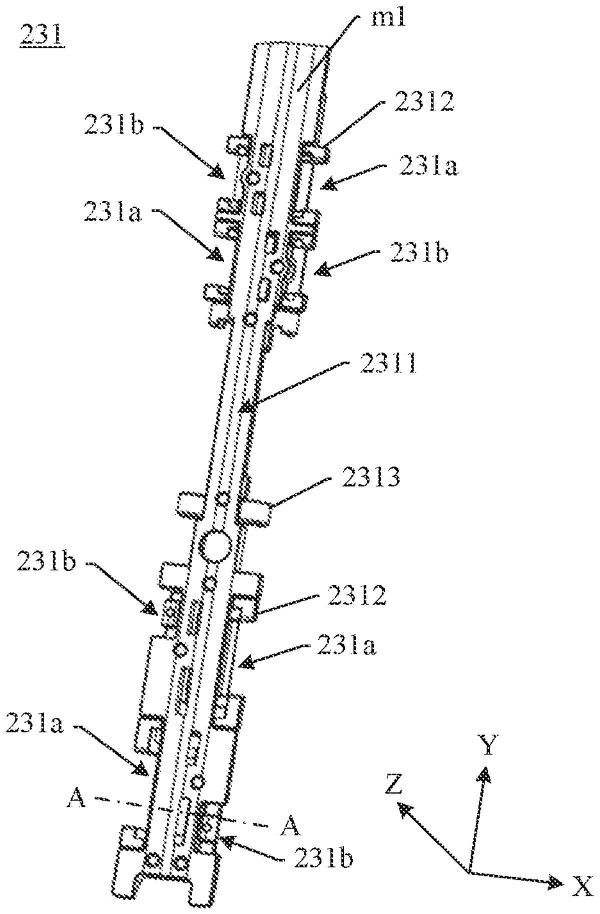
FIG. 20 is a three-dimensional view of a rotating shaft base in the rotating shaft mechanism shown in FIG. 18 and FIG. 19.
Figure 21:
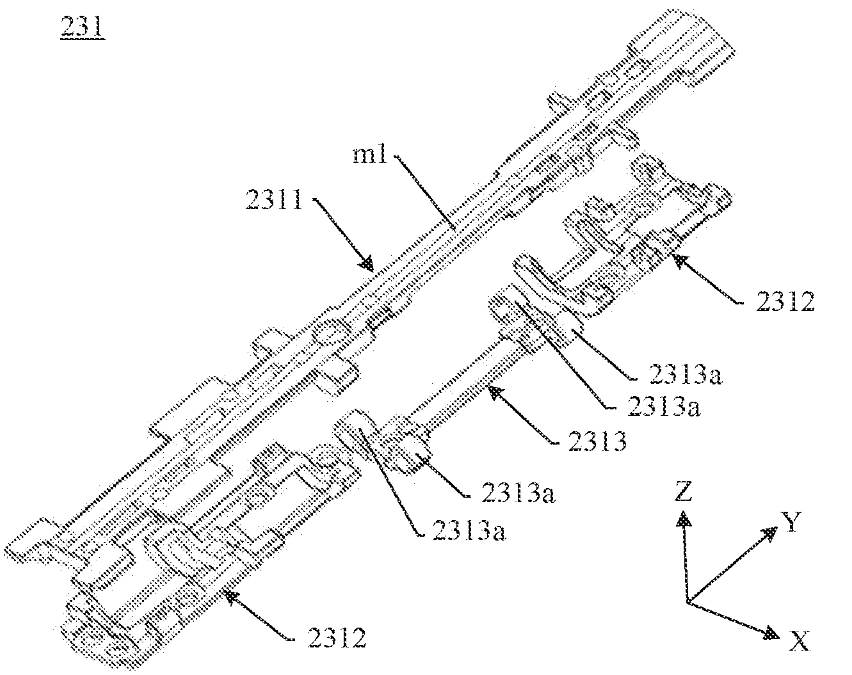
FIG. 21 is an exploded view of the rotating shaft base shown in FIG. 20.

The rotating shaft base 231 may be an integral structural member, or may be formed by assembling a plurality of parts. In some embodiments, FIG. 20 is a three-dimensional view of a rotating shaft base 231 in the rotating shaft mechanism 23 shown in FIG. 18 and FIG. 19. FIG. 21 is an exploded view of the rotating shaft base 231 shown in FIG. 20. In this embodiment, the rotating shaft base 231 includes a base body 2311 and a first connecting piece 2312. The support surface m1 is disposed on the base body 2311. In some embodiments, there are two first connecting pieces 2312, the two first connecting pieces 2312 are located on a back side of the base body 2311, the two first connecting pieces 2312 are disposed at intervals in a length direction of the rotating shaft base 231, and both the two first connecting pieces 2312 are fastened to the base body 2311. Specifically, the two first connecting pieces 2312 may be fastened to the base body 2311 by using a screw lock. In some other embodiments, the two first connecting pieces 2312 may be fastened to the base body 2311 through clamping, welding, or the like. In some other embodiments, there may be one, three, or more first connecting pieces 2312. This is not specifically limited in this embodiment. The two first connecting pieces 2312 and the base body 2311 surround a first connecting part 231*a*, and the first connecting part 231*a* is configured to be rotatably connected to the first swing arm 233. In some embodiments, in the two first connecting pieces 2312, each first connecting piece 2312 and the base body 2311 surround two first connecting parts 231*a* on the left and right, and the two first connecting pieces 2312 and the base body 2311 surround four first connecting parts 231*a* in total. In the four first connecting parts 231*a*, two first connecting parts 231*a* are located on the left, and are configured to be rotatably connected to a first swing arm 233 on the left, and the other two first connecting parts 231*a* are located on the right, and configured to be rotatably connected to a first swing arm 233 on the right.

Figure 22:
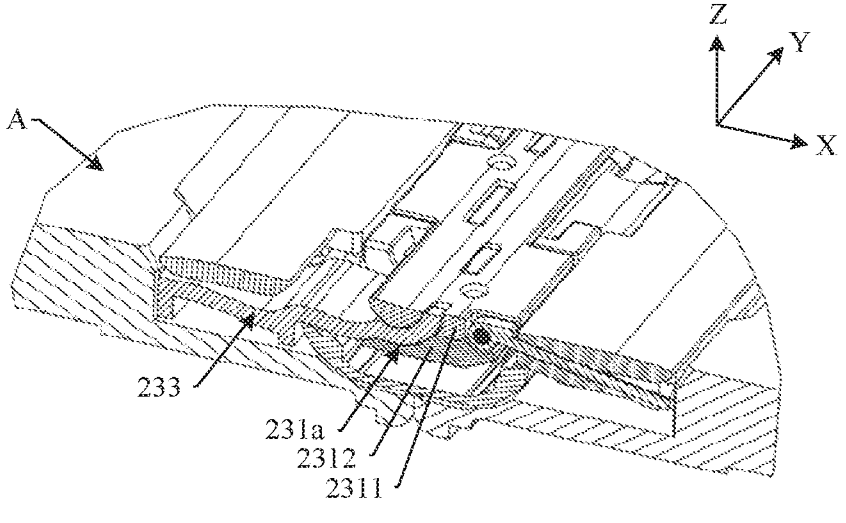
FIG. 22 is an assembly diagram of a first swing arm and a cross section of the rotating shaft base shown in FIG. 20 at a line A-A.
Figure 23:
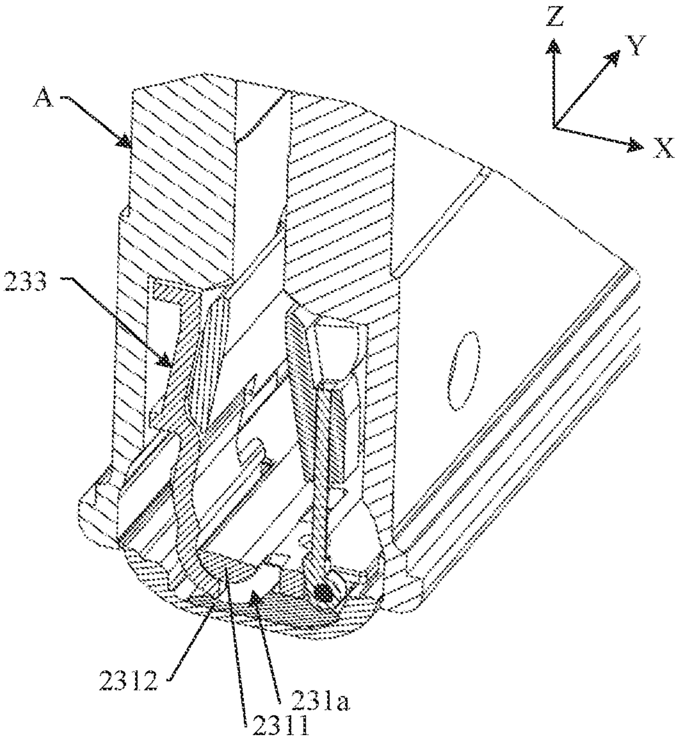
FIG. 23 is a schematic diagram of a structure of the rotating shaft mechanism shown in FIG. 22 in a folded state.

In some embodiments, FIG. 22 is an assembly diagram of a first swing arm 233 and a cross section of the rotating shaft base 231 shown in FIG. 20 at a line A-A The first connecting part 231*a* is an arc-shaped sliding groove, and a center line of the arc-shaped sliding groove extends in the length direction (namely, the Y-axis direction) of the rotating shaft base 231. The first swing arm 233 is configured to be fixedly connected to a primary middle frame A, and the first swing arm 233 is rotatably connected to the arc-shaped sliding groove. Specifically, the first swing arm 233 has an arc-shaped sliding sheet, and the arc-shaped sliding sheet is accommodated in the arc-shaped sliding groove through fitting, to implement a rotatable connection. FIG. 22 is a schematic diagram of a structure of a rotating shaft mechanism 23 in an unfolded state. FIG. 23 is a schematic diagram of a structure of the rotating shaft mechanism 23 shown in FIG. 22 in a folded state. In this way, the first connecting piece 2312 and the base body 2311 may limit a rotating shaft part (namely, the arc-shaped sliding sheet) of the first swing arm 233 from two opposite sides of the rotating shaft part, and then the first connecting piece 2312 and the base body 2311 are fastened together. Therefore, the rotating shaft base 231 and the first swing arm 233 are assembled. The assembly operation is simple and highly efficient.

In some embodiments, referring back to FIG. 20, the first connecting parts 231*a* that are respectively connected to the first swing arms 233 on both sides are disposed at intervals in the length direction (namely, the Y-axis direction) of the rotating shaft base 231. In this way, the connecting parts between the two first swing arms 233 and the rotating shaft base 231 are staggered in the Y-axis direction, so that a width of the rotating shaft base 231 in an X-axis direction can be reduced, thereby reducing a thickness of the foldable screen device in the folded state.

In some embodiments, still referring to FIG. 20 and FIG. 21, the rotating shaft base 231 further includes a second connecting piece 2313. The second connecting piece 2313 is located on the back side of the base body 2311, the second connecting piece 2313 is located between the two first connecting pieces 2312, and the second connecting piece 2313 is fastened to the base body 2311. In some embodiments, the second connecting piece 2313 and the base body 2311 are fastened by using a screw lock. In some other embodiments, the second connecting piece 2313 and the base body 2311 may be fastened through clamping, welding, or the like. In some embodiments, the two first connecting pieces 2312 and the second connecting piece 2313 are successively arranged in the length direction (namely, the Y-axis direction) of the rotating shaft base 231. In this way, a thickness of the rotating shaft base 231 in a Z-axis direction can be reduced. The second connecting piece 2313 is configured to be rotatably connected to the second swing arm 2341 and the actuating member 2343. In this way, after the second swing arm 2341 and the actuating member 2343 are mounted on the second connecting piece 2313, the second connecting piece 2313 is fastened to the base body 2311. The assembly operation is simple and highly efficient.

Specifically, the second connecting piece 2313 may be rotatably connected to the second swing arm 2341 and the actuating member 2343 in the following manner.

Referring to FIG. 21, a shaft sleeve 2313*a* is disposed on the second connecting piece 2313, and a cylindrical shaft hole is disposed in the shaft sleeve 2313*a*. In some embodiments, there are four shaft sleeves 2313*a*. Two shaft sleeves 2313*a* on the left are configured to be rotatably connected to a second swing arm 2341 on the left and an actuating member 2343 fastened relative to the second swing arm 2341, and two shaft sleeves 2313*a* on the right are configured to be rotatably connected to a second swing arm 2341 on the right and an actuating member 2343 fastened relative to the second swing arm 2341. Because the rotating shaft mechanism 23 is a vertically symmetric structure, only a manner in which the two shaft sleeves 2313*a* on the left are rotatably connected to the second swing arm 2341 and the actuating member 2343 is used as an example below for description. A manner in which the two shaft sleeves 2313*a* on the right are rotatably connected to the second swing arm 2341 and the actuating member 2343 is the same as the foregoing manner in which the two shaft sleeves 2313*a* on the left are rotatably connected to the second swing arm 2341 and the actuating member 2343. Details are not described herein again.

Figure 24:
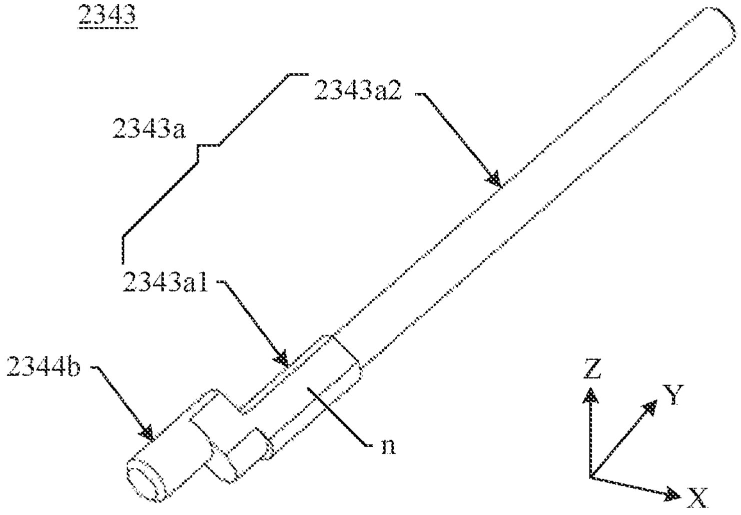
FIG. 24 is a schematic diagram of a structure of an actuating member in the rotating shaft mechanism shown in FIG. 19.
Figure 25:
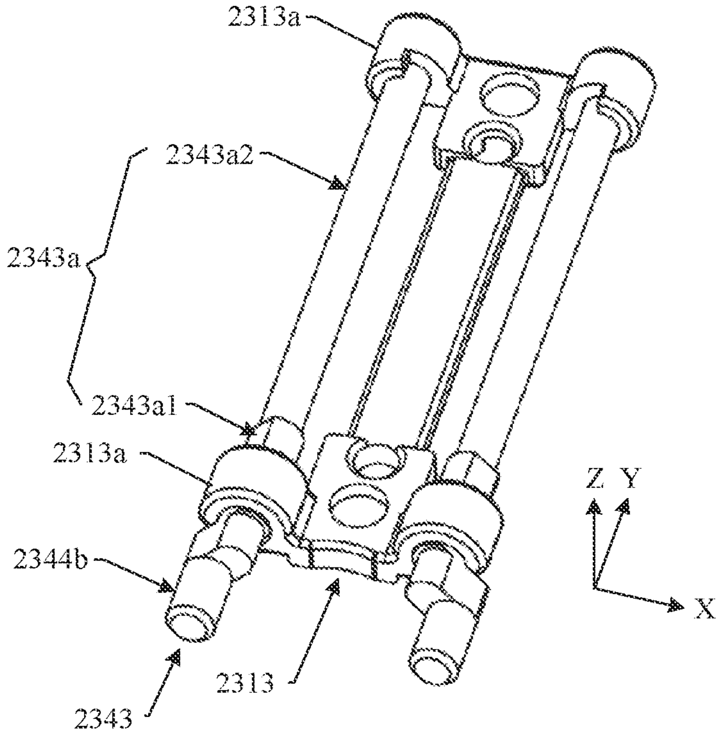
FIG. 25 is an assembly diagram of the actuating member shown in FIG. 24 and a second connecting piece in the rotating shaft base shown in FIG. 21.

Specifically. FIG. 24 is a schematic diagram of a structure of an actuating member 2343 in the rotating shaft mechanism 23 shown in FIG. 19. The actuating member 2343 includes a rotating shaft part 2343*a*. The rotating shaft part 2343*a* includes a first segment 2343*a*1 and a second segment 2343*a*2, and a flat location n is disposed on a side surface of the first segment 2343*a*1. In some embodiments, the flat location n is disposed on two opposite side surfaces of the first segment 2343*a*1. In some other embodiments, the flat location n may be disposed on one, three, or four sides of a circumference of the first segment 2343*a*1. This is not specifically limited herein. A cross section of the second segment 2343*a*2 is circular. FIG. 25 is an assembly diagram of the actuating member 2343 shown in FIG. 24 and a second connecting piece 2313 in the rotating shaft base 231 shown in FIG. 21. The rotating shaft part 2343*a* of the actuating member 2343 penetrates into two shaft sleeves 2313*a* on the left of the second connecting piece 2313, and can rotate in the two shaft sleeves 2313*a*.

Still referring to FIG. 24, the actuating member 2343 also includes an eccentric protrusion part. The eccentric protrusion part is the second sliding member 2344*b* in the rotating shaft mechanism 23 shown in FIG. 14. The eccentric protrusion part may also be replaced with an eccentric wheel, an eccentric roller, an eccentric rolling drum, and the like. This is not specifically limited herein.

Figure 26:
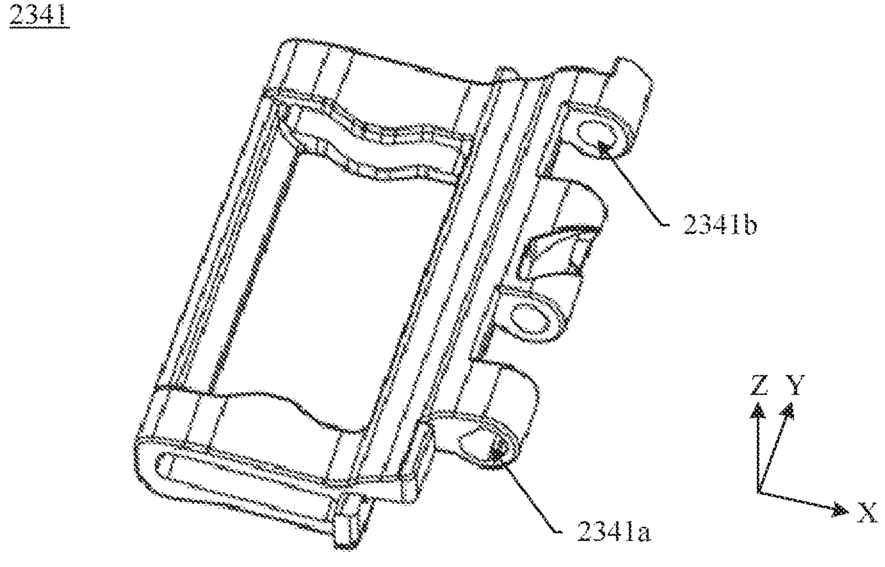
FIG. 26 is a schematic diagram of a structure of a second swing arm in the rotating shaft mechanism shown in FIG. 19.
Figure 27:
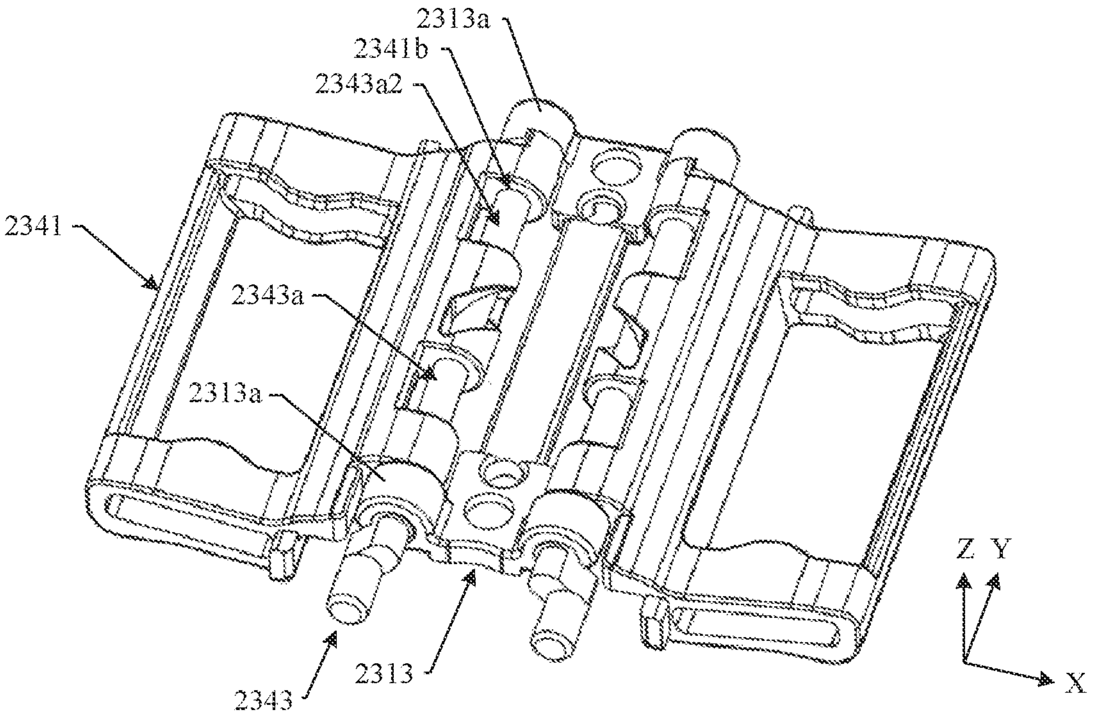
FIG. 27 is an assembly diagram of the assembly structure shown in FIG. 25 and the second swing arm shown in FIG. 26.

FIG. 26 is a schematic diagram of a structure of a second swing arm 2341 in the rotating shaft mechanism 23 shown in FIG. 19. A flat hole 2341*a* and a round hole 2341*b* are disposed on the second swing arm 2341. A shape and a size of the flat hole 2341*a* adapt to a shape and a size of a cross section of the first segment 2343*a*1 of the actuating member 2343 shown in FIG. 22, and a shape and a size of the round hole 2341*b* adapt to a shape and a size of a cross section of the second segment 2343*a*2 of the actuating member 2343 shown in FIG. 22. FIG. 27 is an assembly diagram of the assembly structure shown in FIG. 25 and the second swing arm 2341 shown in FIG. 26. The second swing arm 2341 is connected to a part that is of the rotating shaft part 2343*a* and that is located between the two shaft sleeves 2313*a*, to limit the second swing arm 2341 by using the two shaft sleeves 2313*a*. On this basis, the second swing arm 2341 is sleeved on the rotating shaft part 2343*a* through fitting by using the flat hole 2341*a* (not shown in the figure), to prevent, by using the flat location, the second swing arm 2341 from rotating relative to the actuating member 2343. In addition, the second swing arm 2341 is further sleeved on the second segment 2343*a*2 by using the round hole 2341*b*.

In this way, the second connecting piece 2313 is rotatably connected to the second swing arm 2341 and the actuating member 2343, and locations of the second swing arm 2341 and the actuating member 2343 are fixed. Therefore, when rotating, the second swing arm 2341 can drive the actuating member 2343 to rotate with the second swing arm 2341. The structure is convenient to assemble, and has good stability.

In some other embodiments, the second swing arm 2341 may be prevented, through pin fastening, interference fit, or the like, from rotating relative to the actuating member 2343. This is not specifically limited herein.

It should be noted that, in the foregoing embodiments, the second swing arm 2341 and the actuating member 2343 are two mutually independent structural members. In some other embodiments, the second swing arm 2341 and the actuating member 2343 may be an integral structural member, that is, the second swing arm 2341 and the actuating member 2343 are integrally formed. In this way, the rotating shaft mechanism 23 includes a small quantity of parts, complexity of a composition structure is low, and the structure is simpler.

Figure 28:
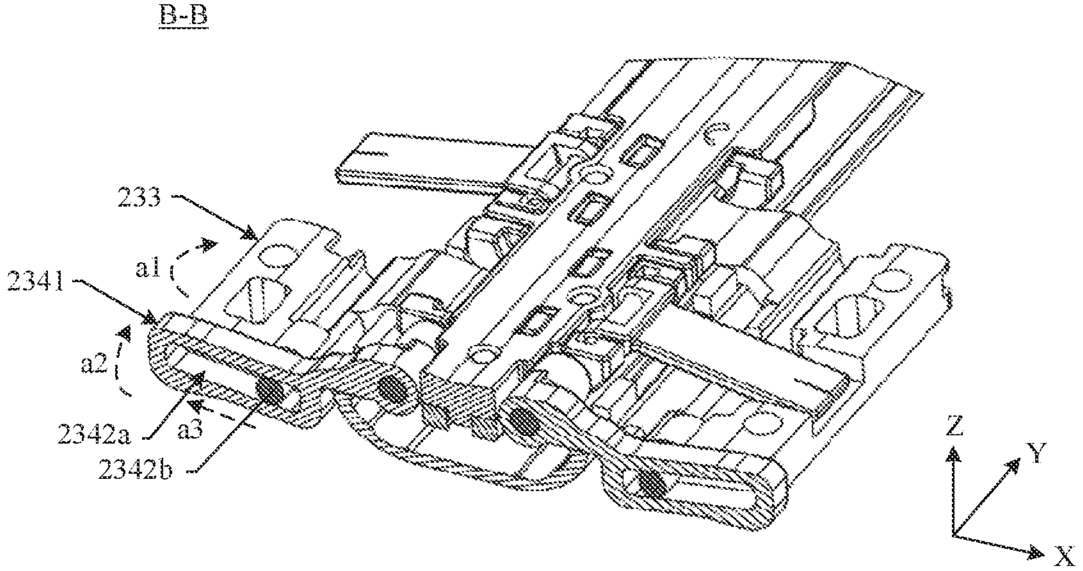
FIG. 28 is a schematic diagram of a cross-sectional structure of the rotating shaft mechanism shown in FIG. 19 at a line B-B.

FIG. 28 is a schematic diagram of a cross-sectional structure of the rotating shaft mechanism 23 shown in FIG. 19 at a line B-B. A first sliding member 2342*b* is disposed on the first swing arm 233, a first sliding groove 2342*a* is disposed on the second swing arm 2341, and the first sliding member 2342*b* is slidably connected in the first sliding groove 2342*a*. When rotating from an unfolded location to a folded location in a direction a1, the first swing arm 233 may drive the first sliding groove 2342*a* by using the first sliding member 2342*b*, so that the second swing arm 2341 rotates in a direction a2, and the first sliding member 2342*b* slides in the first sliding groove 2342*a* in a direction a3. On this basis, when rotating from the folded location to the unfolded location in a direction opposite to the direction a1, the first swing arm 233 may drive the first sliding groove 2342*a* by using the first sliding member 2342*b*, so that the second swing arm 2341 rotates in a direction opposite to the direction a2, and the first sliding member 2342*b* slides in the first sliding groove 2342*a* in a direction opposite to the direction a3.

Figure 29:
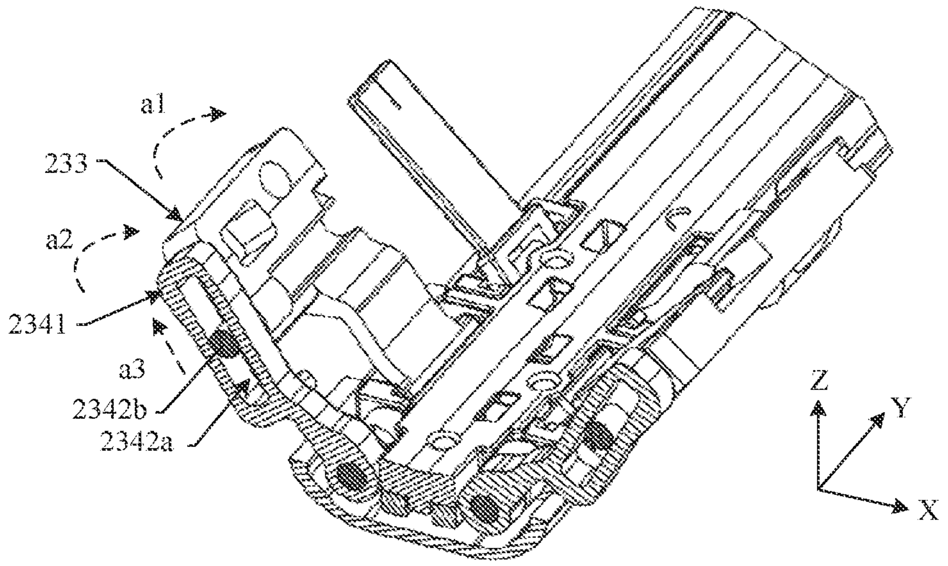
FIG. 29 is a schematic diagram of a structure of the rotating shaft mechanism shown in FIG. 28 in a half folded state.

FIG. 29 is a schematic diagram of a structure of the rotating shaft mechanism 23 shown in FIG. 28 in a half folded state. The half folded state is a state in which the rotating shaft mechanism 23 is located when the first swing arm 233 rotates from the unfolded location to the folded location by a specific angle and the angle is less than a rotation angle existing when the first swing arm 233 rotates to the folded location.

Figure 30:
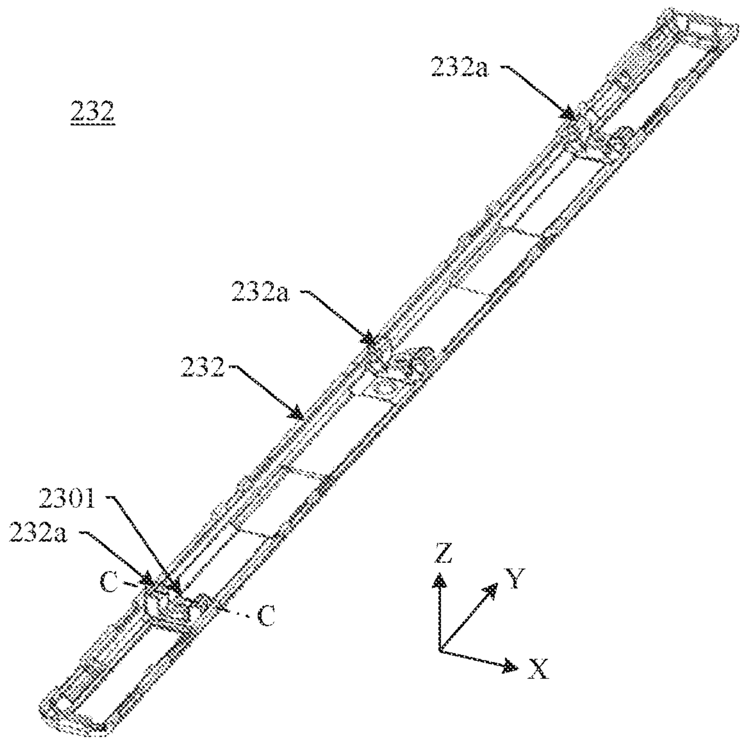
FIG. 30 is a schematic diagram of a structure of a shaft cover in the rotating shaft mechanism shown in FIG. 19.
Figure 31:
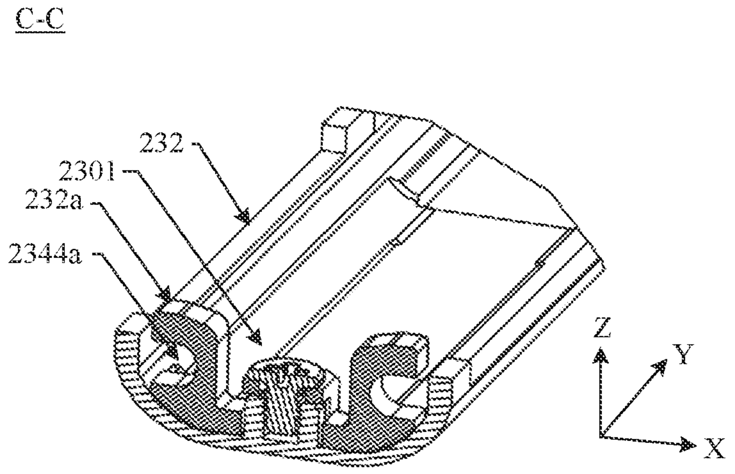
FIG. 31 is a schematic diagram of a cross-sectional structure of the shaft cover shown in FIG. 30 at a line C-C.
Figure 32:
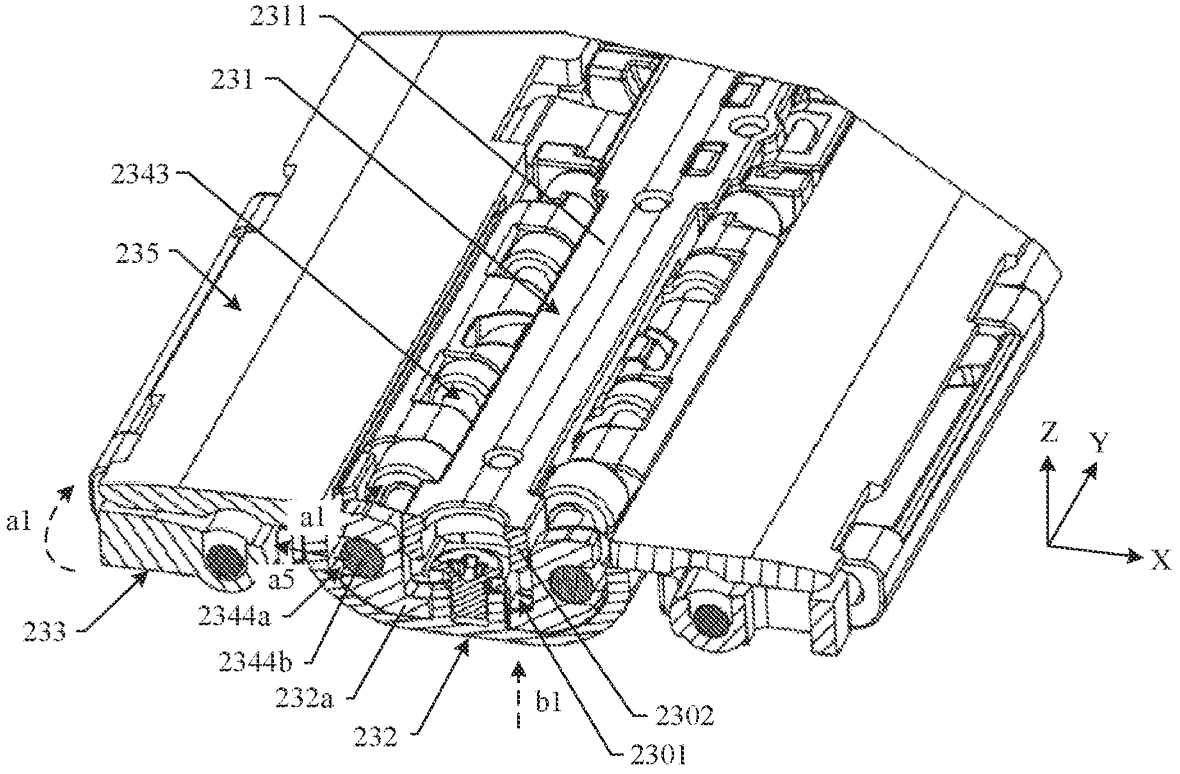
FIG. 32 is a schematic diagram of an assembly structure of the shaft cover and the lift slider shown in FIG. 31 and a second sliding member on an actuating member.

FIG. 30 is a schematic diagram of a structure of a shaft cover 232 in the rotating shaft mechanism 23 shown in FIG. 19. A lift slider 232*a* is disposed on an inner surface of the shaft cover 232. The inner surface of the shaft cover 232 is a surface that is of the shaft cover 232 and that faces the foldable screen. There are three lift sliders 232*a*, and the three lift sliders 232*a* are respectively included in the first rotating shaft part 23*a*, the second rotating shaft part 23*b*, and the third rotating shaft part 23*c* in FIG. 17. The lift slider 232*a* and the shaft cover 232 may be two independent structural members, or may be an integral structural member, that is, the lift slider 232*a* and the shaft cover 232 are integrally formed. In the embodiment shown in FIG. 30, the shaft cover 232 and the lift slider 232*a* are two independent structural members, and the shaft cover 232 and the lift slider 232*a* are fastened together by using a screw. In some other embodiments, the shaft cover 232 and the lift slider 232*a* may be fastened together through clamping, welding, or the like. FIG. 31 is a schematic diagram of a cross-sectional structure of the shaft cover 232 shown in FIG. 30 at a line C-C. A second sliding groove 2344*a* is disposed on the lift slider 232*a*, and the second sliding groove 2344*a* is configured to be slidably connected to the second sliding member 2344*b* on the actuating member 2343 shown in FIG. 24. FIG. 32 is a schematic diagram of an assembly structure of the shaft cover 232 and the lift slider 232*a* shown in FIG. 31 and a second sliding member 2344*b* on an actuating member 2343. The eccentric protrusion part (namely, the first sliding member 2344*b*) of the actuating member 2343 penetrates into the second sliding groove 2344*a* on the lift slider 232*a*, and can slide along the second sliding groove 2344*a*. In this way, when the first swing arm 233 rotates from the unfolded location to the folded location in the direction a1, the actuating member 2343 rotates with the second swing arm 2341 in a direction a4, and may drive the second sliding groove 2344*a* by using the eccentric protrusion part, to drive the lift slider 232*a* to move upward in a direction b1. In addition, the eccentric protrusion part slides in the second sliding groove 2344*a* in a direction a5. On this basis, when the first swing arm 233 rotates from the folded location to the unfolded location in a direction opposite to the direction a1, the actuating member 2343 rotates with the second swing arm 2341 in a direction opposite to the direction a4, and may drive the second sliding groove 2344*a* by using the eccentric protrusion part, to drive the lift slider 232*a* to move downward in a direction opposite to the direction b1. In addition, the eccentric protrusion part slides in the second sliding groove 2344*a* in a direction opposite to the direction a5.

Referring back to FIG. 30 and FIG. 31, a limiting sliding groove 2301 is further disposed on the lift slider 232*a* Referring to FIG. 32, a limiting sliding member 2302 is disposed on the rotating shaft base 231. Optionally, the limiting sliding member 2302 may be disposed on the base body 2311 of the rotating shaft base 231. In some other embodiments, the limiting sliding member 2302 may be disposed on the first connecting piece 2312 or the second connecting piece 2313 of the rotating shaft base 231. Referring to FIG. 32, the limiting sliding member 2302 is disposed in the limiting sliding groove 2301 through fitting, and can slide upward and downward along the limiting sliding groove 2301. The limiting sliding groove 2301 and the limiting sliding member 2302 form a sliding constraint, to allow the shaft cover 232 to move upward and downward in a thickness direction (namely, the Z-axis direction) of the rotating shaft base 231, and prevent the shaft cover 232 from moving along a plane (namely, an XY plane) perpendicular to the thickness direction of the rotating shaft base 231, so as to avoid misalignment or jamming.

In some embodiments, mainly referring to FIG. 32, a connecting part between the shaft cover 232 and the lift slider 232*a* is located in the limiting sliding groove 2301. An avoidance hole is disposed at a location that is on the limiting sliding member 2302 and that corresponds to the connecting part, and the connecting part is accommodated in the avoidance hole. Therefore, the thickness of the rotating shaft mechanism 23 can be reduced.

It should be noted that disposition locations of the limiting sliding groove 2301 and the limiting sliding member 2302 may be interchanged, and the limiting sliding groove 2301 and the limiting sliding member 2302 may be replaced with another sliding constraint assembly (for example, a guide rail and a slider). This is not specifically limited in this application.

Based on the foregoing descriptions, the second swing arm 2341, the first sliding groove 2342*a*, the first sliding member 2342*b*, the actuating member 2343 (on which the second sliding member 2344*b* is disposed), and the lift slider 232*a* (on which the second sliding groove 2344*a* is disposed) form a first drive mechanism. Therefore, when rotating from the unfolded location to the folded location, the first swing arm 233 may drive, by using the first drive mechanism, the shaft cover 232 to move upward, to compensate for a step difference between the shaft cover and the housing, and avoid exposing an internal structure. In addition, when rotating from the folded location to the unfolded location, the first swing arm 233 may drive, by using the first drive mechanism, the shaft cover 232 to move downward, to implement reset. The structure of the first drive mechanism is simple and easy to implement. Based on the foregoing descriptions, the first drive mechanism may have another structure form. For specific descriptions, refer to the foregoing descriptions. Details are not described herein again.

Figure 33:
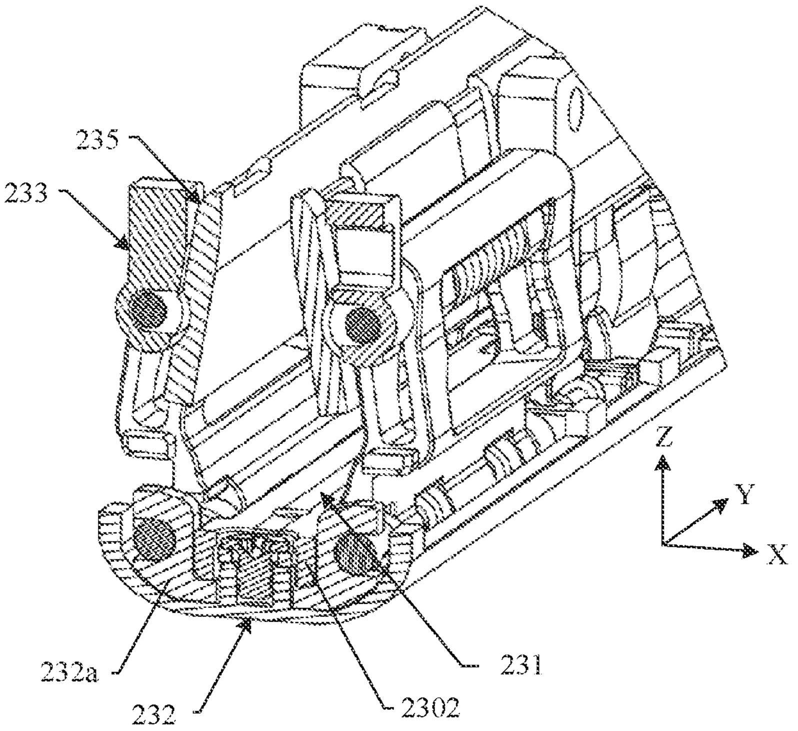
FIG. 33 is a schematic diagram of a structure of the rotating shaft mechanism shown in FIG. 32 in a folded state.

In FIG. 32, the rotating shaft mechanism 23 is in the unfolded state. FIG. 33 is a schematic diagram of a structure of the rotating shaft mechanism 23 shown in FIG. 32 in a folded state. It can be learned from comparison between FIG. 32 and FIG. 33 that, when the rotating shaft mechanism 23 rotates from the unfolded state shown in FIG. 32 to the folded state shown in FIG. 33, the shaft cover 232 moves upward by a specific height relative to the rotating shaft base 231; and when the rotating shaft mechanism 23 rotates from the folded state shown in FIG. 33 to the unfolded state shown in FIG. 32, the shaft cover 232 moves downward by a specific height relative to the rotating shaft base 231.

Next, the following describes the door plate moving system in the rotating shaft mechanism 23 shown in FIG. 18 and FIG. 19.

Figure 34:
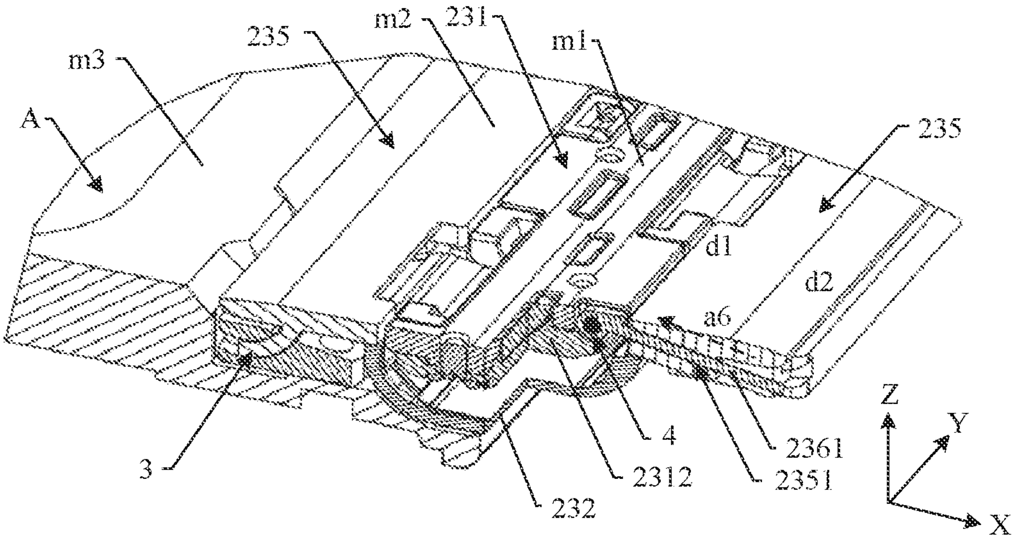
FIG. 34 is a schematic diagram of a cross-sectional structure of the rotating shaft mechanism shown in FIG. 18 at a line D-D.

Specifically. FIG. 34 is a schematic diagram of a cross-sectional structure of the rotating shaft mechanism 23 shown in FIG. 18 at a line D-D. In this embodiment, the rotating shalt mechanism 23 is in the unfolded state, and a surface m3 that is of the primary middle frame A and that is used to dispose the foldable screen, a surface m2 that is of the door plate 235 and that is used to dispose the foldable screen, and a surface m1 that is of the rotating shaft base 231 and that is used to dispose the foldable screen are approximately coplanar. Door plates 235 on both sides are connected in a same manner. The door plate 235 is rotatably connected to the first swing arm 233 by using a rotating pair 3, and a third sliding groove 2351 is disposed in the door plate 235. The door plate swing arm 2361 is rotatably connected to the rotating shaft base 231 by using a rotating pair 4. In some embodiments, the door plate swing arm 2361 is rotatably connected to the first connecting piece 2312 of the rotating shaft base 231. The door plate swing arm 2361 slidably penetrates into the third sliding groove 2351. On this basis, when rotating from the unfolded location to the folded location, the first swing arm 233 may drive the door plate swing arm 2361 to slide relative to the door plate 235 in a direction a6, and drive an end d1 that is of the door plate 235 and that is close to the rotating shaft base 231 to tilt toward a side away from the foldable screen relative to an end d2 away from the rotating shaft base 231.

Figure 35:
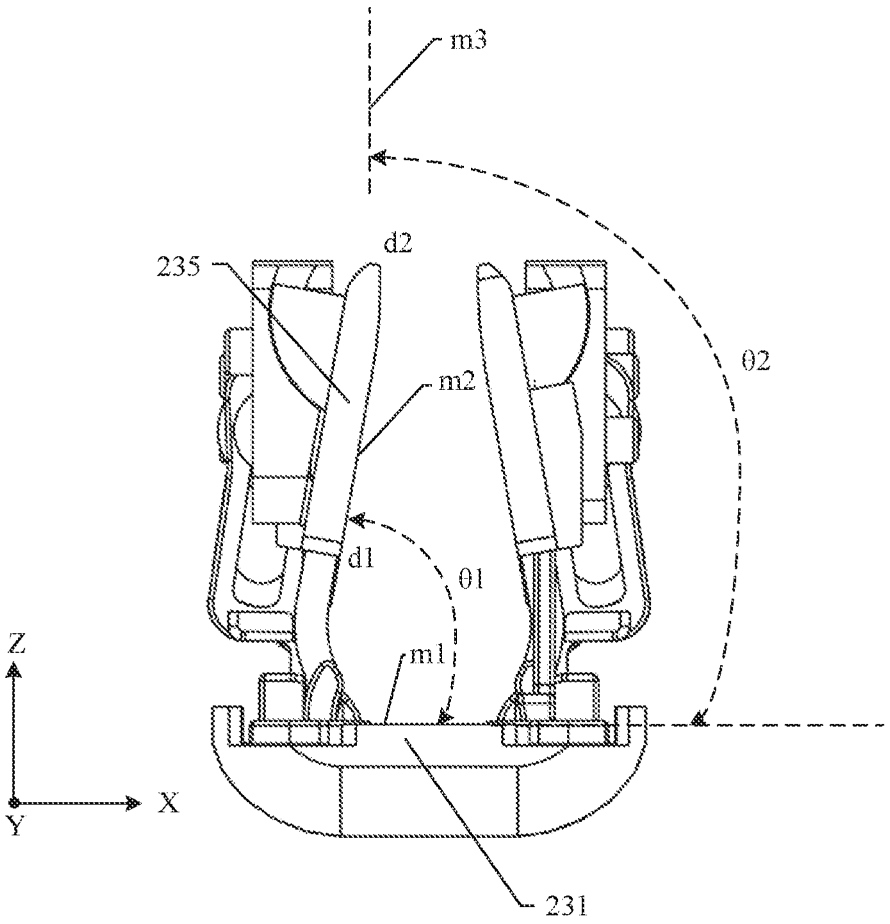
FIG. 35 is a schematic diagram of a structure of the rotating shaft mechanism shown in FIG. 18 in a folded state.

In this way, when the first swing arm 233 rotates to the folded location, FIG. 35 is a schematic diagram of a structure of the rotating shaft mechanism 23 shown in FIG. 18 in a folded state, an included angle between m2 and m1 is a first angle θ1, an included angle between m3 and m1 is a second angle θ2, and the first angle θ1 is less than the second angle θ2. It can be inferred that, when the first swing arm 233 rotates from the unfolded location to the folded location, a rotation angle of the door plate 235 relative to the rotating shaft base 231 is greater than a rotation angle of the middle frame relative to the rotating shaft base 231. Because the middle frame is fastened to the first swing arm 233, the rotation angle of the middle frame relative to the rotating shaft base 231 is equal to a rotation angle of the first swing arm 233 relative to the rotating shaft base 231. In other words, the rotation angle of the door plate 235 relative to the rotating shaft base 231 is greater than the rotation angle of the first swing arm 233 relative to the rotating shaft base 231. When the rotation angle of the first swing arm 233 is 90°, the rotation angle of the door plate 235 may be 100°, 105°, 102°, 110°, or the like. This is not specifically limited herein. In this way, a third display area of the foldable screen may be folded into a water drop shape, to reduce an inward folding angle, reduce a probability that a crease occurs on the foldable screen, ensure a display effect of the foldable screen, and prolong a life span of the foldable screen.

In the foregoing embodiment, the door plate swing arm 2361 forms a second drive mechanism. When rotating from the unfolded location to the folded location, the first swing arm 233 may drive, by using the second drive mechanism, the end b1 that is of the door plate 235 and that is close to the rotating shaft base 231 to tilt toward the side away from the foldable screen relative to the end b2 away from the rotating shaft base 231, to form a foldable screen structure in a water drop shape; and when rotating from the folded location to the unfolded location, the first swing arm 233 may drive, by using the second drive mechanism, the end b1 that is of the door plate 235 and that is close to the rotating shaft base 231 to tilt toward the side away from the foldable screen relative to the end b2 away from the rotating shaft base 231, so that m1, m2, and m3 are approximately coplanar, to keep the foldable screen flat. It can be learned that the second drive mechanism may have another structure form. For specific descriptions, refer to the foregoing descriptions. Details are not described herein again.

Based on the shaft cover lift system and the door plate moving system that are described above, specifically, because the rotating shaft mechanism 23 includes two parts that are vertically symmetric, in the rotating shaft mechanism 23 shown in FIG. 17 and FIG. 18, each part includes six parts (M) in total; the rotating shaft base 231, the shaft cover 232, the first swing arm 233, the second swing arm 2341 (with the actuating member 2343), the door plate 235, and the door plate swing arm 2361. In a process in which the rotating shaft mechanism 23 moves between the unfolded state and the folded state, the six parts have a unique movement manner, and have good stability.

Then, the synchronization mechanism 237 in the rotating shaft mechanism 23 shown in FIG. 17 and FIG. 18 is described.

A function of the synchronization mechanism 237 is as follows: When rotating from the unfolded location to the folded location, either of the two first swing arms 233 can drive, by using the synchronization mechanism 237, the other first swing arm 233 to synchronously rotate from the unfolded location to the folded location. Similarly, when rotating from the folded location to the unfolded location, either of the two first swing arms 233 can also drive, by using the synchronization mechanism 237, the other first swing arm 233 to synchronously rotate from the folded location to the unfolded location.

In some embodiments, when the two first swing arms 233 synchronously rotate, rotation angles of the two first swing arms 233 also remain consistent. It can be understood that, due to a manufacturing or assembly tolerance, there may be a specific angle deviation between the two first swing arms 233 in a rotation process. Therefore, generally, when the two first swing arms 233 rotate from the unfolded location to the folded location, if a deviation range of the rotation angle is between 0 and 20°, it can be considered that the rotation angles of the two first swing arms 233 remain consistent. In this way, the two first swing arms 233 may synchronously rotate by a same angle by using the synchronization mechanism, to reduce difficulty in folding and unfolding the foldable screen device.

Movement of the rotating shaft mechanism 23 shown in FIG. 18 and FIG. 19 is unique. When the synchronization mechanism 237 is disposed between any two moving structural members that are symmetric, shaft cover lift systems and door plate moving systems on both sides may be driven to synchronously move. Therefore, in addition to being directly connected between the two first swing arms 233, the synchronization mechanism 237 may be further connected between two second swing arms 2341, or connected between two door plate swing arms 2361. When the synchronization mechanism 237 is connected between the two second swing arms 2341, the two first swing arms 233 may be indirectly driven, by using the shaft cover lift system, to synchronously rotate. When the synchronization mechanism 237 is connected between the two door plate swing arms 2361, the two first swing arms 233 may also be indirectly driven, by using the door plate moving system, to synchronously rotate.

In some embodiments, the synchronization mechanism 237 is connected between the two second swing arms 2341, and there is sufficient space between the two second swing arms 2341 to facilitate mounting of the synchronization mechanism 237.

The synchronization mechanism 237 has a plurality of structure forms. For example, the synchronization mechanism 237 includes an even quantity of successively meshed drive gears (not shown in the figure). Specifically, the quantity of drive gears may be two, four, six, or the like. The even quantity of drive gears includes a first drive gear and a second drive gear that are respectively located at a head location and a tail location, the first drive gear and the second drive gear are respectively configured to be fastened relative to the two second swing arms 2341, and a center axis of the first drive gear and a center axis of the second drive gear are respectively collinear with rotation axes of the two second swing arms 2341. Therefore, the even quantity of drive gears are meshed for driving, so that the two second swing arms 2341 can be driven to synchronously swing. The structure is simple and easy to implement. In addition, if a larger quantity of drive gears are designed, a smaller height of the drive gear in the Z-axis direction may be designed, to further help implement thinning of the rotating shaft mechanism 23. However, a larger quantity of drive gears indicates higher structure complexity, a smaller volume of the drive gear, and larger processing difficulty. Therefore, based on different design requirements, thinning, structure complexity, and processing difficulty of the rotating shaft mechanism 23 may be comprehensively considered to select different quantities of drive gears.

Figure 36:
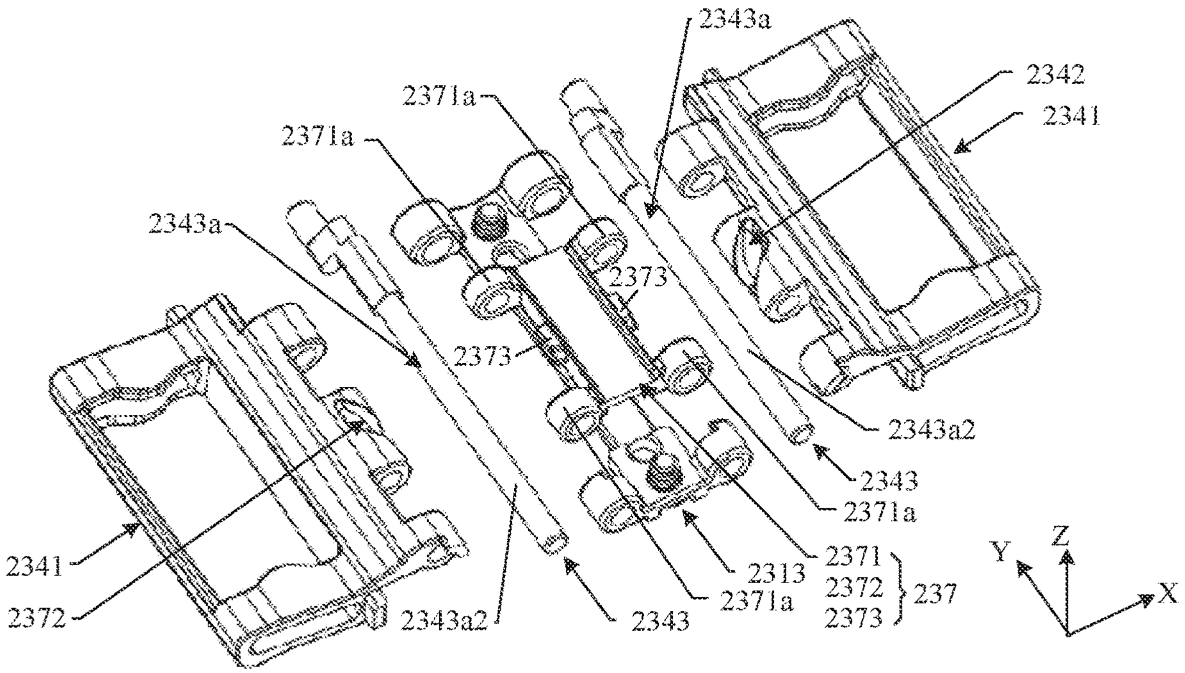
FIG. 36 is an exploded view of a synchronization mechanism, a second connecting piece, a second swing arm, and an actuating member in the rotating shaft mechanism shown in FIG. 19.
Figure 37:
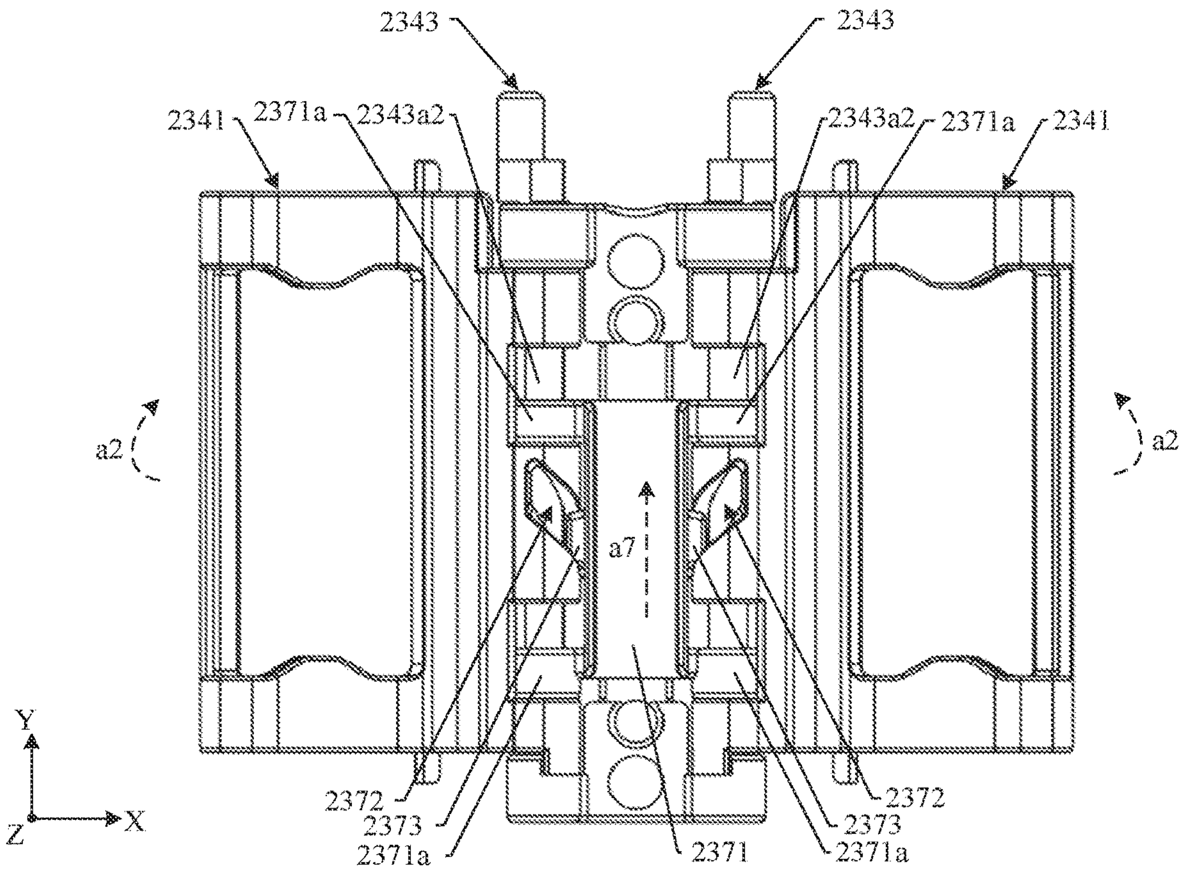
FIG. 37 is an assembly diagram of a synchronization mechanism, a second connecting piece, a second swing arm, and an actuating member in the rotating shaft mechanism shown in FIG. 36.

For another example, FIG. 36 is an exploded view of a synchronization mechanism 237, a second connecting piece 2313, a second swing arm 2341, and an actuating member 2343 in the rotating shaft mechanism 23 shown in FIG. 19. FIG. 37 is an assembly diagram of a synchronization mechanism 237, a second connecting piece 2313, a second swing arm 2341, and an actuating member 2343 in the rotating shaft mechanism 23 shown in FIG. 36. In this embodiment, the synchronization mechanism 237 includes a drive slider 2371. The drive slider 2371 is located between the second swing arms 2341 of the two first drive mechanisms. In addition, optionally, the drive slider 2371 is located between the base body 2311 and the second connecting piece 2313 in the rotating shaft base 231 shown in FIG. 21.

The drive slider 2371 is slidably connected to the rotating shaft base 231 in the length direction (namely, the Y-axis direction) of the rotating shaft base. Based on the foregoing descriptions, the rotating shaft part 2343*a* of the actuating member 2343 penetrates into the shaft sleeve of the second connecting piece 2313 in the rotating shaft base, and can rotate in the shaft sleeve. On this basis, optionally, a shaft sleeve 2371*a* is disposed on the drive slider 2371. In some embodiments, there are four shaft sleeves 2371*a*. In the four shaft sleeves 2371*a*, two shaft sleeves 2371*a* on the left are sleeved on a second segment 2343*a*2 of a rotating shaft part 2343*a* in an actuating member 2341 on the left, and can slide along the second segment 2343*a*2; and two shaft sleeves 2371*a* on the right are sleeved on a second segment 2343*a*2 of a rotating shaft part 2343*a* in an actuating member 2341 on the right, and can slide along the second segment 2343*a*2. In this way, the second segment 2343*a*2 of the rotating shaft part 2343*a* in the actuating member 2343 is used as a sliding guide rail, and the drive slider 2371 is slidably connected to the sliding guide rail by using the shaft sleeve 2371*a*. Therefore, the drive slider 2371 and the rotating shaft base are slidably connected to each other. The structure is simple, and no sliding guide rail needs to be specially disposed. Therefore, structure complexity of the rotating shaft mechanism 23 can be reduced.

It can be learned that another quantity of shaft sleeves 2371*a* may be disposed on the drive slider 2371. This is not specifically limited herein. In addition, the drive slider 2371 and the rotating shaft base may be slidably connected to each other in another manner. This is not specifically limited in this application.

On the foregoing basis, referring to FIG. 37, the drive slider 2371 is drivably connected to the two second swing arms 2341. In this way, when rotating from the unfolded location to the folded location in the direction a2, either of the two second swing arms 2341 can drive the drive slider 2371 to slide in a direction a7 (consistent with the Y-axis direction), and drive the other second swing arm 2341 to synchronously rotate from the unfolded location to the folded location in the direction a2. On the contrary, when rotating from the folded location to the unfolded location in the direction opposite to the direction a2, either of the two second swing arms 2341 can drive the drive slider 2371 to slide in a direction (namely, a direction opposite to the Y-axis direction, namely, a −Y-axis direction) opposite to the direction a7, and drive the other second swing arm 2341 to synchronously rotate from the folded location to the unfolded location in the direction opposite to the direction a2. It should be noted that the unfolded location of the second swing arm 2341 is a location at which the second swing arm 2341 is located when the rotating shaft mechanism 23 is in the unfolded state, and the folded location of the second swing arm 2341 is a location at which the second swing arm 2341 is located when the rotating shaft mechanism 23 is in the folded state.

On the foregoing basis, the two first swing arms in the rotating shaft mechanism 23 may be indirectly driven, by using the shaft cover lift system, to synchronously rotate.

The synchronization mechanism 237 occupies a small height in the Z-axis direction, so that a thickness of the rotating shaft mechanism 23 can be reduced, to facilitate thinning of the foldable screen device.

In the foregoing embodiment, the drivable connection manner between the drive slider 2371 and the second swing arm 2341 includes but is not limited to a drivable connection obtained by using a structure including a lead screw and a nut, a drivable connection obtained by using a structure including a spiral sliding groove and a slider, or a drivable connection obtained by using a structure including a worm gear and a worm. This is not specifically limited herein.

In some embodiments, referring to FIG. 36 and FIG. 37, a spiral sliding groove 2372 is disposed on the second swing arm 2341, and a slider 2373 is disposed on the drive slider 2371. In some other embodiments, disposition locations of the spiral sliding groove 2372 and the slider 2373 may be interchanged, that is, the spiral sliding groove 2372 is disposed on the drive slider 2371, and the slider 2373 is disposed on the second swing arm 2341. A center line of a spiral extension path of the spiral sliding groove 2372 is parallel to a slidable direction (namely, the Y-axis direction) of the drive slider 2371. The slider 2373 is slidably disposed in the spiral sliding groove 2372. In other words, the slider 2373 is disposed in the spiral sliding groove 2372, and the slider 2373 can slide in an extension direction of the spiral sliding groove 2372.

In this way, when rotating from the unfolded location to the folded location in the direction a2, either of the two second swing arms 2341 can drive, by using the spiral sliding groove 2372 on the second swing arm 2341, the drive slider 2371 to slide in the direction a7, and drive, by using the slider 2373 on the drive slider 2371, the other second swing arm 2341 to rotate synchronously from the unfolded location to the folded location in the direction a2. On the contrary, when rotating from the folded location to the unfolded location in the direction opposite to the direction a2, either of the two second swing arms 2341 can drive, by using the spiral sliding groove 2372 on the second swing arm 2341, the drive slider 2371 to slide in the direction opposite to the direction a7, and drive, by using the slider 2373 on the drive slider 2371, the other second swing arm 2341 to rotate synchronously from the folded location to the unfolded location in the direction opposite to the direction a2. The drivable connection manner between the drive slider 2371 and the second swing arm 2341 is a drivable connection obtained by using a structure including a spiral sliding groove and a slider. The structure is simple, and occupies small space, to facilitate a compact structure design of the rotating shaft mechanism.

Finally, the damping mechanism 238 in the rotating shaft mechanism 23 shown in FIG. 17 and FIG. 18 is described.

Specifically, a function of the damping mechanism 238 is as follows: When the first swing arm 233 rotates relative to the rotating shaft base 231, the damping mechanism 238 applies damping force to the first swing arm 233 to prevent the first swing arm 233 from rotating. In this way, the foldable screen device may be kept at one unfolding angle location, a plurality of unfolding angle locations, or any unfolding angle location, to ensure structure stability of the foldable screen device at these unfolding angle locations.

The damping mechanism 238 has a plurality of structure forms. For example, the damping force is provided by using a lateral friction sheet. For another example, the damping force is provided by using tension between an odd-form rotating shaft and a shaft sleeve. For another example, the damping force is provided by using an elastic material such as rubber or silicone mounted between a rotating shaft and a shaft sleeve. This is not specifically limited in this application.

In addition, because movement of the rotating shaft mechanism 23 shown in FIG. 18 and FIG. 19 is unique, when the damping mechanism 238 is disposed at any moving pair location, the entire mechanism can be prevented from moving. Therefore, in addition to being directly disposed on a rotating pair part between the first swing arm 233 and the rotating shaft base 231, the damping mechanism 238 may be further disposed on a rotating pair part between the second swing arm 2341 and the rotating shaft base 231, or disposed on a sliding pair part between the first swing arm 233 and the second swing arm 2341, or disposed on a sliding pair part between the actuating member 2343 and the shaft cover 232, or disposed on a connecting part between moving pairs in the door plate moving system. This is not specifically limited herein. An example in which the damping mechanism 238 is disposed on the sliding pair part between the first swing arm 233 and the second swing arm 2341 is used below for description. This should not be construed as a special limitation on this application.

Figure 38:
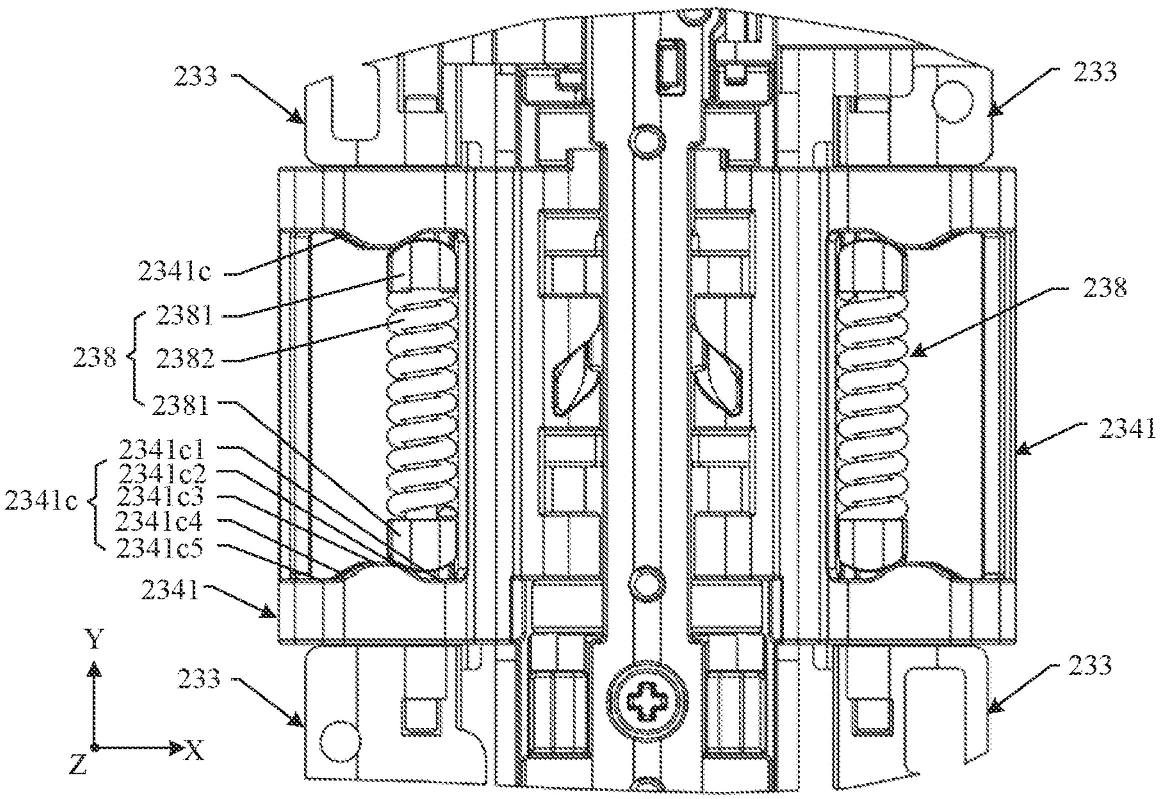
FIG. 38 is an assembly diagram of a damping mechanism, a first swing arm, and a second swing arm in the rotating shaft mechanism shown in FIG. 19.
Figure 39:
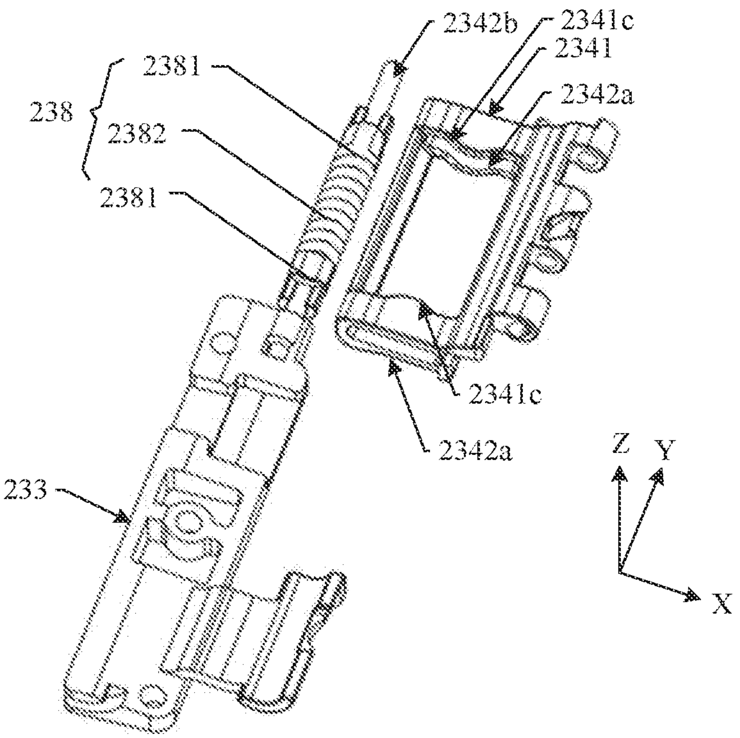
FIG. 39 is an exploded view of a damping mechanism, a first swing arm, and a second swing arm in the rotating shaft mechanism shown in FIG. 38.

Specifically, FIG. 38 is an assembly diagram of a damping mechanism 238, a first swing arm 233, and a second swing arm 2341 in the rotating shaft mechanism 23 shown in FIG. 19. FIG. 39 is an exploded view of a damping mechanism 238, a first swing arm 233, and a second swing arm 2341 in the rotating shaft mechanism 23 shown in FIG. 38. In this embodiment, there are two damping mechanisms 238, and the two damping mechanisms 238 are separately connected between the first swing arms 233 and the second swing arms 2341 on both sides. The damping mechanism 238 connected between the first swing arm 233 and the second swing arm 2341 on the left is used as an example for description in the following embodiments. A structure form of the damping mechanism 238 on the right is the same as a structure form of the damping mechanism 238 on the left, and details are not described again below.

Referring to FIG. 38 and FIG. 39, an end surface of the first sliding groove 2342*a* on the second swing arm 2341 in the length direction (namely, the Y-axis direction) of the rotating shaft base 231 is a friction surface 2341*c*. It should be noted that the first sliding groove 2342*a* described in this embodiment is not non-solid sliding groove space on the second swing arm 2341, but is a whole including non-solid sliding groove space on the second swing arm 2341 and a solid side wall surrounding the sliding groove space. The friction surface 2341*c* is disposed on the solid side wall surrounding the sliding groove space.

On the foregoing basis, the damping mechanism 238 is connected to the first sliding member 2342*b*. When sliding along the first sliding groove 2342*a*, the first sliding member

2342*b* may drive the damping mechanism 238 to move along the friction surface 2341*c*.

The damping mechanism 238 includes a friction member 2381 and an elastic member 2382. In the embodiments shown in FIG. 38 and FIG. 39, both the friction member 2381 and the elastic member 2382 of the damping mechanism 238 are sleeved on the first sliding member 2342*b*. In some other embodiments, the elastic member 2382 of the damping mechanism 238 may be fastened to the first sliding member 2342*b*. This is not specifically limited in this application. The friction member 2381 is located on a side faced by the friction surface 2341*c*. The elastic member 2382 is configured to apply, to the friction member 2381, elastic force pointing to the friction surface 2341*c*, so that the friction member 2381 abuts the friction surface 2341*c*. "Abut" indicates that the friction member 2381 and the friction surface 2341*c* are in contact with each other and have specific extrusion force on each other. In this way, when the first sliding member 2342*b* slides along the first sliding groove 2342*a*, friction force is generated between the friction member 2381 and the friction surface 2341*c*. The friction force forms damping force, to prevent the first sliding member 2342*b* from sliding relative to the first sliding groove 2342*a*, thereby preventing the first swing arm 233 from rotating relative to the rotating shaft base. The structure is simple and easy to implement.

In the foregoing embodiment, the elastic member 2382 may be an elastic material such as a coil spring, rubber, or silicone. In the embodiments shown in FIG. 38 and FIG. 38, the elastic member 2382 is a coil spring. The coil spring has high elasticity, has good stability, and has a long life span. Therefore, structure stability of the rotating shaft mechanism 23 can be ensured, and a life span can be prolonged.

In some embodiments, referring to FIG. 38, the friction surface 2341*c* is a cam surface, and the cam surface includes a first bottom area 2341*c*1, a rising area 2341*c*2, a top area 2341*c*3, a falling area 2341*c*4, and a second bottom area 2341*c*5 that are successively disposed in a length direction of the first sliding groove 2342*a*. When the first swing arm 233 is at the unfolded location, the friction member 2381 is in contact with the first bottom area 2341*cl*. When the first swing arm 233 rotates from the unfolded location to the folded location, the friction member 2381 abuts the friction surface 2341*c*, and slides successively along the rising area 2341*c*2, the top area 2341*c*3, and the falling area 2341*c*4. In this case, damping force is generated between the friction member 2381 and the friction surface 2341*c* to prevent the friction member 2381 and the friction surface 2341*c* from sliding relative to each other. When the first swing arm 233 is at the folded location, the friction member 2381 is in contact with the second bottom area 2341*c*5. In this way, when the rotating shaft mechanism 23 rotates between the unfolded state and the folded state, the damping force generated between the friction member 2381 and the friction surface 2341*c* needs to be overcome. When no external force is applied, the rotating shaft mechanism 23 may be kept in the unfolded state and the folded state. This is consistent with a use habit of the user.

In some embodiments, still referring to FIG. 38 and FIG. 39, there are two first sliding grooves 2342*a*, the two first sliding grooves 2342*a* are disposed at intervals in the Y-axis direction and are fastened relative to each other, and friction surfaces 2341*c* of the two first sliding grooves 2342*a* are opposite to each other. On this basis, the damping mechanism 238 is disposed between the two first sliding grooves 2342*a*, there are two friction members 2381, the elastic member 2382 is located between the two friction members 2381, and the elastic member 2382 simultaneously applies, to the two friction members 2381, elastic force pointing to corresponding friction surfaces 2341*c*, so that the two friction members 2381 respectively abut the corresponding friction surfaces 2341*c*. In this way, when the rotating shaft mechanism 23 rotates between the unfolded state and the folded state, the damping force generated by the damping mechanism 238 is large, and large driving force needs to be applied, so that the rotating shaft mechanism 23 can be stably kept in the unfolded state or the folded state, thereby improving use stability of the rotating shaft mechanism 23.

The first rotating shaft part 23*a* of the rotating shaft mechanism 23 shown in FIG. 17 is described in the foregoing embodiments. A structure form of the third rotating shaft part 23*c* is the same as a structure form of the first rotating shaft part 23*a*. Details are not described herein again. A structure form of the second rotating shaft part 23*b* is different from those of the first rotating shaft part 23*a* and the third rotating shaft part 23*c*, and the first rotating shaft part 23*a*, the second rotating shaft part 23*b*, and the third rotating shaft part 23*c* share the same rotating shaft base 231.

The following describes a specific structure of the second rotating shaft part 23*b*.

Figure 40:
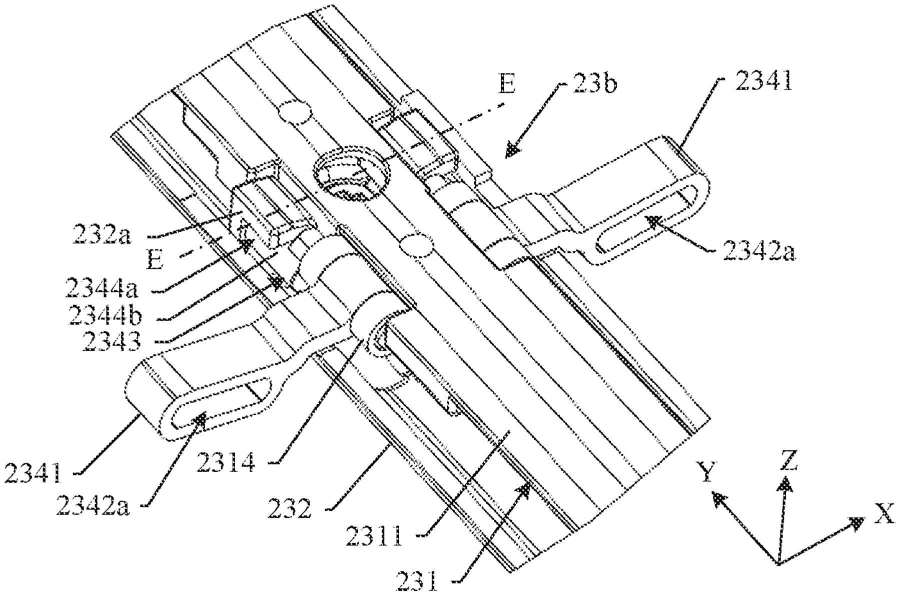
FIG. 40 is a schematic diagram of a structure of an area II in the rotating shaft mechanism shown in FIG. 17.
Figure 41:
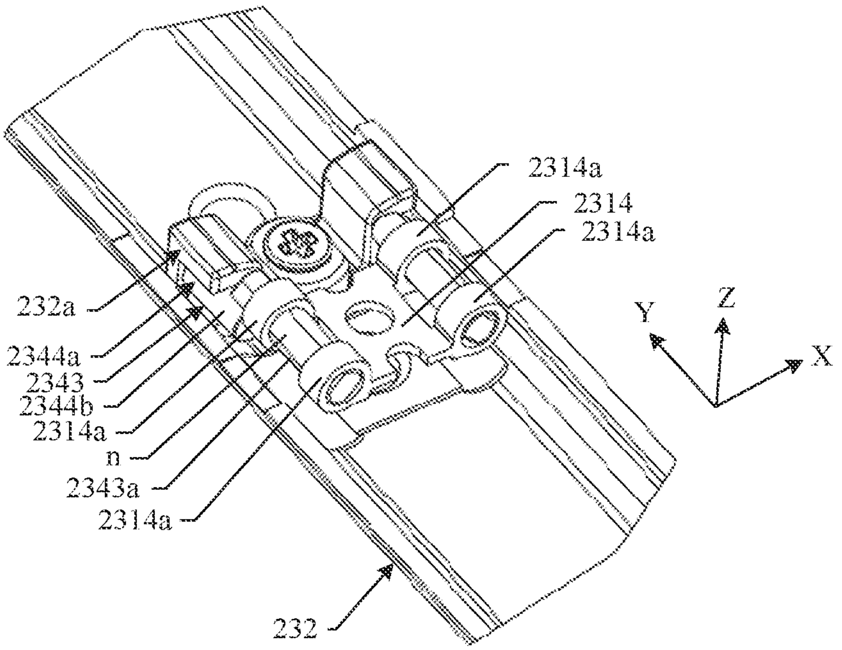
FIG. 41 is a schematic diagram of a structure of the rotating shaft mechanism shown in FIG. 40 after a base body and a second swing arm are hidden.

FIG. 40 is a schematic diagram of a structure of an area II in the rotating shaft mechanism 23 shown in FIG. 17. The door plate 235 is hidden in the figure. FIG. 41 is a schematic diagram of a structure of the rotating shaft mechanism 23 shown in FIG. 40 after a base body 2311 and a second swing arm 2341 are hidden. The rotating shaft base 231 further includes a third connecting piece 2314. The third connecting piece 2314 is fastened to the base body 2311.

In some embodiments, a shaft sleeve 2314*a* is disposed on the third connecting piece 2314, and a cylindrical shaft hole is disposed in the shaft sleeve 2314*a*. In some embodiments, there are four shaft sleeves 2314*a*. In the four shaft sleeves 2314*a*, two shaft sleeves 2314*a* located on the left and the two shaft sleeves 2313*a* on the left of the second connecting piece 2313 in the rotating shaft base 231 shown in FIG. 21 are coaxially disposed, and two shaft sleeves 2314*a* located on the right and the two shaft sleeves 2313*a* on the right of the second connecting piece 2313 in the rotating shaft base 231 shown in FIG. 21 are coaxially disposed.

On the foregoing basis, the second rotating shaft part 23*b* also includes a second swing arm 2341 and an actuating member 2343. The second swing arm 2341 and the actuating member 2343 in the second rotating shaft part 23*b* are respectively approximately the same as the second swing arm 2341 and the actuating member 2343 in the first rotating shaft part 23*a*. There are both two second swing arms 2341 and two actuating members 2343. In the two actuating members 2343, a rotating shaft part 2343*a* of an actuating member 2343 located on the left is sleeved in the two shaft sleeves 2314*a* located on the left of the third connecting piece 2314, and can rotate in the two shaft sleeves 2314*a*; and a rotating shaft part 2343*a* of an actuating member 2343 located on the right is sleeved in the two shaft sleeves 2314*a* located on the right of the third connecting piece 2314, and can rotate in the two shaft sleeves 2314*a*. A flat location n is disposed on a side surface of the rotating shaft part 2343*a*. A flat hole 2341*a* is disposed on the second swing arm 2341, and a shape and a size of the flat hole 2341*a* adapt to a shape of a cross section of the rotating shaft part 2343*a*. In the two second swing arms 2341, a second swing arm 2341 located on the left is disposed between the two shaft sleeves 2314*a* located on the left of the third connecting piece 2314, and is sleeved on the rotating shaft part 2343*a* of the actuating member 2343 on the left by using the flat hole 2341*a*; and a second swing arm 2341 located on the right is disposed between the two shaft sleeves 2314*a* located on the right of the third connecting piece 2314, and is sleeved on the rotating shaft part 2343*a* of the actuating member 2343 on the right by using the flat hole 2341*a*. Therefore, the actuating member 2343 is fastened relative to the second swing arm 2341.

A first sliding groove 2342*a* is disposed on the second swing arm 2341. On this basis, a first sliding member (not shown in the figure) is disposed on the middle frame, and the first sliding member is slidably connected in the first sliding groove 2342*a*.

Figure 42:
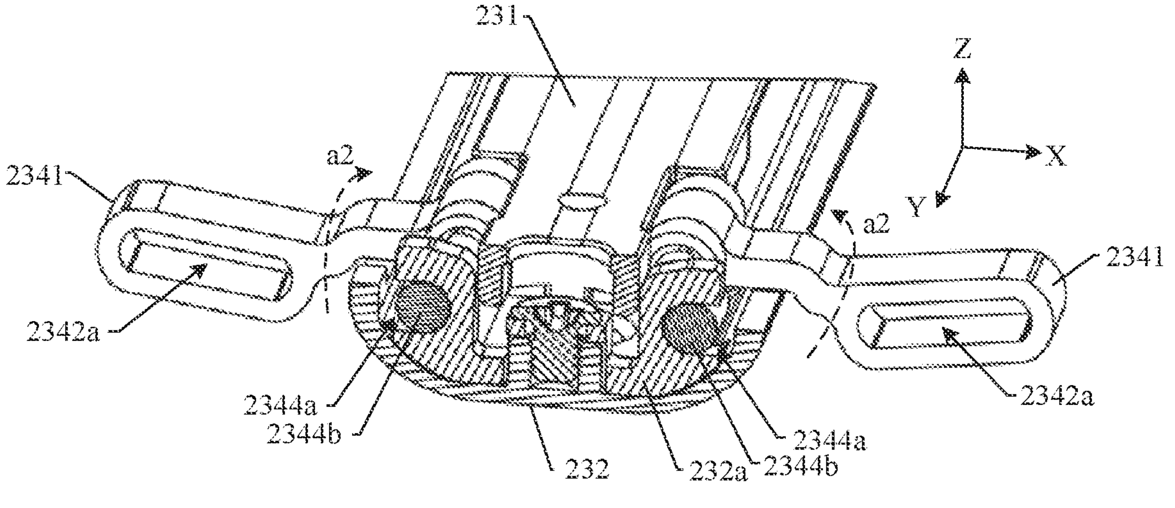
FIG. 42 is a schematic diagram of a cross-sectional structure of the rotating shaft mechanism shown in FIG. 40 at a line E-E.
Figure 43:
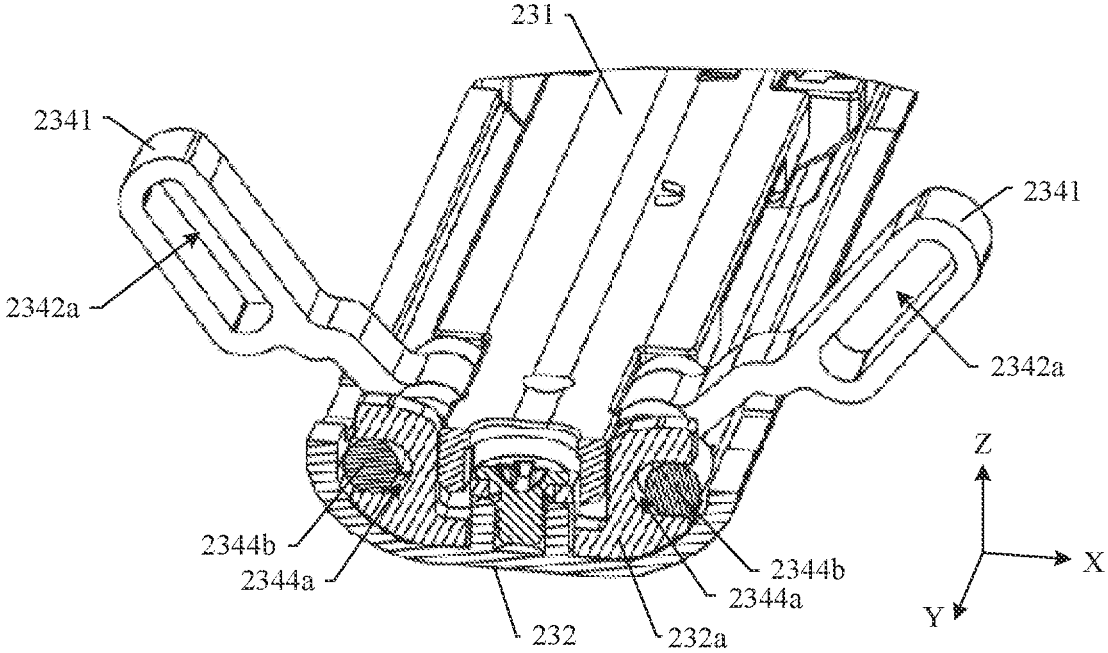
FIG. 43 is a schematic diagram of a structure of the rotating shaft mechanism shown in FIG. 42 in a half folded state.

A lift slider 232*a* is disposed on the shaft cover 232, and a second sliding groove 2344*a* is disposed on the lift slider 232*a*. FIG. 42 is a schematic diagram of a cross-sectional structure of the rotating shaft mechanism 23 shown in FIG. 40 at a line E-E. In this accompanying drawing, the rotating shaft mechanism 23 is in the unfolded state. FIG. 43 is a schematic diagram of a structure of the rotating shaft mechanism 23 shown in FIG. 42 in a half folded state. An eccentric protrusion part (namely, the second sliding member 2344*b*) of the actuating member 2343 is disposed in the second sliding groove 2344*a*, and can slide along the second sliding groove 2344*a*.

In this way, when rotating from the unfolded location to the folded location, the first swing arm 233 in the first rotating shaft part 23*a* may drive the first sliding groove 2342*a* by using the first sliding member on the middle frame, so that the second swing arm 2341 in the second rotating shaft part 23*b* rotates in the direction a2. In a process in which the second swing arm 2341 rotates, the actuating member 2343 rotates with the second swing arm 2341, to further drive the second sliding groove 2344*a* by using the eccentric protrusion part, so as to drive the shaft cover 232 to move upward. On the contrary, when rotating from the folded location to the unfolded location, the first swing arm 233 in the first rotating shaft part 23*a* may drive the first sliding groove 2342*a* by using the first sliding member on the middle frame, so that the second swing arm 2341 in the second rotating shaft part 23*b* rotates in the direction opposite to the direction a2. In a process in which the second swing arm 2341 rotates, the actuating member 2343 rotates with the second swing arm 2341, to further drive the second sliding groove 2344*a* by using the eccentric protrusion part, so as to drive the shaft cover 232 to move downward.

Therefore, on the basis of disposing the first rotating shaft part 23*a* and the third rotating shaft part 23*b*, the second rotating shaft part 23*b* is further disposed, and the second rotating shaft part 23*b* is configured to provide an auxiliary support function for upward and downward movement of the shaft cover 232, so that all parts of the shaft cover 232 in a length direction of the shaft cover 232 can synchronously move upward and downward, thereby improving stability of upward and downward movement. In addition, a structure of the second rotating shaft part 23*b* is simple, so that structure complexity of the rotating shaft mechanism 23 can be reduced.

It can be learned that the second rotating shaft part 23*b* may have another structure form. For example, the structure form of the second rotating shaft part 23*b* is the same as the structure forms of the first rotating shaft part 23*a* and the third rotating shaft part 23*b*. This is not specifically limited in this application.

In the descriptions of this specification, specific features, structures, materials, or characteristics may be combined in any one or more embodiments or examples in a suitable manner.

Finally, it should be noted that the foregoing embodiments are only used to describe the technical solutions of this application, but are not used to limit this application. Although this application is described in detail with reference to the foregoing embodiments, it should be understood by a person of ordinary skill in the art that the technical solutions described in the foregoing embodiments may still be modified, or some technical features thereof are equivalently replaced. These modifications or replacements do not make the essence of the corresponding technical solutions depart from the spirit and scope of the technical solutions of the embodiments of this application.

What is claimed is:

1. A rotating shaft mechanism, applied to a foldable screen device, comprising:

a rotating shaft base, wherein the rotating shaft base is configured to support a part of a foldable screen;

a shaft cover, wherein the shaft cover is located on a side that is of the rotating shaft base and that is away from the foldable screen; and a first drive mechanism, comprising:

a second swing arm, capable of rotating relative to the rotating shaft base and having an unfolded location and a folded location;

an actuating member, wherein the actuating member is fastened relative to the second swing arm and comprises an eccentric protrusion part; and a lift slider, provided with a second sliding groove, wherein the eccentric protrusion part is disposed through the second sliding groove, and is capable of sliding along the second sliding groove, wherein:

when the second swing arm rotates from the unfolded location to the folded location, the actuating member rotates with the second swing arm, and actuates the second sliding groove by using the eccentric protrusion part to drive the lift slider to move, so that a distance between the shaft cover and the rotating shaft base becomes smaller; and when the second swing arm rotates from the folded location to the unfolded location, the actuating member rotates with the second swing arm, and actuates the second sliding groove by using the eccentric protrusion part to drive the lift slider to move, so that the distance between the shaft cover and the rotating shaft base becomes larger.

2. The rotating shaft mechanism according to claim 1, wherein the actuating member comprises a rotating shaft part, the rotating shaft part comprises a first segment, a flat location is disposed on a side surface of the first segment, and the second swing arm is sleeved on the rotating shaft part, to prevent, by using the flat location, the second swing arm from rotating relative to the actuating member.

3. The rotating shaft mechanism according to claim 2, wherein a flat hole is disposed on the second swing arm, and the second swing arm is sleeved on the rotating shaft part through fitting by using the flat hole, to prevent, by using the flat location, the second swing arm from rotating relative to the actuating member.

4. The rotating shaft mechanism according to claim 2, wherein the rotating shaft part is disposed through two shaft sleeves, and the second swing arm is connected to a part that is of the rotating shaft part and that is located between the two shaft sleeves.

5. The rotating shaft mechanism according to claim 1, wherein the eccentric protrusion part is an eccentric rod that is offset relative to a rotation center of the second swing arm.

6. The rotating shaft mechanism according to claim 1, further comprising a first swing arm, wherein the first swing arm has an unfolded location and a folded location, the first swing arm is capable of rotating relative to the rotating shaft base between the unfolded location and the folded location, the first swing arm is drivably connected to the second swing arm, and when rotating from the unfolded location to the folded location, the first swing arm drives the second swing arm to rotate relative to the rotating shaft base.

7. The rotating shaft mechanism according to claim 6, wherein the first drive mechanism comprises a first sliding groove and a first sliding member, one of the first sliding groove and the first sliding member is disposed on the first swing arm, the other of the first sliding groove and the first sliding member is disposed on the second swing arm, the first sliding member is slidably connected in the first sliding groove, and the first swing arm is drivably connected to the second swing arm by using a sliding pair formed by the first sliding groove and the first sliding member.

8. The rotating shaft mechanism according to claim 6, wherein a rotation axis of the first swing arm is not collinear with a rotation axis of the second swing arm.

9. The rotating shaft mechanism according to claim 1, wherein there are two first drive mechanisms that are located on two sides of the rotating shaft base, the rotating shaft mechanism further comprises a synchronization mechanism, and the synchronization mechanism is connected between second swing arms of the two first drive mechanisms, wherein the rotating shaft mechanism further comprises a damping mechanism, wherein the damping mechanism is disposed between the second swing arm and the rotating shaft base.

10. A foldable screen device, comprising a rotating shaft mechanism, the rotating shaft mechanism comprises:
- a rotating shaft base, wherein the rotating shaft base is configured to support a part of a foldable screen;
- a shaft cover, wherein the shaft cover is located on a side that is of the rotating shaft base and that is away from the foldable screen; and
- a first drive mechanism, comprising:
  - a second swing arm capable of rotating relative to the rotating shaft base and having an unfolded location and a folded location;
  - an actuating member, wherein the actuating member is fastened relative to the second swing arm and comprises an eccentric protrusion part; and
  - a lift slider provided with a second sliding groove, wherein the eccentric protrusion part is disposed through the second sliding groove and is capable of sliding along the second sliding groove, and wherein:
    - when the second swing arm rotates from the unfolded location to the folded location, the actuating member rotates with the second swing arm, and actuates the second sliding groove by using the eccentric protrusion part to drive the lift slider to move, so that a distance between the shaft cover and the rotating shaft base becomes smaller; and
    - when the second swing arm rotates from the folded location to the unfolded location, the actuating member rotates with the second swing arm, and actuates the second sliding groove by using the eccentric protrusion part to drive the lift slider to move, so that the distance between the shaft cover and the rotating shaft base becomes larger.

11. The foldable screen device according to claim 10, wherein the actuating member comprises a rotating shaft part, the rotating shaft part comprises a first segment, a flat location is disposed on a side surface of the first segment, and the second swing arm is sleeved on the rotating shaft part, to prevent, by using the flat location, the second swing arm from rotating relative to the actuating member.

12. The foldable screen device according to claim 11, wherein a flat hole is disposed on the second swing arm, and the second swing arm is sleeved on the rotating shaft part through fitting by using the flat hole, to prevent, by using the flat location, the second swing arm from rotating relative to the actuating member.

13. The foldable screen device according to claim 11, wherein the rotating shaft part is disposed through two shaft sleeves, and the second swing arm is connected to a part that is of the rotating shaft part and that is located between the two shaft sleeves.

14. The foldable screen device according to claim 10, wherein the eccentric protrusion part is an eccentric rod that is offset relative to a rotation center of the second swing arm.

15. The foldable screen device according to claim 10, further comprising a first swing arm, wherein the first swing arm has an unfolded location and a folded location, the first swing arm is capable of rotating relative to the rotating shaft base between the unfolded location and the folded location, the first swing arm is drivably connected to the second swing arm, and when rotating from the unfolded location to the folded location, the first swing arm drives the second swing arm to rotate relative to the rotating shaft base.

16. The foldable screen device according to claim 15, wherein the first drive mechanism comprises a first sliding groove and a first sliding member, one of the first sliding groove and the first sliding member is disposed on the first swing arm, the other of the first sliding groove and the first sliding member is disposed on the second swing arm, the first sliding member is slidably connected in the first sliding groove, and the first swing arm is drivably connected to the second swing arm by using a sliding pair formed by the first sliding groove and the first sliding member.

17. The foldable screen device according to claim 15, wherein a rotation axis of the first swing arm is not collinear with a rotation axis of the second swing arm.

18. The foldable screen device according to claim 15, wherein the rotating shaft mechanism comprises two first swing arms, and the two first swing arms are disposed on two opposite sides of the rotating shaft base.

19. The foldable screen device according to claim 10, wherein there are two first drive mechanisms that are located on two sides of the rotating shaft base, the rotating shaft mechanism further comprises a synchronization mechanism, and the synchronization mechanism is connected between second swing arms of the two first drive mechanisms, wherein the rotating shaft mechanism further comprises a damping mechanism, wherein the damping mechanism is disposed between the second swing arm and the rotating shaft base.

20. The foldable screen device according to claim 11, wherein the foldable screen comprises a first display area, a second display area, and a third display area, the third display area is connected between the first display area and the second display area, and the third display area is disposed on the rotating shaft mechanism.

* * * * *